United States Patent
Hatakeyama et al.

(10) Patent No.: US 8,492,078 B2
(45) Date of Patent: Jul. 23, 2013

(54) PATTERNING PROCESS

(75) Inventors: Jun Hatakeyama, Joetsu (JP); Takeshi Nagata, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 99 days.

(21) Appl. No.: 13/010,318

(22) Filed: Jan. 20, 2011

(65) Prior Publication Data

US 2011/0177462 A1 Jul. 21, 2011

(30) Foreign Application Priority Data

Jan. 20, 2010 (JP) ................................. 2010-009869
Oct. 7, 2010 (JP) ................................. 2010-227196

(51) Int. Cl.
*G03F 7/26* (2006.01)

(52) U.S. Cl.
USPC ........................................ 430/322; 430/270.1

(58) Field of Classification Search
USPC ...................................... 430/322, 331, 330, 5
See application file for complete search history.

(56) References Cited

U.S. PATENT DOCUMENTS

| | | |
|---|---|---|
| 6,448,420 B1 | 9/2002 | Kinsho et al. |
| 7,514,204 B2 | 4/2009 | Hatakeyama et al. |
| 7,537,880 B2 | 5/2009 | Harada et al. |
| 7,598,016 B2 | 10/2009 | Kobayashi et al. |
| 7,622,242 B2 | 11/2009 | Hatakeyama et al. |
| 7,642,034 B2 | 1/2010 | Hatakeyama et al. |
| 7,670,750 B2 | 3/2010 | Harada et al. |
| 7,759,047 B2 | 7/2010 | Hatakeyama et al. |
| 7,771,913 B2 | 8/2010 | Kaneko et al. |
| 2007/0003867 A1 | 1/2007 | Hatakeyama et al. |
| 2008/0090172 A1 | 4/2008 | Hatakeyama et al. |
| 2008/0153030 A1 | 6/2008 | Kobayashi et al. |

(Continued)

FOREIGN PATENT DOCUMENTS

| | | |
|---|---|---|
| JP | 2000-327633 A | 11/2000 |
| JP | 3790649 B2 | 6/2006 |

(Continued)

OTHER PUBLICATIONS

Nakamura, Hiroko et al "Contact Hole Formation by Multiple Exposure Technique in Ultra-low k1 Lithography," Proceedings of SPIE, 2004, vol. 5377, pp. 255-263.

(Continued)

*Primary Examiner* — Kathleen Duda
*Assistant Examiner* — Caleen Sullivan
(74) *Attorney, Agent, or Firm* — Westerman, Hattori, Daniels & Adrian, LLP

(57) ABSTRACT

A pattern is formed by coating a resist composition comprising a polymer comprising recurring units having an optionally acid labile group-substituted naphthol group, an acid generator, and an organic solvent onto a substrate, baking to form a resist film, exposing the resist film to high-energy radiation, baking, and developing the exposed film with an organic solvent developer to form a negative pattern wherein the unexposed region of film is dissolved and the exposed region of film is not dissolved. In the process of image formation via positive/negative reversal by organic solvent development, the resist film has a high dissolution contrast and controlled acid diffusion. By subjecting the resist film to exposure through a mask having a lattice-like pattern and organic solvent development, a fine hole pattern can be formed at a high precision of dimensional control.

20 Claims, 15 Drawing Sheets

U.S. PATENT DOCUMENTS

| | | |
|---|---|---|
| 2008/0318171 A1 | 12/2008 | Tsubaki |
| 2009/0011365 A1 | 1/2009 | Kobayashi et al. |
| 2009/0042147 A1 | 2/2009 | Tsubaki |
| 2009/0280434 A1 | 11/2009 | Harada et al. |
| 2010/0040972 A1 | 2/2010 | Tarutani et al. |
| 2010/0203457 A1* | 8/2010 | Hatakeyama ................. 430/326 |
| 2010/0330507 A1 | 12/2010 | Tsubaki et al. |
| 2011/0236826 A1* | 9/2011 | Hatakeyama et al. ..... 430/270.1 |

FOREIGN PATENT DOCUMENTS

| | | |
|---|---|---|
| JP | 2007-025634 A | 2/2007 |
| JP | 2007-297590 A | 11/2007 |
| JP | 2007-316448 A | 12/2007 |
| JP | 2008-003569 A | 1/2008 |
| JP | 2008-081716 A | 4/2008 |
| JP | 2008-107443 A | 5/2008 |
| JP | 2008-111089 A | 5/2008 |
| JP | 2008-111103 A | 5/2008 |
| JP | 2008-122932 A | 5/2008 |
| JP | 2008-158339 A | 7/2008 |
| JP | 2008-239918 A | 10/2008 |
| JP | 2008-281974 A | 11/2008 |
| JP | 2008-281975 A | 11/2008 |
| JP | 2008-281980 A | 11/2008 |
| JP | 2008-309878 A | 12/2008 |
| JP | 2008-309879 A | 12/2008 |
| JP | 2009-025707 A | 2/2009 |
| JP | 2009-025723 A | 2/2009 |
| JP | 2009-031767 A | 2/2009 |
| JP | 2009-053657 A | 3/2009 |
| JP | 2009-098638 A | 5/2009 |
| JP | 2009-276363 A | 11/2009 |

OTHER PUBLICATIONS

Nakao, Shuji et al "0.12μm Hole Pattern Formation by KrF Lithography for Giga Bit DRAM," IEEE IEDM Tech Digest, 1996, vol. 61.

Truffert, V. et al "Ultimate contact hole resolution using immersion lithography with line/space imaging," Proc. of SPIE, 2009, vol. 7274, p. 72740N.

Owe-Yang, D.C. et al "Double exposure for the contact layer of the 65-nm node," Proc. of SPIE, 2005, vol. 5753, pp. 171-180.

* cited by examiner

PATTERNING PROCESS

CROSS-REFERENCE TO RELATED APPLICATION

This non-provisional application claims priority under 35 U.S.C. §119(a) on Patent Application Nos. 2010-009869 and 2010-227196 filed in Japan on Jan. 20, 2010 and Oct. 7, 2010, respectively, the entire contents of which are hereby incorporated by reference.

TECHNICAL FIELD

This invention relates to a pattern forming process involving exposure of resist film, deprotection reaction with the aid of acid and heat, and development with an organic solvent to form a negative tone pattern in which the unexposed region is dissolved and the exposed region is not dissolved.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LWR) of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Proc. SPIE, Vol. 5377, p. 255 (2004) that a pattern of X-direction lines is formed in a positive resist film using dipole illumination, the resist pattern is cured, another resist material is coated thereon, and a pattern of Y-direction lines is formed in the other resist film using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in IEEE IEDM Tech. Digest 61 (1996) to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art. However, two exposures must be performed while exchanging the mask. Problems arise including reduced throughputs and misregistration between two exposures.

Proc. SPIE Vol. 7274, p. 72740N (2009) reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The formation of negative pattern through organic solvent development is a traditional technique. A resist composition comprising cyclized rubber is developed using an alkene such as xylene as the developer. An early chemically amplified resist composition comprising poly(t-butoxycarbonyloxystyrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. Pattern forming processes are described in JP-A 2008-281974, 2008-281975, 2008-281980, 2009-53657, 2009-25707, and 2009-25723.

These patent documents disclose resist compositions for organic solvent development comprising a copolymer of hydroxyadamantane methacrylate, a copolymer of norbornane lactone methacrylate, a copolymer of methacrylate having acidic groups including carboxyl, sulfo, phenol, thiol and other groups substituted by two or more acid labile groups, and a copolymer of methacrylate having a cyclic acid-stable group ester, and pattern forming processes using the same.

Further, JP-A 2008-309878 discloses a process for forming a pattern through organic solvent development in which a protective film is applied onto a resist film. JP-A 2008-309879 discloses a topcoatless process for forming a pattern through organic solvent development in which an additive is added to a resist composition so that the additive may segregate at the resist film surface after spin coating to provide the surface with improved water repellency.

CITATION LIST

Patent Document 1: JP-A 2008-281974
Patent Document 2: JP-A 2008-281975
Patent Document 3: JP-A 2008-281980
Patent Document 4: JP-A 2009-053657
Patent Document 5: JP-A 2009-025707
Patent Document 6: JP-A 2009-025723
Patent Document 7: JP-A 2008-309878
Patent Document 8: JP-A 2008-309879

Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 10 times. While Patent Documents 1 to 6 describe conventional photoresist compositions of the alkaline aqueous solution development type, there is a demand for a novel material which can offer a significant dissolution contrast upon organic solvent development.

When holes are formed by negative development, regions surrounding the holes receive light so that excess acid is generated therein. It is then important to control acid diffusion because the holes are not opened if the acid diffuses inside the holes.

If the acid in the exposed region evaporates during PEB and deposits on the unexposed region, the positive pattern following alkaline development suffers from such drawbacks as rounded top of its profile and film slimming. An inverse phenomenon occurs on negative development with organic solvent, that is, holes are not opened or the opening size of holes at the top is reduced.

Coverage of a photoresist film with a protective film is effective for preventing evaporation of acid during PEB and for avoiding any hole opening failure following negative development, but still insufficient. The problem of hole opening failure following negative development is serious if a photoresist film is not covered with a protective film.

An object of the invention is to provide a photoresist composition which establishes a high dissolution contrast during organic solvent development, and a pattern forming process for forming a hole pattern via positive/negative reversal using a mask having a lattice-like pattern for forming a hole pattern through a single set of exposure and development.

The inventors have found that by designing a polymer as comprising recurring units having an acid labile group-substituted or unsubstituted naphthol group and recurring units capable of generating a carboxyl group through acid-catalyzed deprotection reaction, the dissolution contrast during organic solvent development is improved, and that by controlling acid diffusion at the same time, a hole pattern resulting from positive/negative reversal is improved in sensitivity, resolution, focus margin, and dimensional uniformity.

One embodiment of the invention is a pattern forming process comprising the steps of applying a resist composition comprising a polymer comprising recurring units having an acid labile group-substituted or unsubstituted naphthol group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved.

Another embodiment of the invention is a pattern forming process comprising the steps of applying a resist composition comprising a polymer comprising recurring units having an acid labile group-substituted or unsubstituted naphthol group and recurring units having an acid labile group-substituted carboxyl group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved.

In a preferred embodiment, the polymer comprises recurring units (a-1) and (a-2) and recurring units (b) represented by the general formula (1).

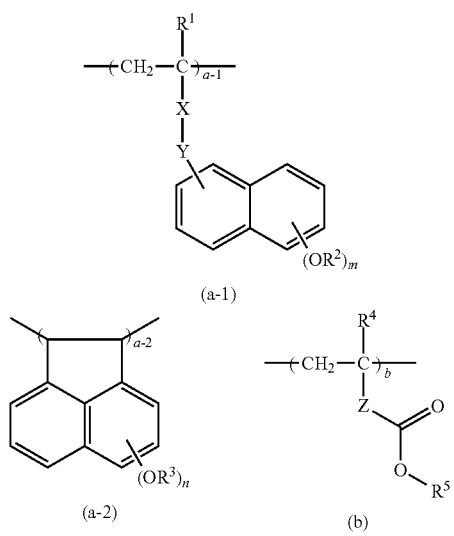

Herein $R^1$ and $R^4$ are each independently hydrogen or methyl, X is a single bond, ether group, —C(=O)—O—, or —C(=O)—NH—, Y is a single bond, or a straight or branched $C_1$-$C_6$ alkylene group or $C_6$-$C_{10}$ arylene group, which may contain an ester or ether radical, m and n each are 1 or 2, $R^2$ and $R^3$ are hydrogen or an acid labile group, $R^5$ is an acid labile group, Z is a single bond or —C(=O)—O—$R^6$—, $R^6$ is a straight, branched or cyclic $C_1$-$C_{10}$ alkylene group which may contain an ether, ester, lactone or hydroxyl radical, or a naphthylene group, the subscripts a-1, a-2, and b are numbers in the range: $0 \leq a\text{-}1 < 1.0$, $0 \leq a\text{-}2 < 1.0$, $0 \leq b < 1.0$, $0 < (a\text{-}1)+(a\text{-}2) < 1.0$, and $0 < (a\text{-}1)+(a\text{-}2)+b \leq 1.0$.

In a preferred embodiment, the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the step of exposing the resist film to high-energy radiation includes ArF immersion lithography of 193 nm wavelength, EUV lithography of 13.5 nm wavelength, or EB lithography. Typically, the ArF immersion lithography of 193 nm wavelength uses a halftone phase shift mask having a dot shifter pattern, whereby a pattern of holes is formed at the dots after development.

Also typically, the ArF immersion lithography of 193 nm wavelength uses a halftone phase shift mask having a lattice-like shifter pattern, whereby a pattern of holes is formed at the intersections between gratings of the lattice-like shifter pattern after development. The phase shift mask used may be a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. The phase shift mask used may also be a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Typically, the halftone phase shift mask having a dot pattern or lattice-like pattern has a transmittance of 3 to 15%.

In a preferred embodiment, the pattern forming process comprises the steps of applying a resist composition comprising a polymer comprising recurring units having an acid labile group-substituted or unsubstituted naphthol group, an acid generator, and an organic solvent onto a substrate, heat treating the composition to form a resist film, forming a protective film on the resist film, exposing the resist film to high-energy radiation to define exposed and unexposed regions, heat treating, and applying a developer to the coated substrate to form a negative pattern wherein the unexposed region of resist film and the protective film are dissolved and the exposed region of resist film is not dissolved.

The protective film is preferably formed of a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

ADVANTAGEOUS EFFECTS OF INVENTION

In the process of image formation via positive/negative reversal by organic solvent development, a photoresist film comprising a polymer comprising recurring units having an acid labile group-substituted or unsubstituted naphthol group and an acid generator is characterized by a high dissolution contrast between the unexposed region of promoted dissolution and the exposed region of inhibited dissolution, and controlled acid diffusion. By subjecting this photoresist film to exposure through a mask having a lattice-like pattern and organic solvent development, a fine hole pattern can be formed at a high precision of dimensional control. Coverage of the photoresist film with a protective film containing an amino group or amine salt prevents any hole opening failure and improves dimensional uniformity.

BRIEF DESCRIPTION OF DRAWINGS

FIG. 1 schematically illustrates in cross-sectional views the pattern forming process of the invention.

DESCRIPTION OF EMBODIMENTS

Figure 1A:
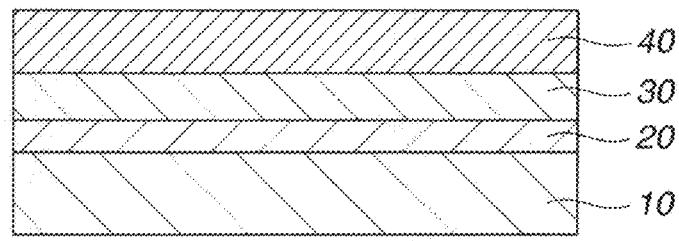
FIG. 1A shows a photoresist film formed on a substrate.

The terms "a" and "an" herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
SOG: spin on glass
TMAH: tetramethylammonium hydroxide
PGMEA: propylene glycol monomethyl ether acetate The abbreviation "phr" refers to parts by weight per 100 parts by weight of resin or polymer.

The invention is directed to a process for forming a pattern via positive/negative reversal. Specifically the process includes the steps of applying a photoresist composition based on a polymer comprising recurring units having an acid labile group-substituted or unsubstituted naphthol group and optionally recurring units capable of generating a carboxyl group through acid-catalyzed deprotection reaction, an acid generator, and an organic solvent onto a substrate, prebaking the composition to remove the unnecessary solvent and form a resist film, exposing the resist film to high-energy radiation through a lattice-like mask pattern, post-exposure baking, and developing the exposed film with an organic solvent developer to form a negative pattern.

The recurring units having an optionally acid labile group-substituted naphthol group are typically recurring units (a-1) and (a-2), and the recurring units capable of generating a carboxyl group through acid-catalyzed deprotection reaction are typically recurring units (b), all represented by the general formula (1).

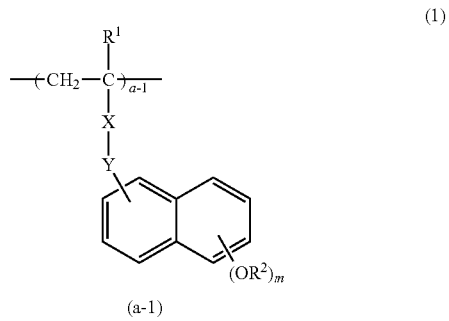

(a-1)

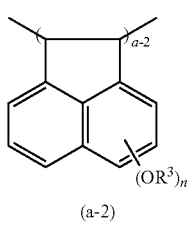 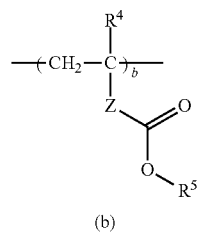 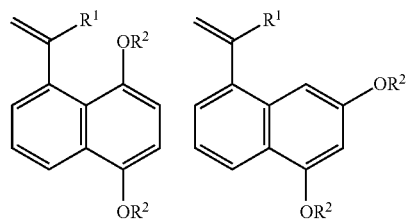

(a-2)      (b)

Herein $R^1$ and $R^4$ are each independently hydrogen or methyl, X is a single bond, ether group, —C(=O)—O—, or —C(=O)—NH—, Y is a single bond, or a straight or branched $C_1$-$C_6$ alkylene group or $C_6$-$C_{10}$ arylene group, which may contain an ester or ether radical, m and n each are 1 or 2, $R^2$ and $R^3$ are hydrogen or an acid labile group, $R^5$ is an acid labile group, Z is a single bond or —C(=O)—O—$R^6$—, $R^6$ is a straight, branched or cyclic $C_1$-$C_{10}$ alkylene group which may contain an ether, ester, lactone or hydroxyl radical, or a naphthylene group, the subscripts a-1, a-2, and b are numbers in the range: $0 \leq a\text{-}1 < 1.0$, $0 \leq a\text{-}2 < 1.0$, $0 \leq b < 1.0$, $0 < (a\text{-}1)+(a\text{-}2) < 1.0$, and $0 < (a\text{-}1)+(a\text{-}2)+b \leq 1.0$.

Examples of suitable monomers from which recurring units (a-1) and (a-2) are derived are given below wherein $R^1$, $R^2$, and $R^3$ are as defined above.

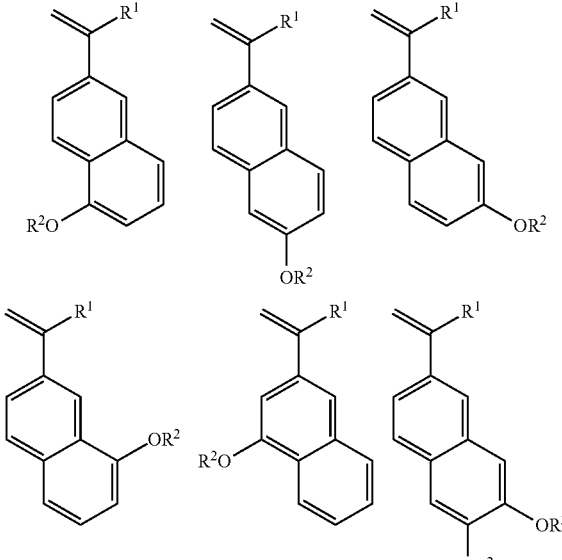

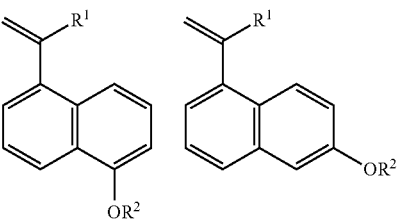

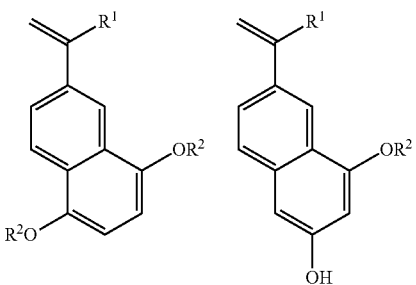

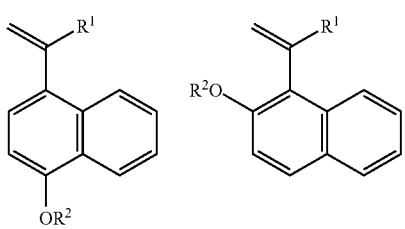

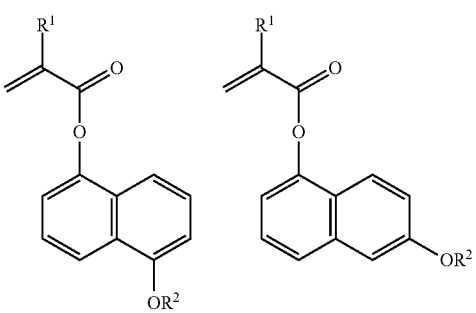

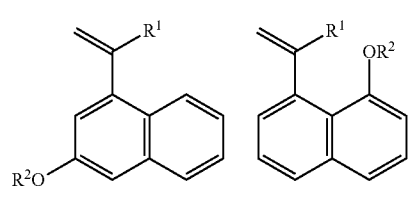

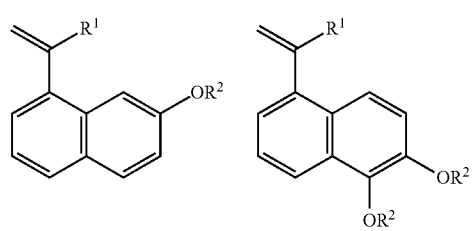

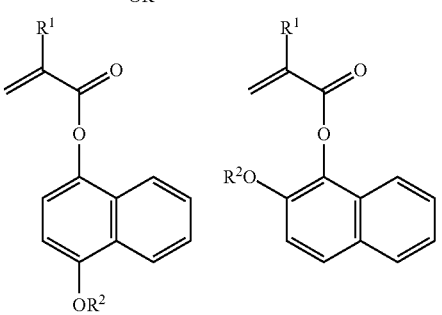

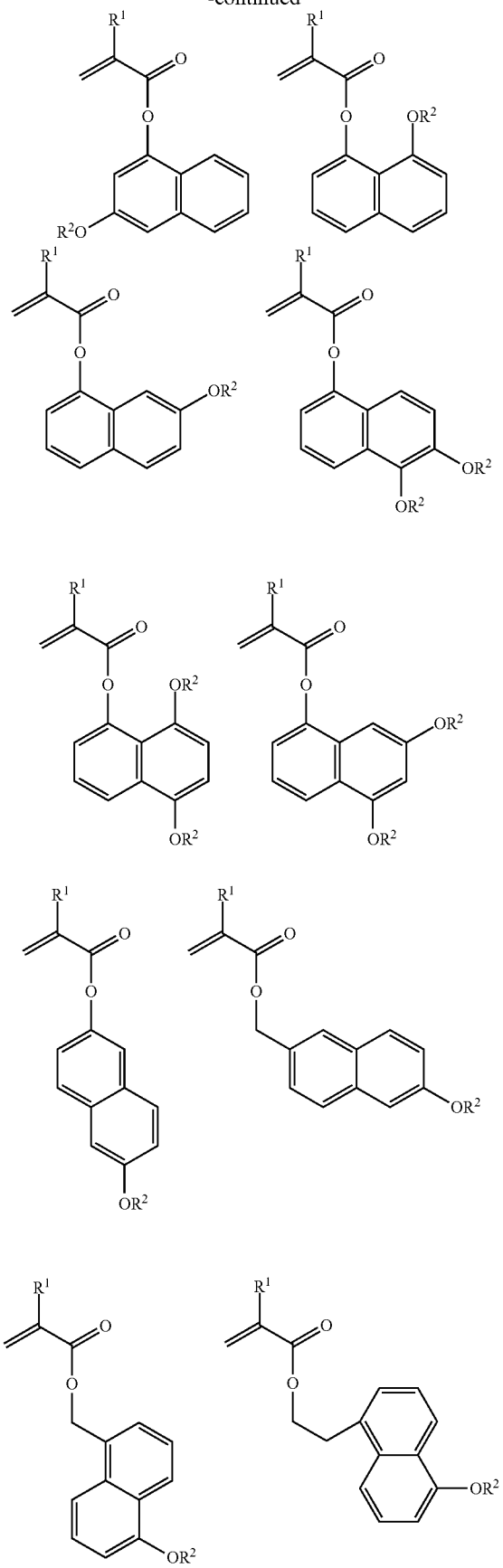
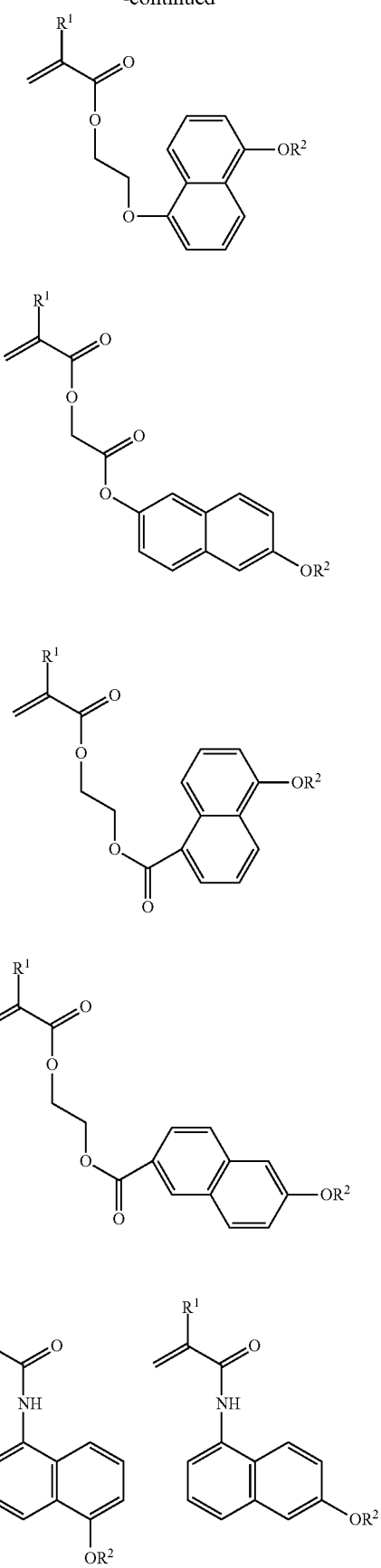

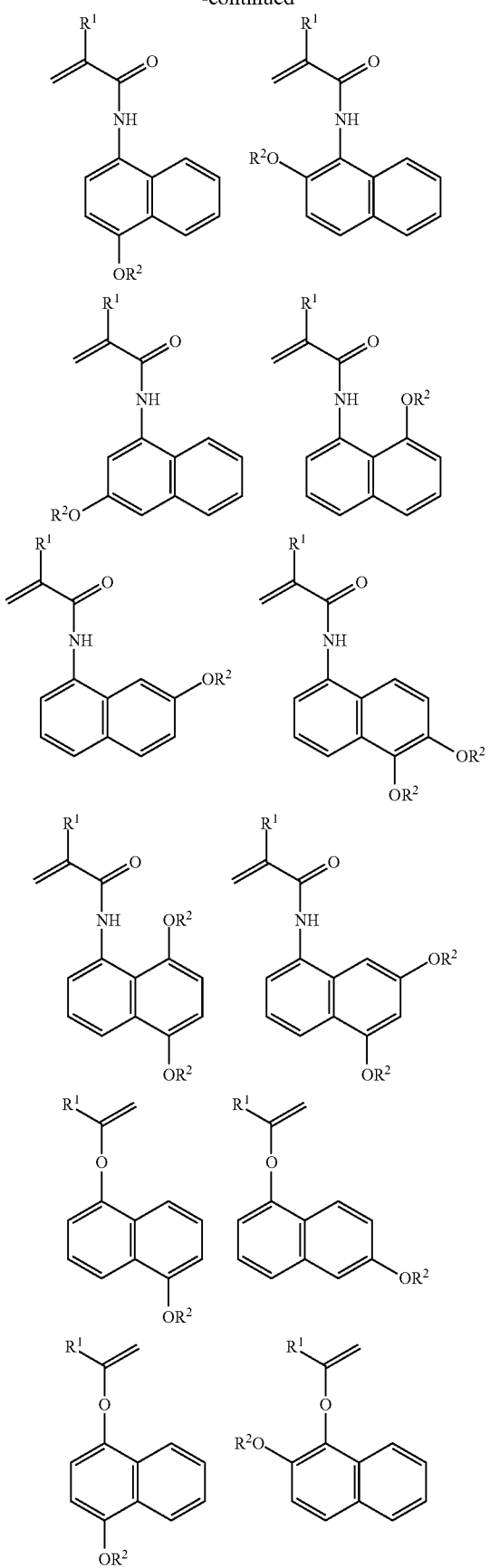
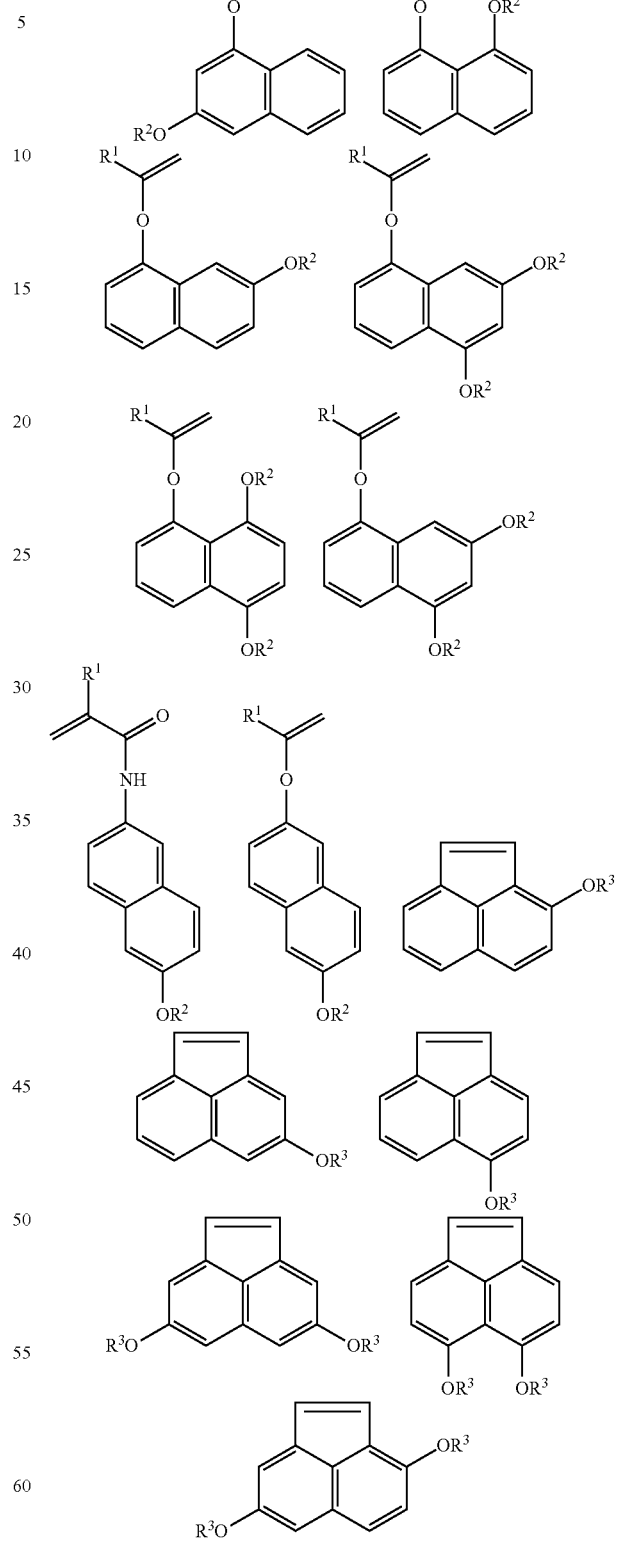
As the base resin used in the resist composition suited for organic solvent development for achieving positive/negative reversal in the patterning process, a polymer or high molecular weight compound comprising recurring units (a-1) and (a-2) having an optionally acid labile group-substituted naphthol group and recurring units (b) having an acid labile group-substituted carboxyl group as represented in formula (1) is preferably used.

It is acceptable that the naphthol group be substituted with a $C_1$-$C_6$ acyl group or acid labile group prior to polymerization and deprotected after polymerization. Suitable acyl groups include formyl, acetyl and pivaloyl. Deprotection after polymerization may be effected by alkaline hydrolysis. In the event that a polymer as polymerized in acid labile group-substituted form is used as such, a monomer having acid labile group-substituted naphthol is used and polymerized. Any acid labile group selected from those groups described later may be used, and after polymerization, it may be deprotected with an acid. At this point, in order to prevent deprotection of the acid labile group $R^5$ in recurring units (b), deprotection is performed using a weak acid such as acetic acid or oxalic acid as the catalyst. The acid labile group for protecting a naphthol monomer which is subject to deprotection after polymerization is preferably an acetal or similar group which can be deprotected with a weak acid.

Suitable monomers Mb from which recurring units (b) are derived have the following formula.

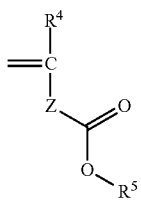

Mb

Herein $R^4$, $R^5$, and Z are as defined above.

Examples of the monomers Mb having different Z structures are given below wherein $R^4$ and $R^5$ are as defined above.

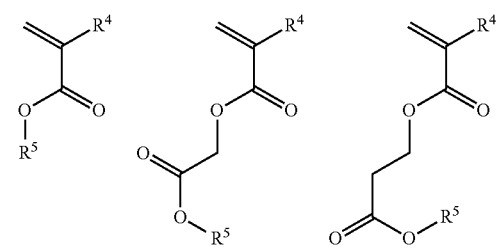

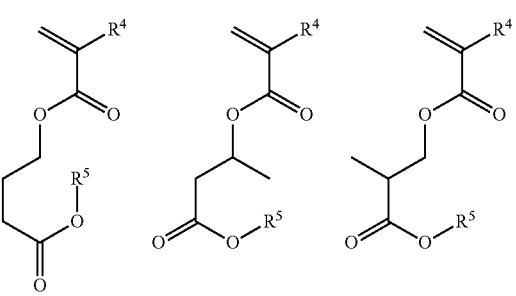

-continued

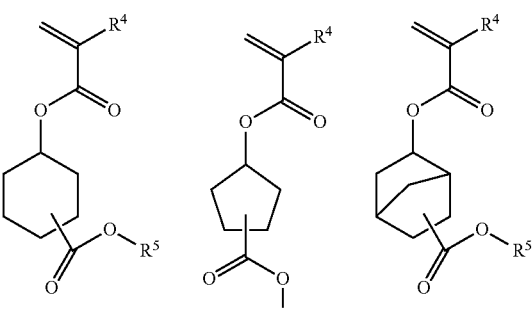

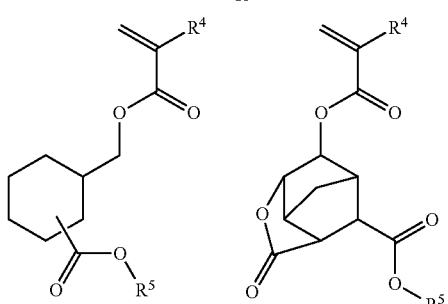

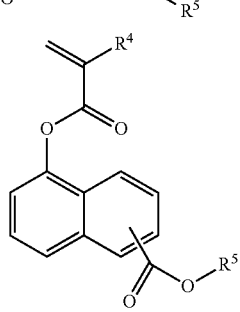

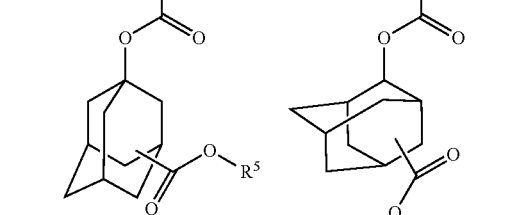

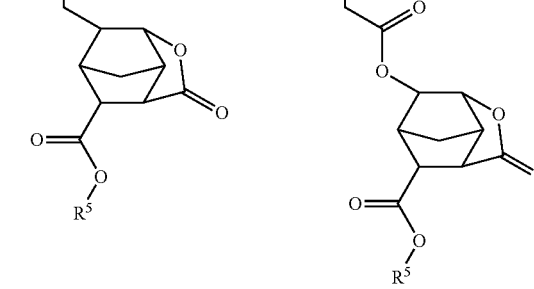

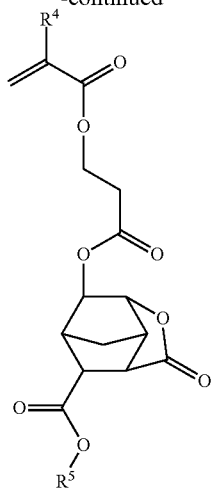

The acid labile groups represented by R², R³ and R⁵ in formula (1) may be the same or different and selected from a variety of such groups, specifically groups of the following formulae (AL-10) and (AL-11), tertiary alkyl groups of the following formula (AL-12), and oxoalkyl groups of 4 to 20 carbon atoms, but not limited thereto.

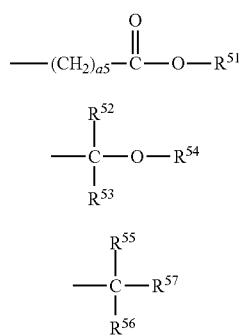

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

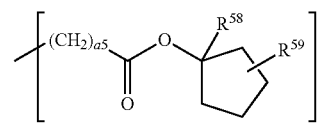
(AL-10)-1

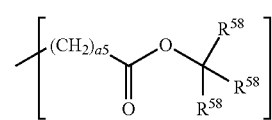
(AL-10)-2

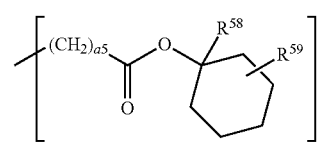
(AL-10)-3

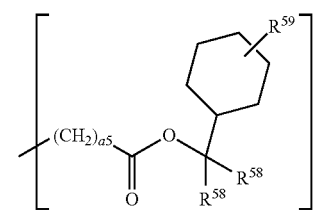
(AL-10)-4

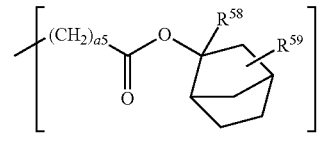
(AL-10)-5

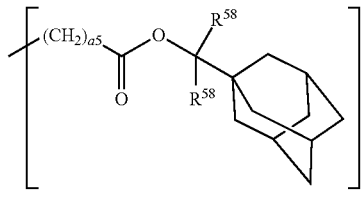
(AL-10)-6

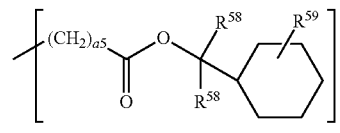
(AL-10)-7

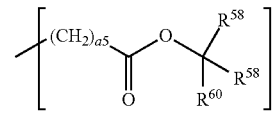
(AL-10)-8

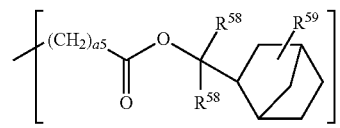
(AL-10)-9

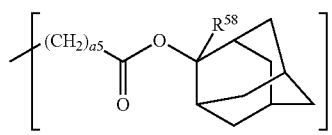
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-34.

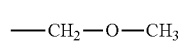
(AL-11)-1

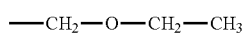
(AL-11)-2

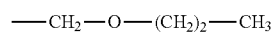
(AL-11)-3

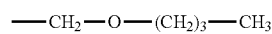
(AL-11)-4

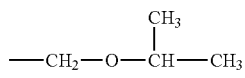
(AL-11)-5

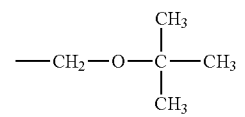
(AL-11)-6

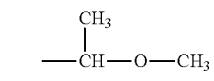
(AL-11)-7

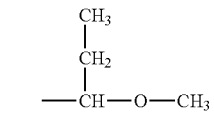
(AL-11)-8

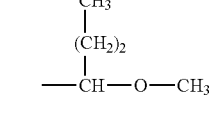
(AL-11)-9

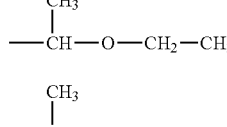
(AL-11)-10

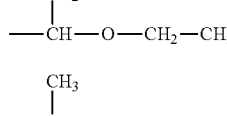
(AL-11)-11

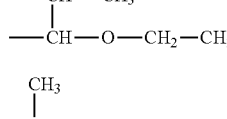
(AL-11)-12

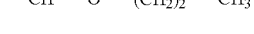
(AL-11)-13

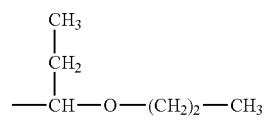
(AL-11)-14

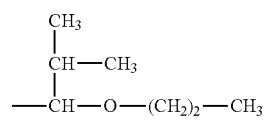
(AL-11)-15

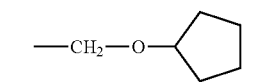
(AL-11)-16

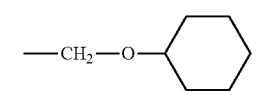
(AL-11)-17

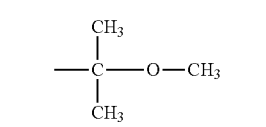
(AL-11)-18

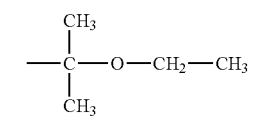
(AL-11)-19

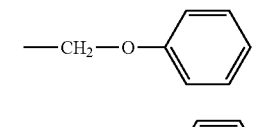
(AL-11)-20

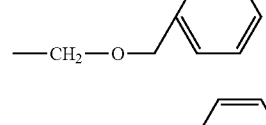
(AL-11)-21

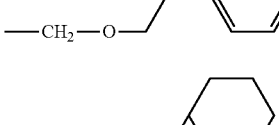
(AL-11)-22

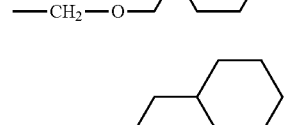
(AL-11)-23

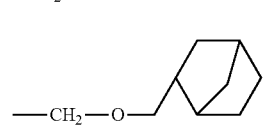
(AL-11)-24

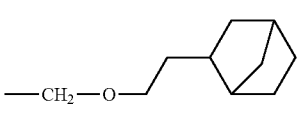
(AL-11)-25

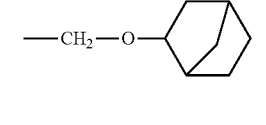
(AL-11)-26

(AL-11)-27

(AL-11)-28
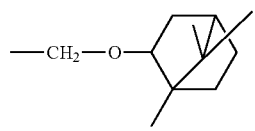

(AL-11)-29
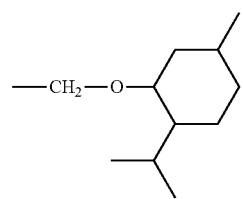

(AL-11)-30
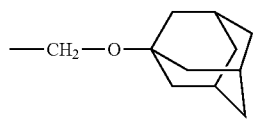

(AL-11)-31
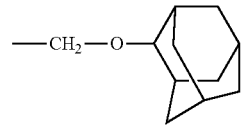

(AL-11)-32
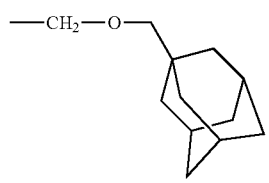

(AL-11)-33
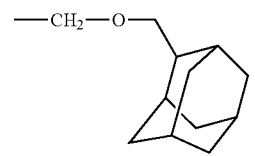

(AL-11)-34
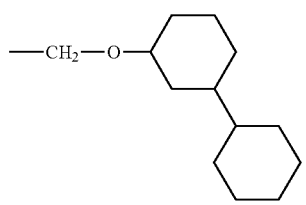

Other examples of acid labile groups include those of the following formula (AL-11a) or (AL-11b) while the polymer may be crosslinked within the molecule or between molecules with these acid labile groups.

(AL-11a)

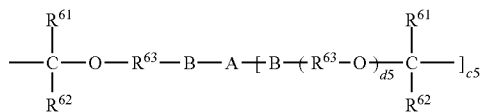

(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

(AL-11)-35

(AL-11)-36
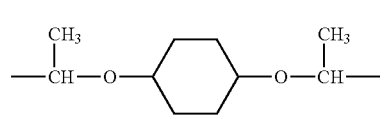

(AL-11)-37
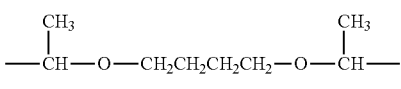

(AL-11)-38

(AL-11)-39
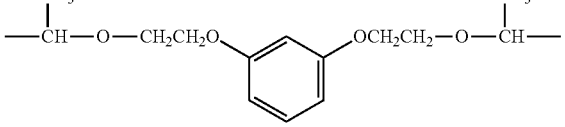

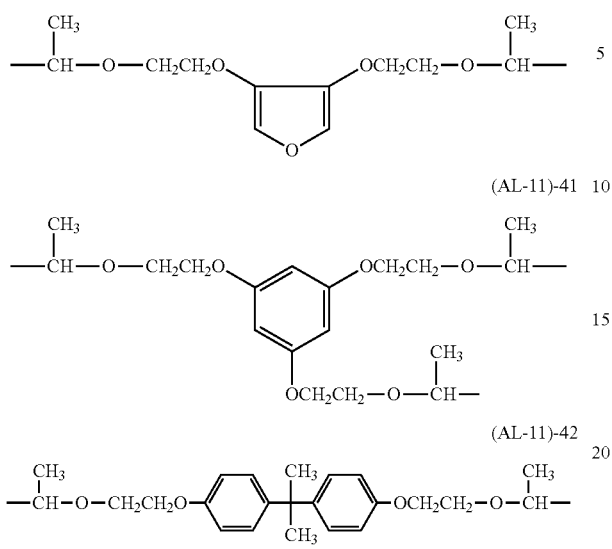
(AL-11)-40
(AL-11)-41
(AL-11)-42
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
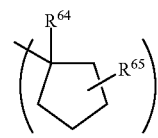
(AL-12)-1
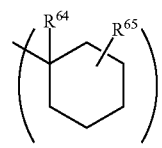
(AL-12)-2
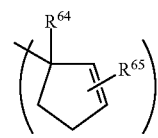
(AL-12)-3
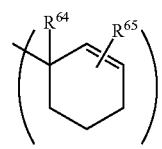
(AL-12)-4
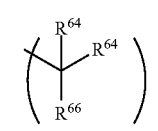
(AL-12)-5
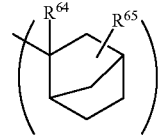
(AL-12)-6
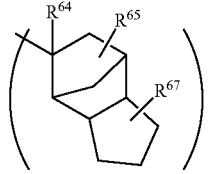
(AL-12)-7
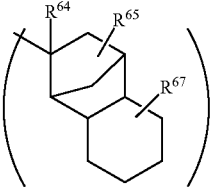
(AL-12)-8
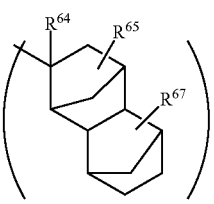
(AL-12)-9
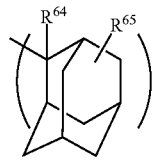
(AL-12)-10
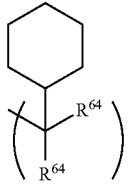
(AL-12)-11
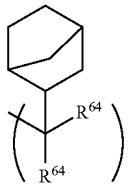
(AL-12)-12
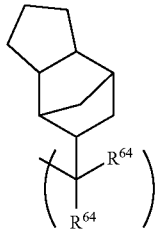
(AL-12)-13

(AL-12)-14

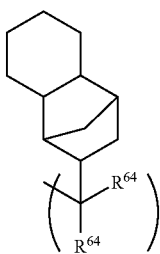

(AL-12)-15

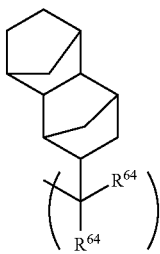

(AL-12)-16

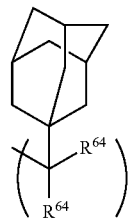

Herein $R^{64}$ is each independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formulae (AL-12)-17 and (AL-12)-18, the polymer may be crosslinked within the molecule or between molecules. In formulae (AL-12)-17 and (AL-12)-18, $R^{64}$ is as defined above, $R^{68}$ is a straight, branched or cyclic $C_1$-$C_{20}$ alkylene group or arylene group, which may contain a heteroatom such as oxygen, sulfur or nitrogen, and b6 is an integer of 1 to 3.

(AL-12)-17

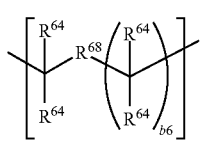

(AL-12)-18

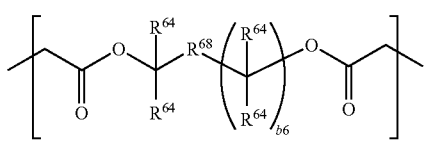

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1
—(CH$_2$)$_4$OH (AL-13)-2
—(CH$_2$)$_2$O(CH$_2$)$_3$CH$_3$ (AL-13)-3
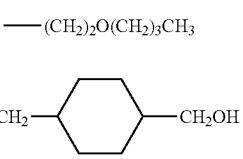

(AL-13)-4
—(CH$_2$)$_2$O(CH$_2$)$_2$OH (AL-13)-5
—(CH$_2$)$_6$OH (AL-13)-6
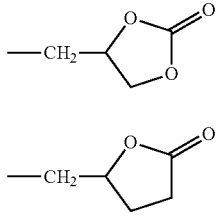

(AL-13)-7
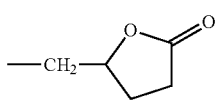

Of the acid labile groups of formula (AL-12), groups having an exo-form structure represented by the formula (AL-12)-19 are preferred.

(AL-12)-19

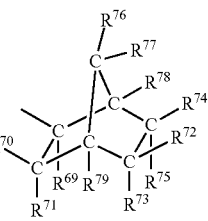

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, specifically aliphatic ring, with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633), with such recurring units being illustrated below.

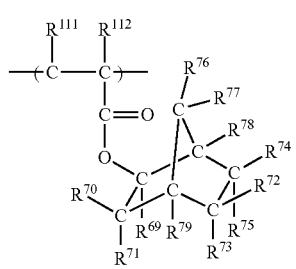
It is noted that $R^{111}$ and $R^{112}$ are each independently hydrogen, methyl, —COOCH$_3$, —CH$_2$COOCH$_3$ or the like. Illustrative non-limiting examples of suitable monomers are given below.
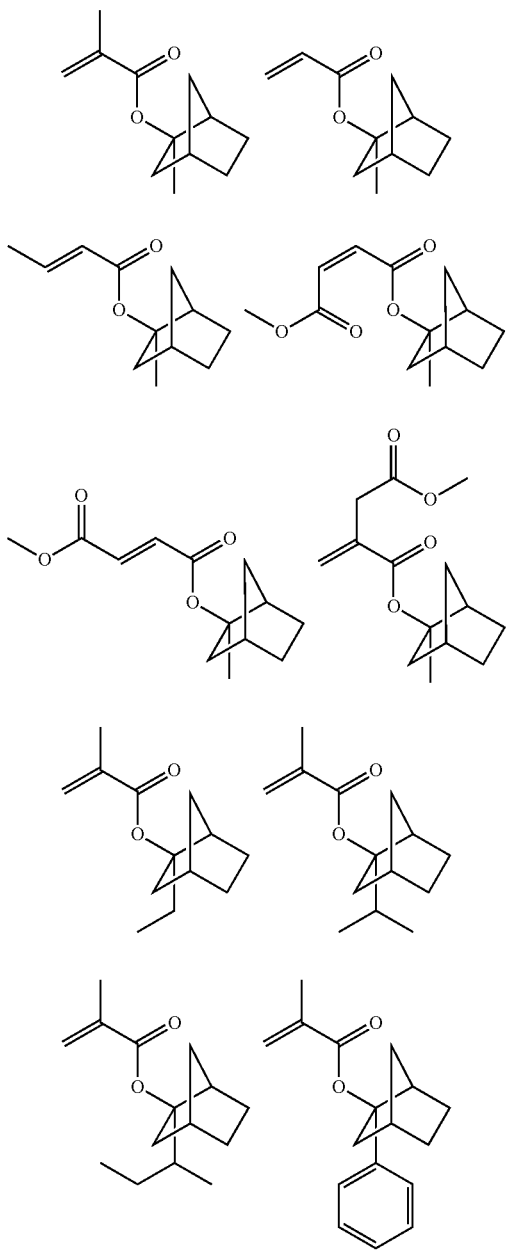
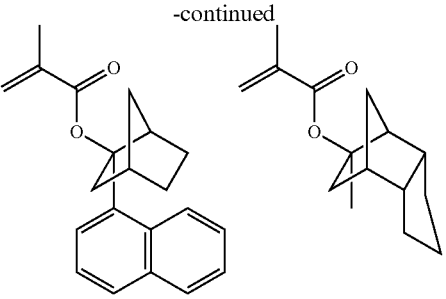
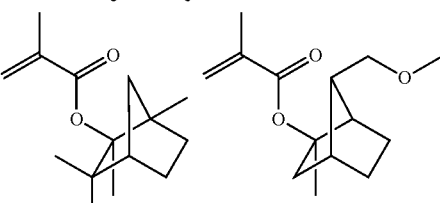
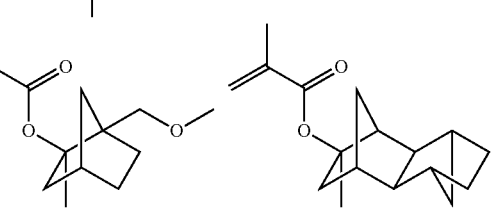
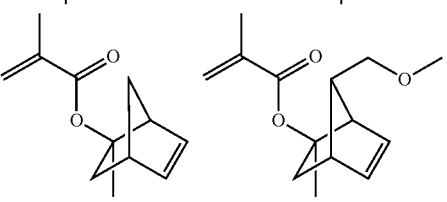
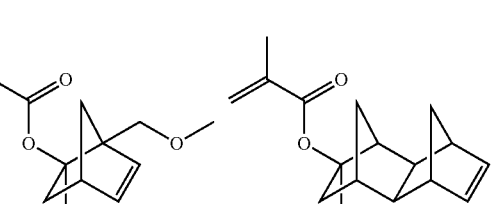
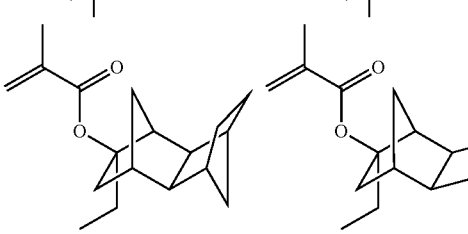
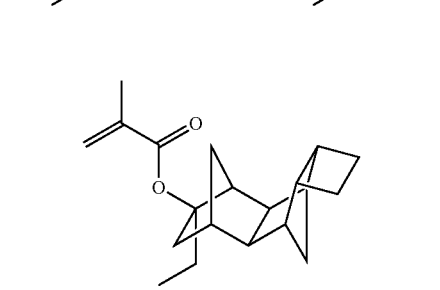
Also included in the acid labile groups of formula (AL-12) are acid labile groups having furandiyl, tetrahydrofurandiyl or oxanorbornanediyl as represented by the following formula (AL-12)-20.

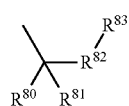
(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$ may bond together to form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

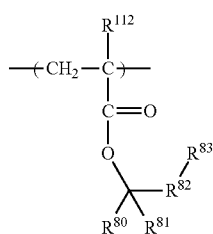

(wherein $R^{80}$ to $R^{83}$, and $R^{112}$ are as defined above) are derived are shown below. Note that Me is methyl and Ac is acetyl.

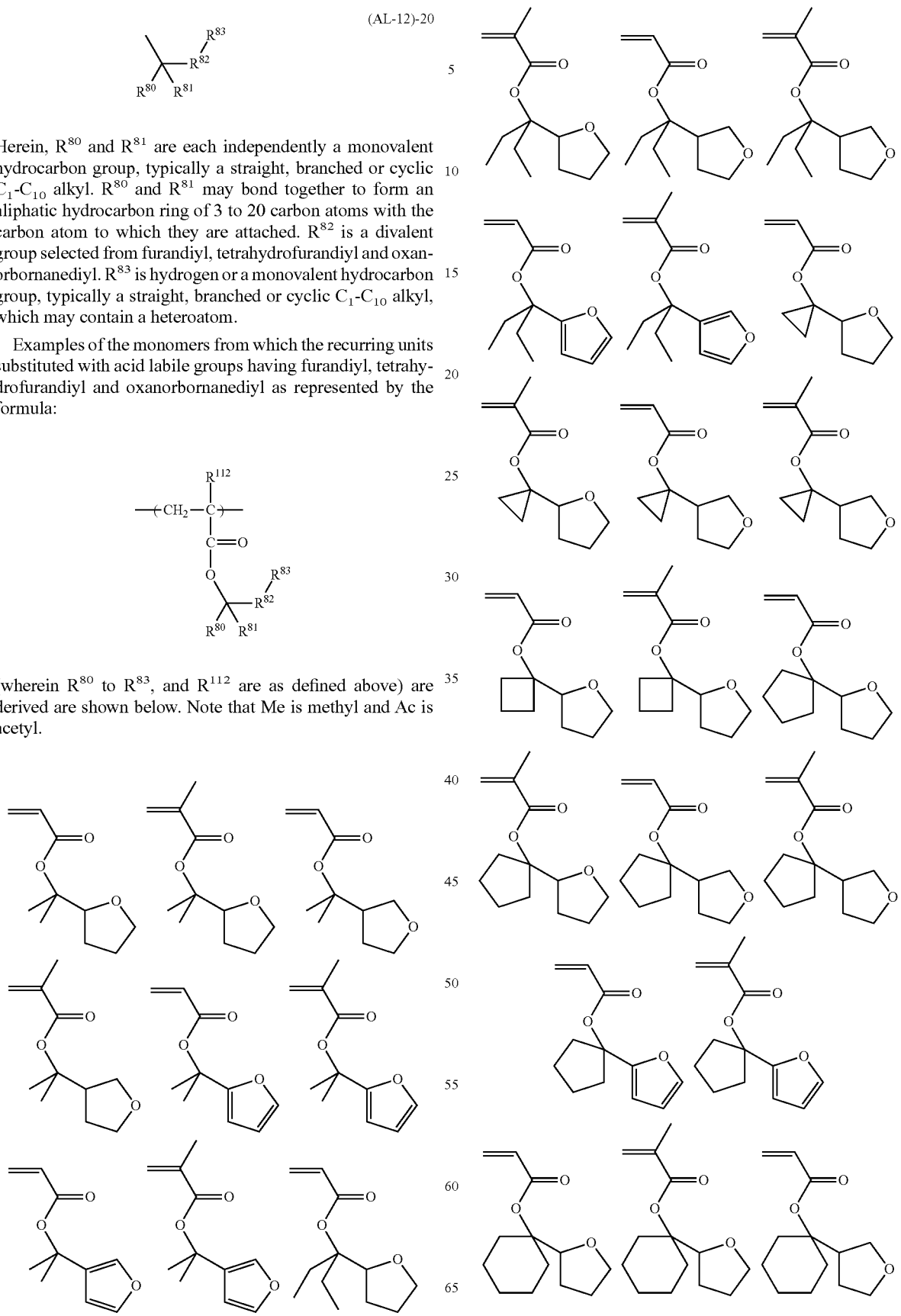

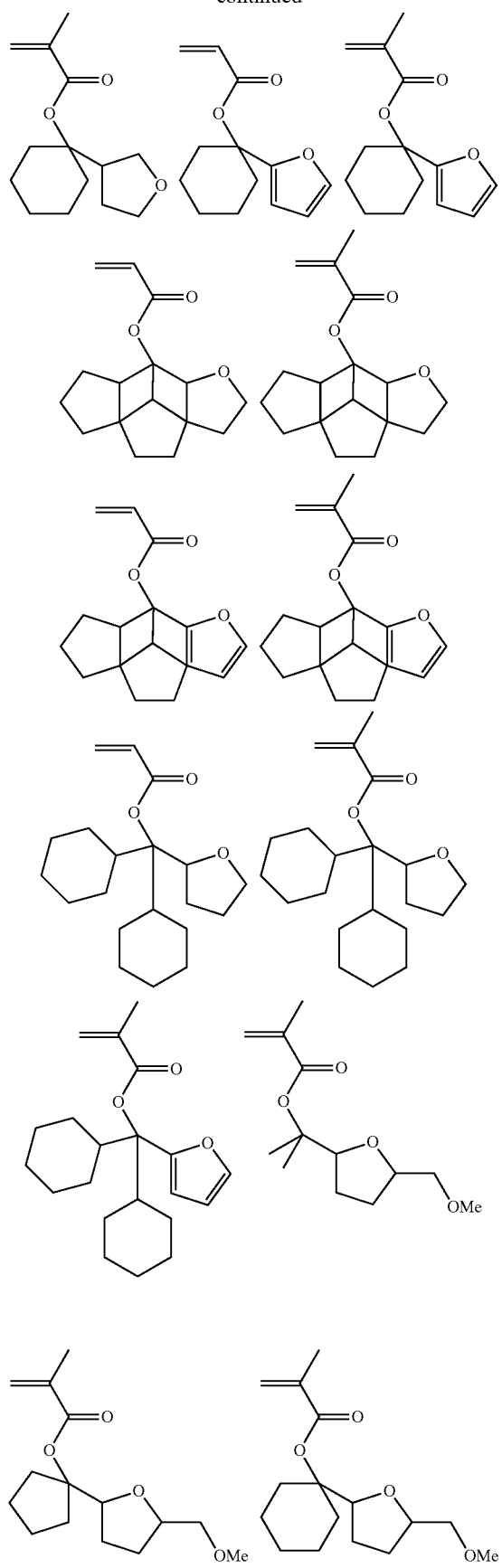
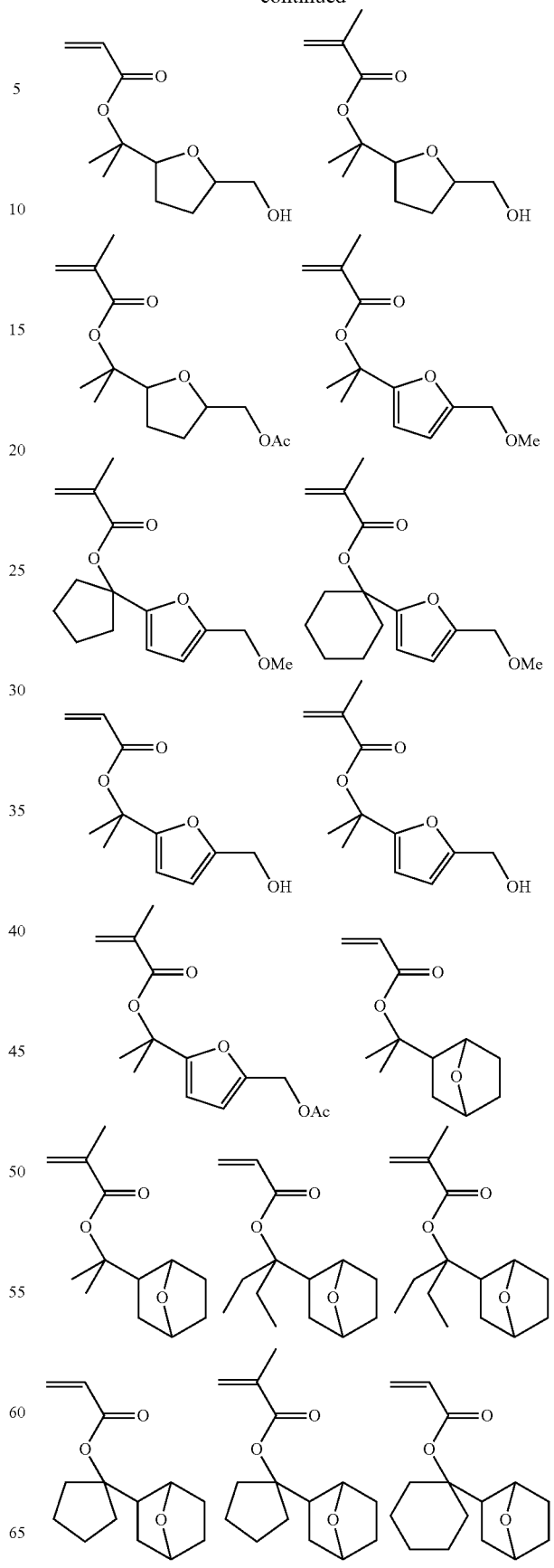

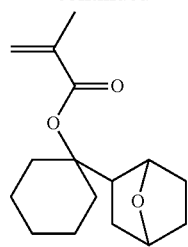 [SMILES: C=C(C)C(=O)OC1(C2CC3CCC2O3)CCCCC1]

While the polymer used herein preferably includes recurring units (a-1) and (a-2) and recurring units (b) in formula (1), it may have copolymerized therein recurring units (c) derived from monomers having adhesive groups such as hydroxy, cyano, carbonyl, ester, ether groups, lactone rings, carboxyl groups or carboxylic anhydride groups. Examples of monomers from which recurring units (c) are derived are given below.

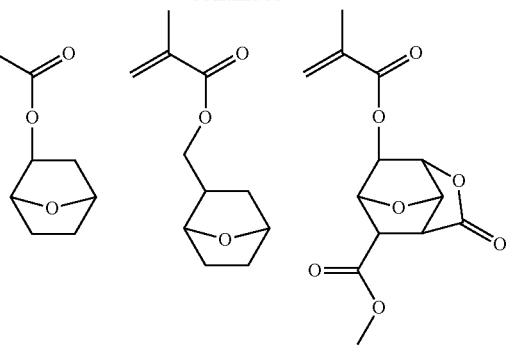

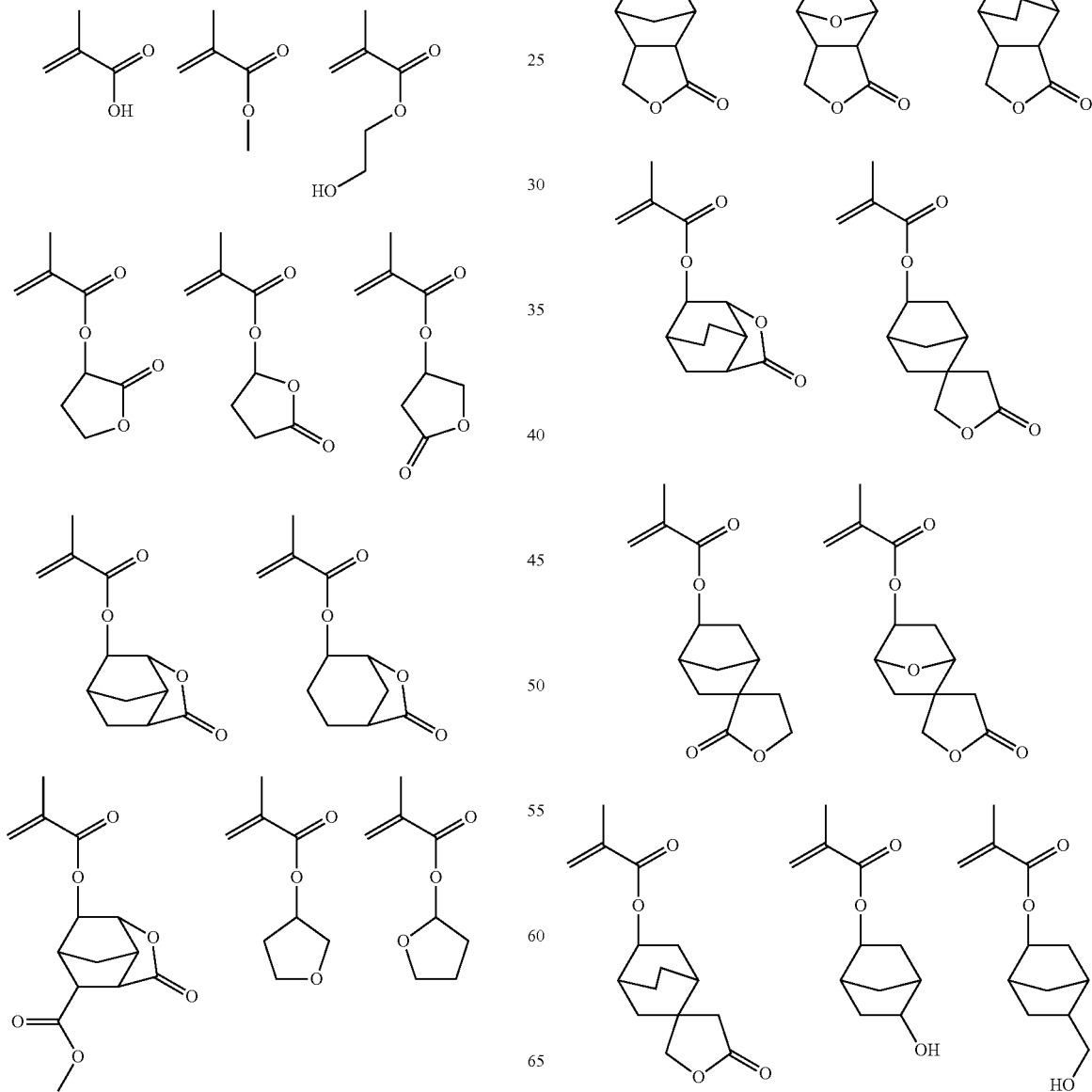

35
-continued
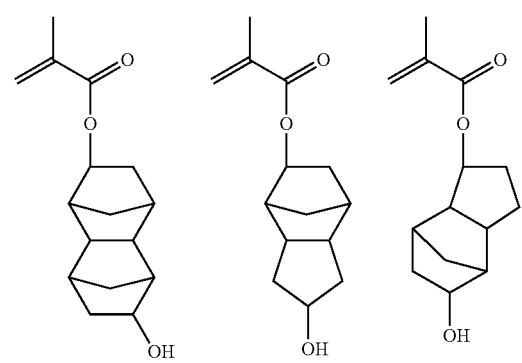
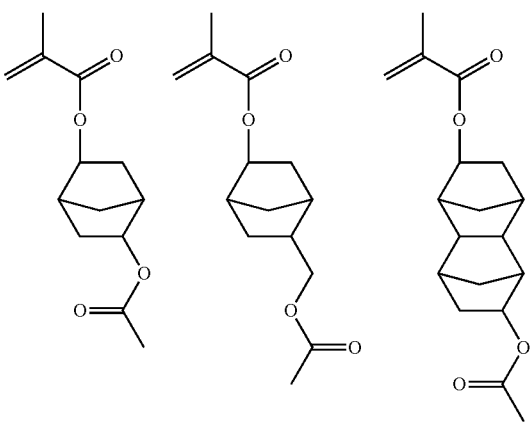
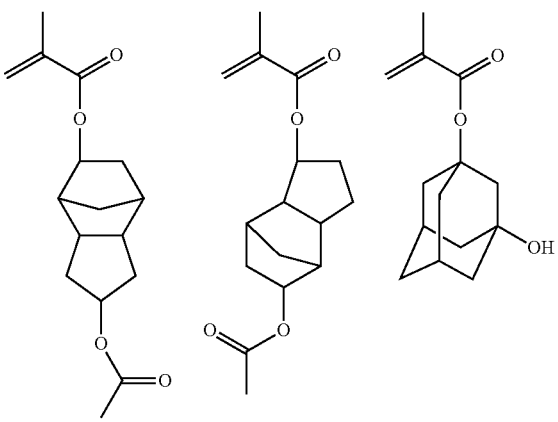
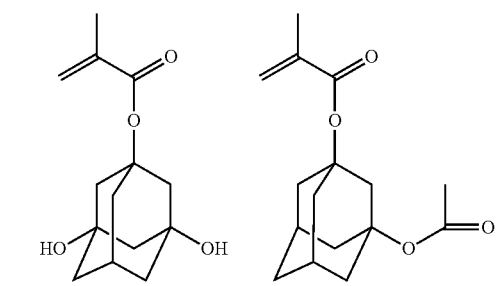
36
-continued
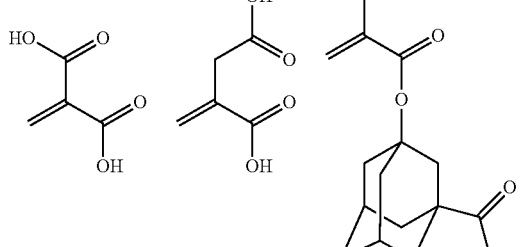
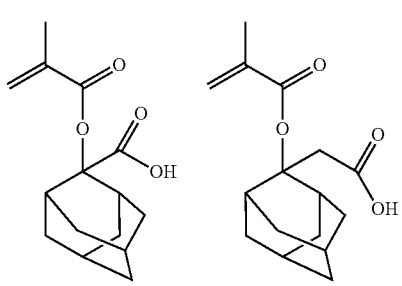

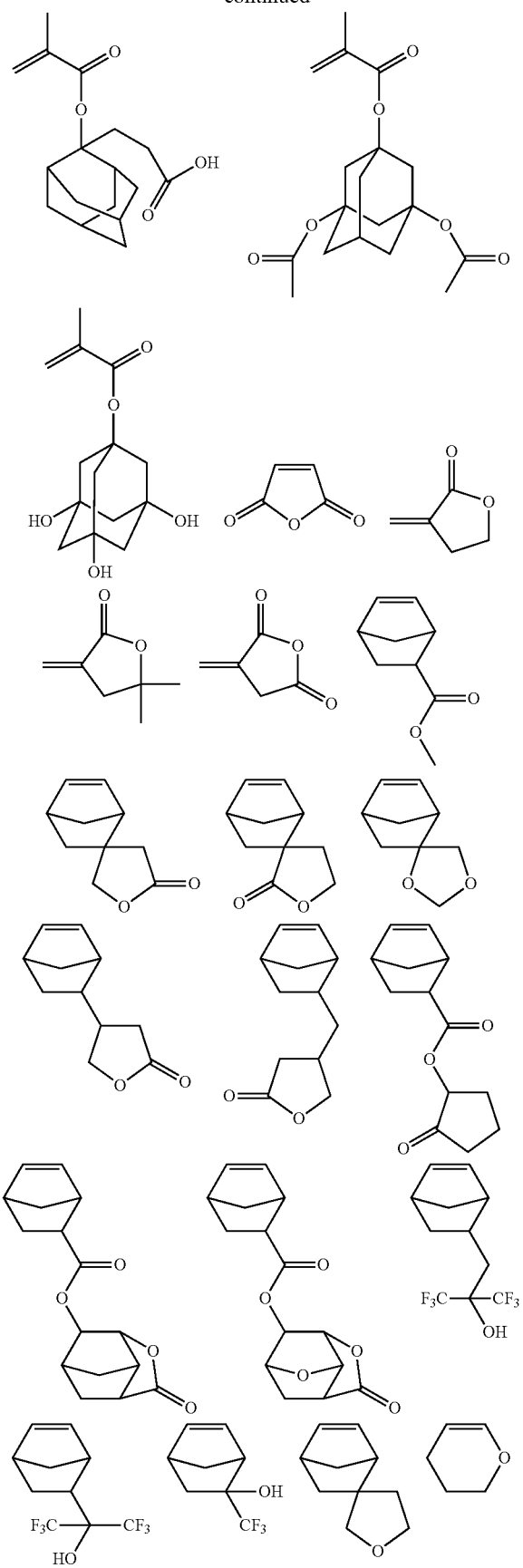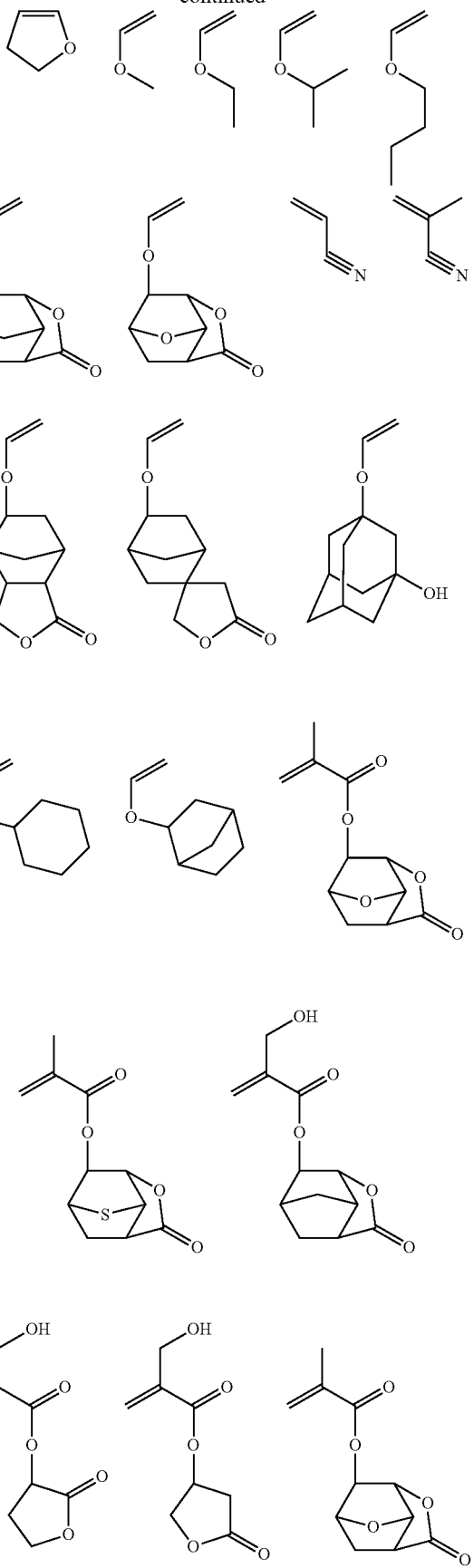

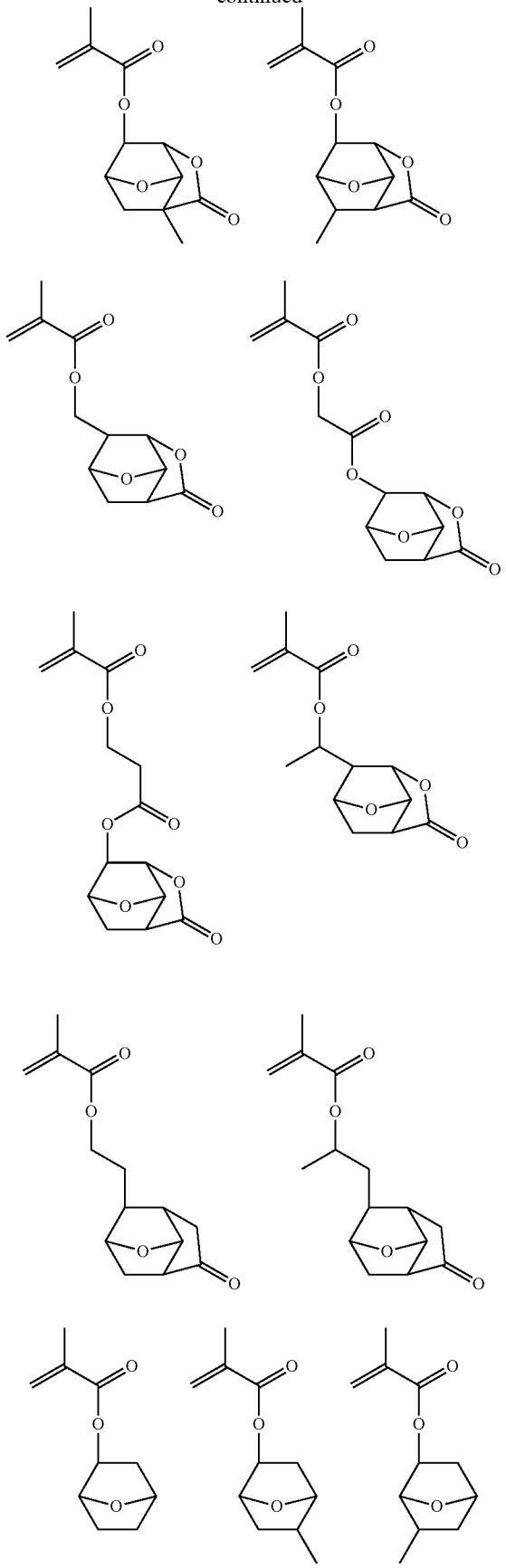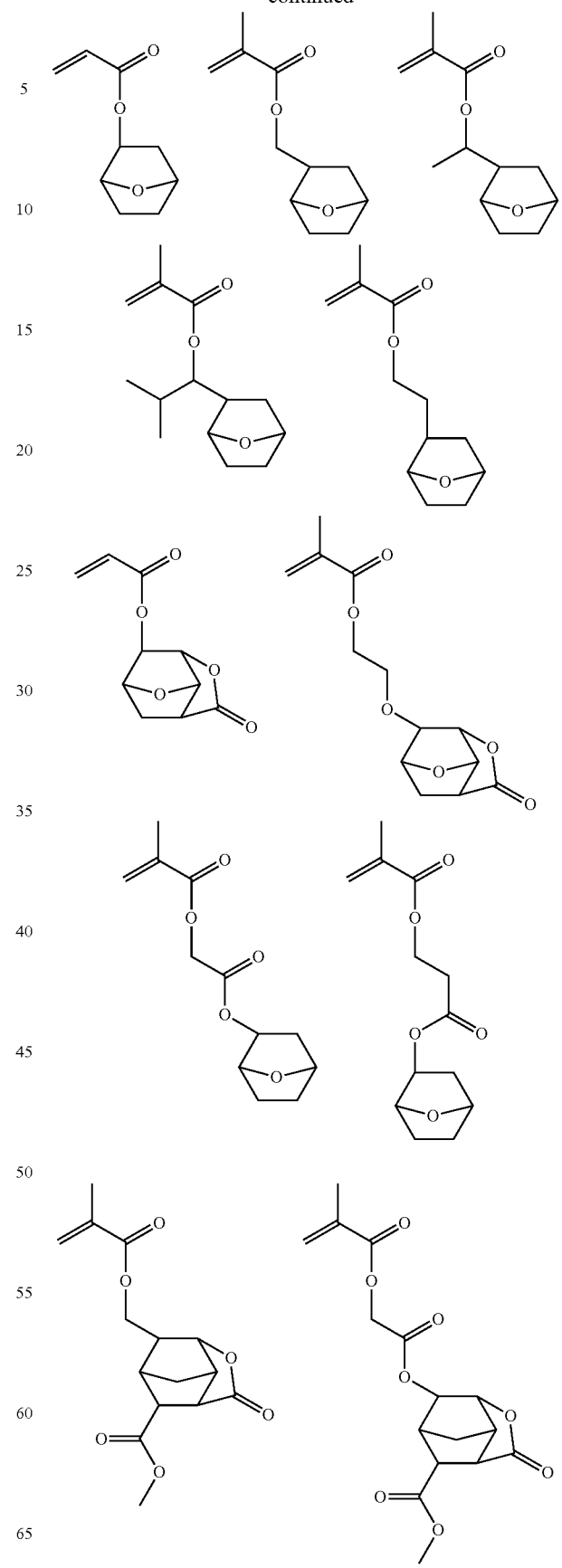

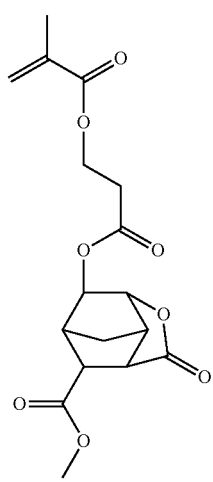 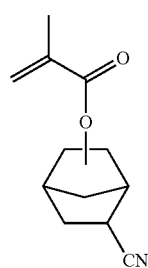 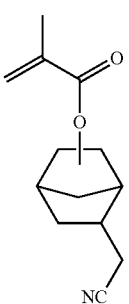 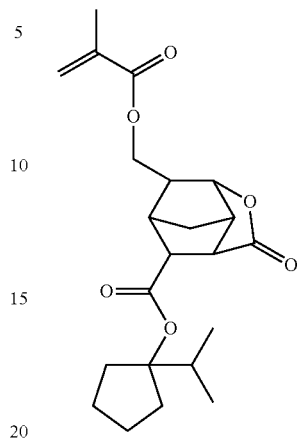 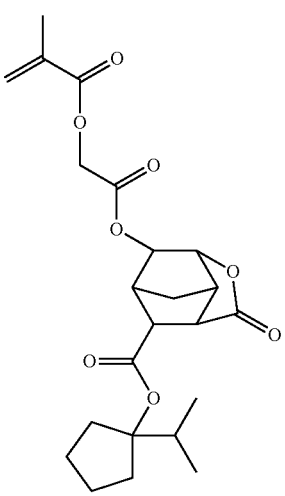
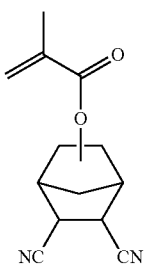 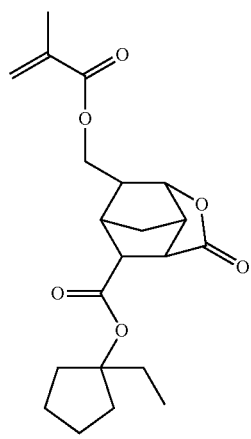 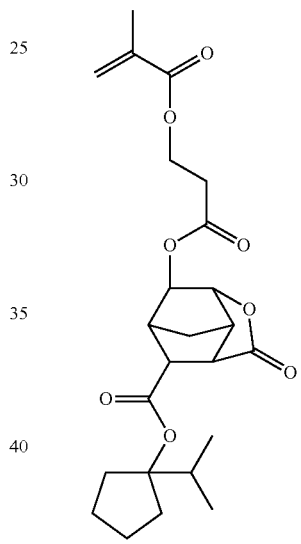 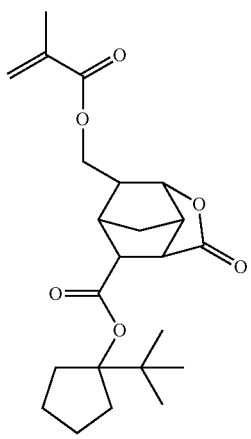
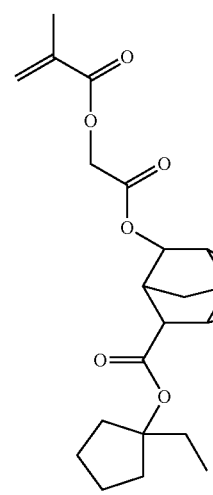 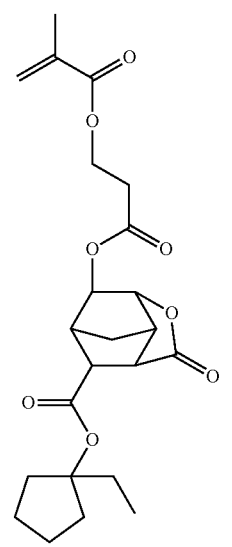 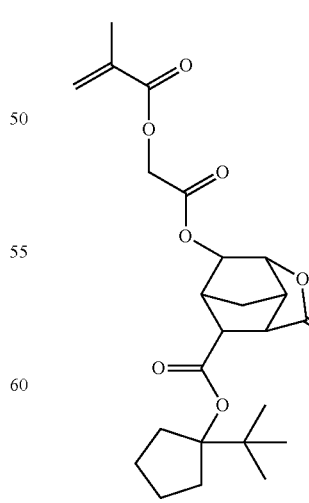 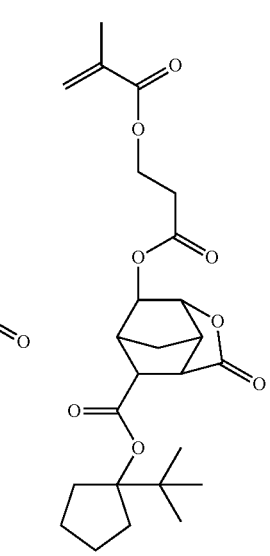

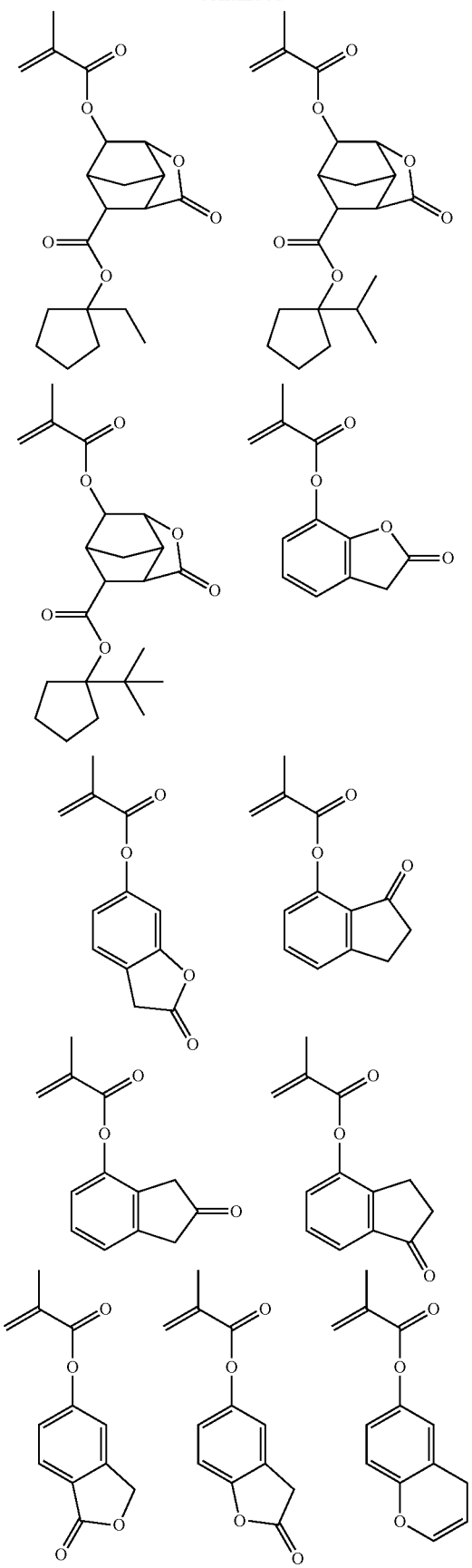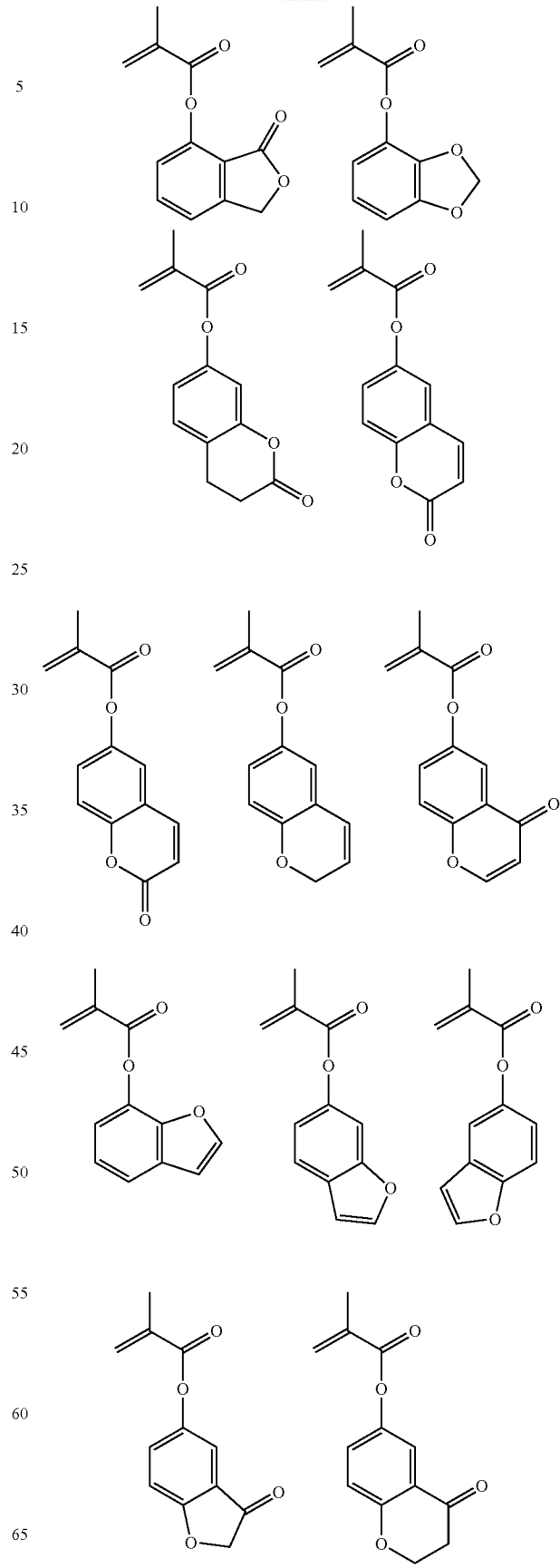

45
-continued
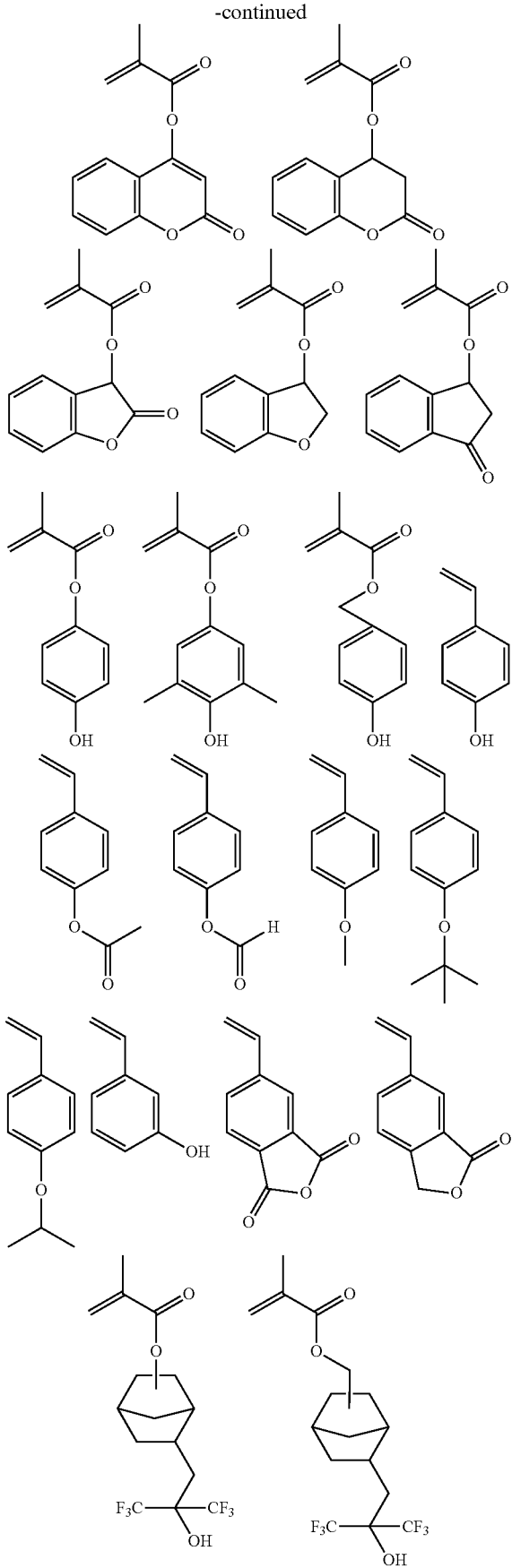
46
-continued
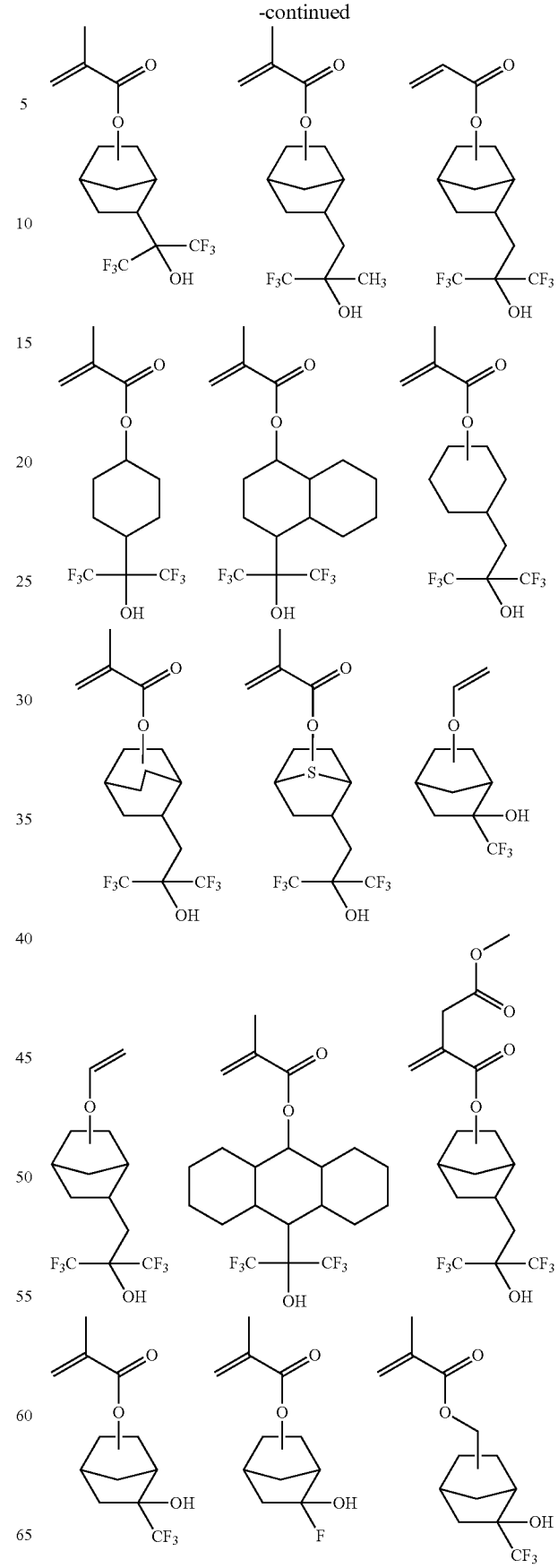

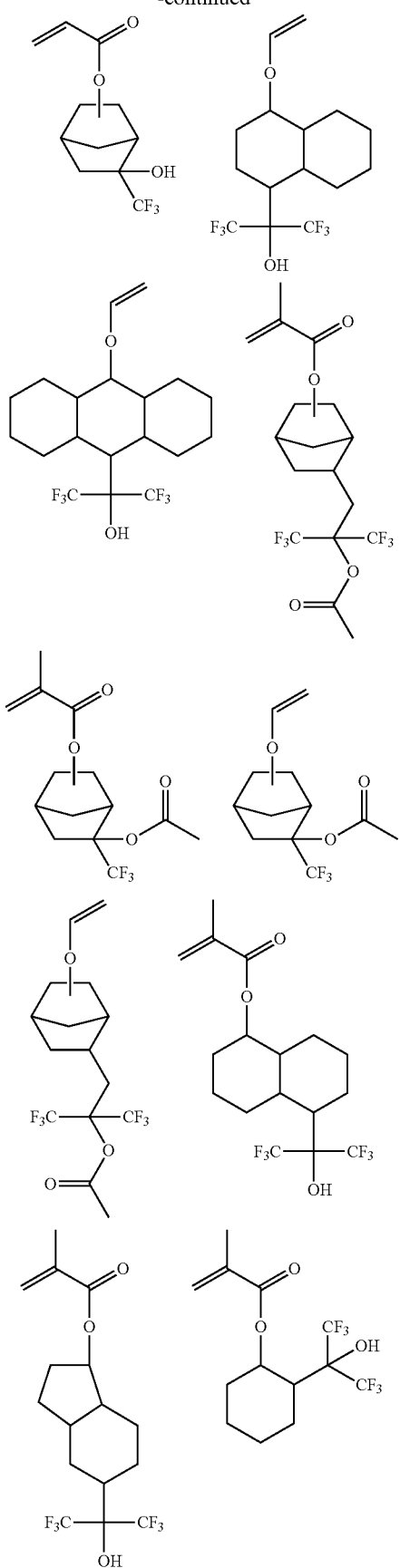
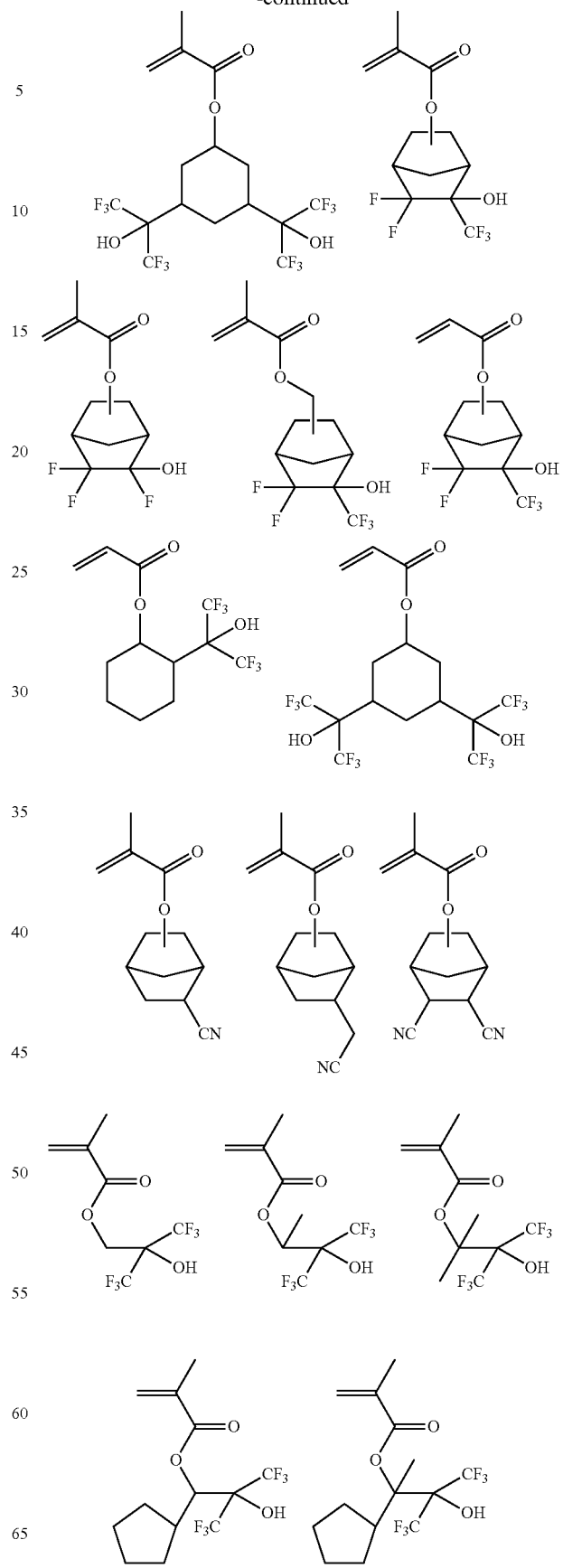

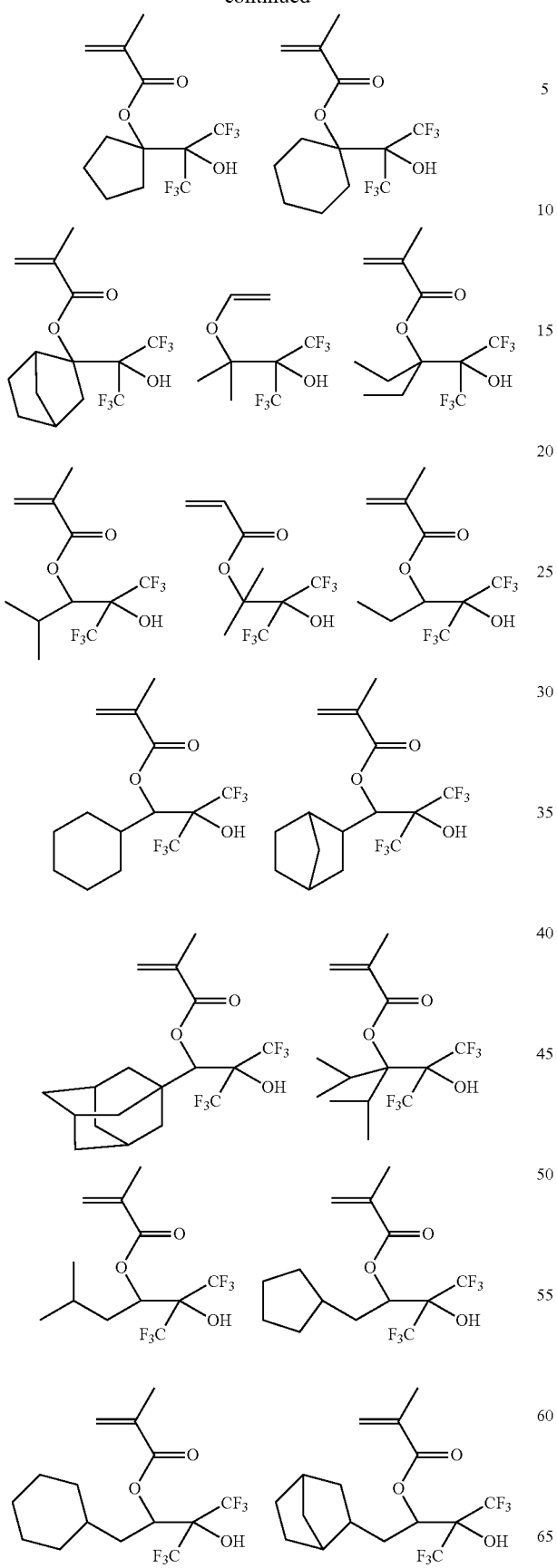

-continued

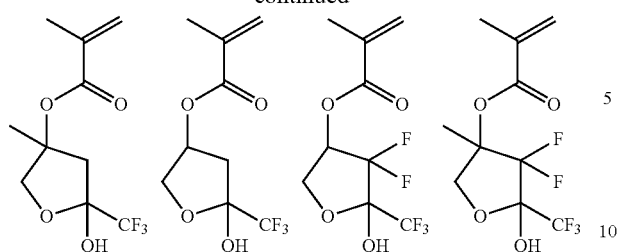

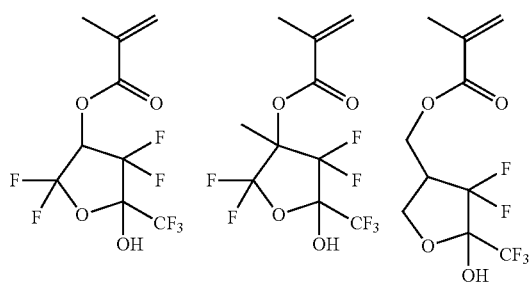

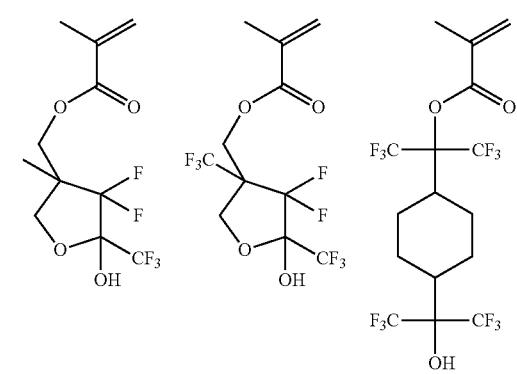

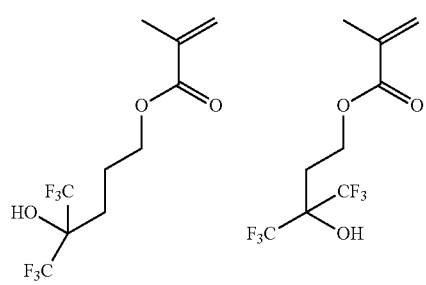

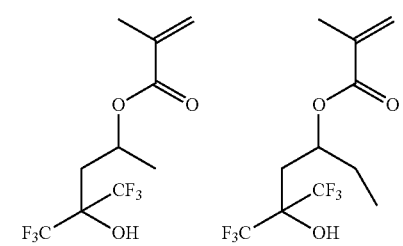

In a preferred embodiment, the copolymer has further copolymerized therein units selected from sulfonium salts (d1) to (d3) represented by the general formulae below.

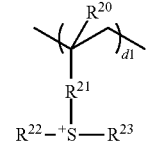
(d1)

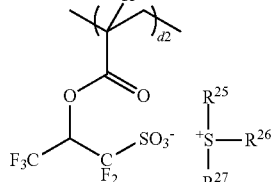
(d2)

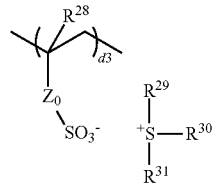
(d3)

Herein $R^{20}$, $R^{24}$, and $R^{26}$ each are hydrogen or methyl, $R^{21}$ is a single bond, phenylene, —O—$R^{33}$—, or —C(=O)—Y—$R^{33}$—, Y is oxygen or NH, $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_0$ is a single bond, methylene, ethylene, phenylene, fluorophenylene, —O—$R^{32}$—, or —C(=O)—$Z_1$—$R^{32}$—, $Z_1$ is oxygen or NH, $R^{32}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range of $0 \leq d1 \leq 0.3$, $0 \leq d2 \leq 0.3$, $0 \leq d3 \leq 0.3$, and $0 \leq d1+d2+d3 \leq 0.3$.

The naphthol group has a less, but some absorption at wavelength 193 nm than the benzene ring. If recurring units having a naphthol group are incorporated in a proportion of 40 mol % or greater, there is a possibility that the cross-sectional profile of holes on negative development is reversely tapered. To increase the dissolution contrast of negative development, a proportion of acid labile groups should be at least 20 mol %, preferably at least 30 mol %. If all the acid labile groups introduced are in the form of acid labile group-substituted naphthol, there is a possibility of reverse taper profile. The problems of absorption and dissolution contrast can be avoided by introducing some or all acid labile groups in the form of acid labile group-substituted carboxyl groups.

In the copolymer, the recurring units (a-1), (a-2), (b), (c), (d1), (d2), and (d3) are preferably present in proportions: $0 \leq a-1 < 1.0$, $0 \leq a-2 < 1.0$, $0 \leq b < 1.0$, $0 < (a-1)+(a-2) < 1.0$, $0 \leq c < 1.0$, $0 \leq d1 < 0.2$, $0 \leq d2 < 0.2$, and $0 \leq d3 < 0.2$, and more preferably $0 \leq a-1 \leq 0.8$, $0 \leq a-2 \leq 0.8$, $0 \leq b \leq 0.75$, $0.1 \leq (a-1)+(a-2) \leq 0.8$, $0 \leq c \leq 0.8$, $0 \leq d1 < 0.15$, $0 \leq d2 < 0.15$, and $0 \leq d3 < 0.15$, provided that $(a-1)+(a-2)+b+c+d1+d2+d3=1$.

It is noted that the meaning of $a+b=1$, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units, for example, units (c).

The polymer serving as the base resin in the resist composition used in the pattern forming process of the invention should preferably have a weight average molecular weight (Mw) in the range of 1,000 to 500,000, and more preferably 2,000 to 30,000, as measured by GPC using polystyrene standards. With too low a Mw, film slimming is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a-1), (a-2), (b), (c), (d1), (d2), and (d3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once eliminated with an acid catalyst and thereafter protected or partially protected.

As described previously, the pattern forming process of the invention comprises the steps of coating the positive resist composition described above onto a substrate, prebaking the resist composition to form a resist film, exposing a selected region of the resist film to high-energy radiation, post-exposure baking, and developing the exposed resist film with an organic solvent developer so that the unexposed region of film is dissolved and the exposed region of film is left, thereby forming a negative tone resist pattern such as a hole or trench pattern.

For the purpose of forming a negative tone pattern from a polymer, in an embodiment wherein the naphthol groups in recurring units (a-1) and (a-2) are substituted with acid labile groups, recurring units (b) having an acid labile group-substituted carboxyl group are not necessarily needed. However, it is preferred to incorporate recurring units (b) having an acid labile group-substituted carboxyl group in combination, when the above-discussed influence of absorption of naphthol is taken into account. Specifically, the recurring units (b) are preferably incorporated in an amount of 0 mol % to 90 mol %, more preferably 5 mol % to 80 mol % of the total recurring units. In another embodiment wherein the naphthol groups in recurring units (a-1) and (a-2) are not substituted with acid labile groups, recurring units (b) having an acid labile group-substituted carboxyl group are essential, and specifically, the recurring units (b) are preferably incorporated in an amount of 10 mol % to 90 mol %, more preferably 15 mol % to 80 mol % of the total recurring units.

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]). Where the polymer has a polymerizable acid generator unit selected from recurring units (d1), (d2) and (d3) copolymerized therein, the acid generator need not necessarily be added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649.

Onium salts such as sulfonium salts, iodonium salts and ammonium salts of sulfonic acids which are not fluorinated at α-position as described in US 2008153030 (JP-A 2008-158339) and similar onium salts of carboxylic acid may be used as the quencher. While an α-position fluorinated sulfonic acid, imidic acid, and methidic acid are necessary to deprotect the acid labile group of carboxylic acid ester, an α-position non-fluorinated sulfonic acid and a carboxylic acid are released by salt exchange with an onium salt which is not fluorinated at α-position. An α-position non-fluorinated sulfonic acid and a carboxylic acid function as a quencher because they do not induce deprotection reaction. In particular, since sulfonium salts and iodonium salts of an α-position non-fluorinated sulfonic acid and a carboxylic acid are photodecomposable, those portions receiving a high light intensity are reduced in quenching capability and increased in the concentration of a α-position fluorinated sulfonic acid, imidic acid, or methidic acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-position non-fluorinated sulfonic acid and a carboxylic acid are highly effective in controlling the diffusion of an α-position fluorinated sulfonic acid, imidic acid and methidic acid. This is because the onium salt resulting from salt exchange is less mobile due to a higher molecular weight. In the event that a hole pattern is formed by negative development, since acid is generated in many regions, it is very important to control the diffusion of acid from the exposed area to the unexposed area. The addition of onium salts including sulfonium salts, iodonium salts and ammonium salts of an α-position non-fluorinated sulfonic acid and a carboxylic acid as well as the carbamate compound capable of generating an amine compound under the action of acid is very important from the aspect of controlling acid diffusion.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, 2008-111103, 2008-122932, 2009-98638, and 2009-276363. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. A water repellent polymer having an amino group copolymerized therein, suited for use in resist compositions is described in JP-A 2009-31767, a copolymer having a sulfonic acid amine salt copolymerized in JP-A 2008-107443, and a copolymer having a carboxylic acid amine salt copolymerized in JP-A 2008-239918. An appropriate amount of the water repellent agent is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

Process

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes SiO$_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of SiO$_2$, SiN, SiON or p-Si, an undercoat in the form of carbon film, a silicon-containing intermediate film, and an organic antireflective coating.

Figure 1B:
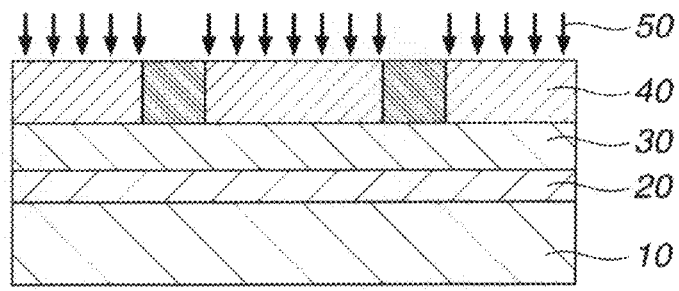
FIG. 1B shows the photoresist film being exposed.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634, 2008-003569, 2008-081716, and 2008-111089 readily dissolve in organic solvent developers.

In the protective film-forming composition, an amine compound or amine salt or a polymer having copolymerized therein recurring units containing an amine compound or amine salt may be used. This component is effective for controlling diffusion of the acid generated in the exposed region of the photoresist film to the unexposed region for thereby preventing any hole opening failure. Useful protective film materials having an amine compound added thereto are described in JP-A 2007-316448, and useful protective film materials having an amino group copolymerized described in JP-A 2007-316448. The amine compound may be selected from the compounds enumerated as the basic compound to be added to the resist composition. An appropriate amount of the amine compound added is 0.01 to 10 parts, preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound added thereto is more effective for preventing acid evaporation. On the other hand, a protective film to which an acid compound such as a carboxyl or sulfo group is added or which is based on a polymer having copolymerized therein monomeric units containing a carboxyl or sulfo group is undesirable because of a potential hole opening failure.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Figure 1C:
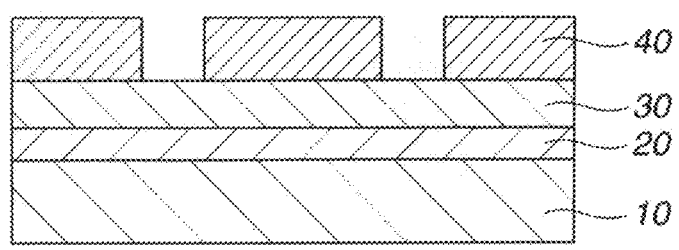
FIG. 1C shows the photoresist film being developed with organic solvent.

Thereafter the exposed resist film is developed with a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether. Suitable aromatic solvents include toluene, xylene, ethylbenzene, isopropylbenzene, t-butylbenzene, and mesitylene. The solvents may be used alone or in admixture.

Where a hole pattern is formed by negative tone development, exposure by double dipole illuminations of X- and Y-direction line patterns provides the highest contrast light. The contrast may be further increased by combining dipole illumination with s-polarized illumination.

Figure 2:
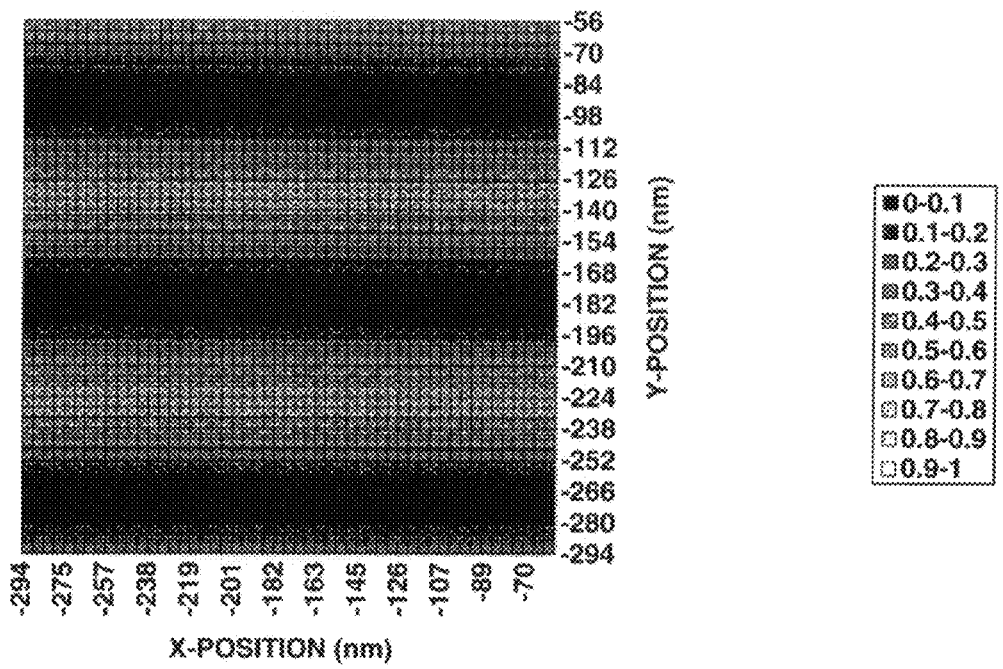
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.
Figure 3:
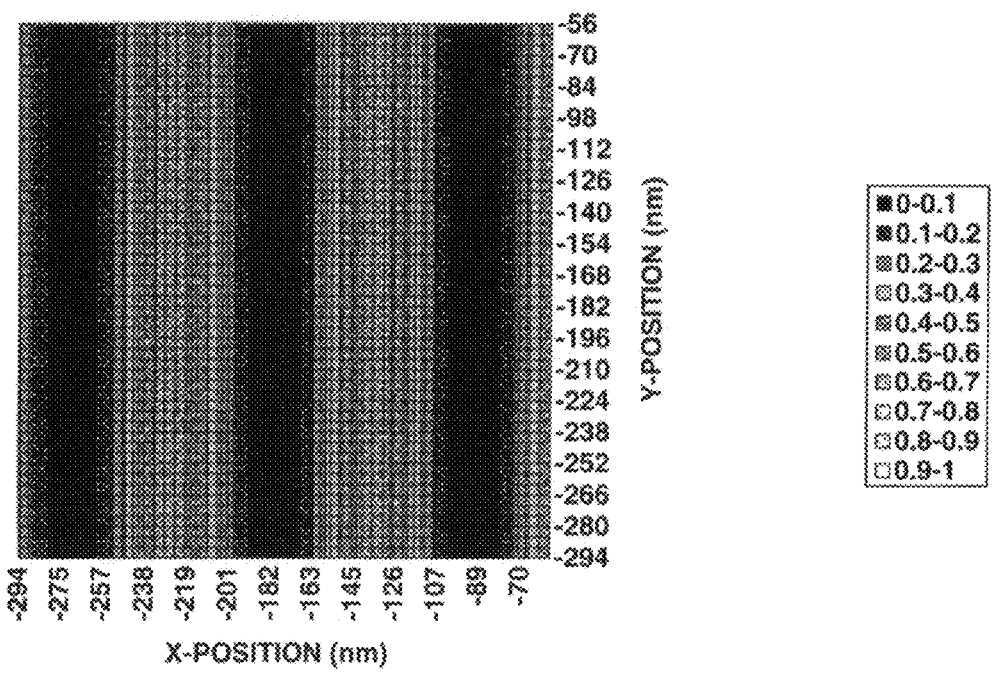
FIG. 3 is an optical image of Y-direction lines like FIG. 2.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area.

Figure 4:
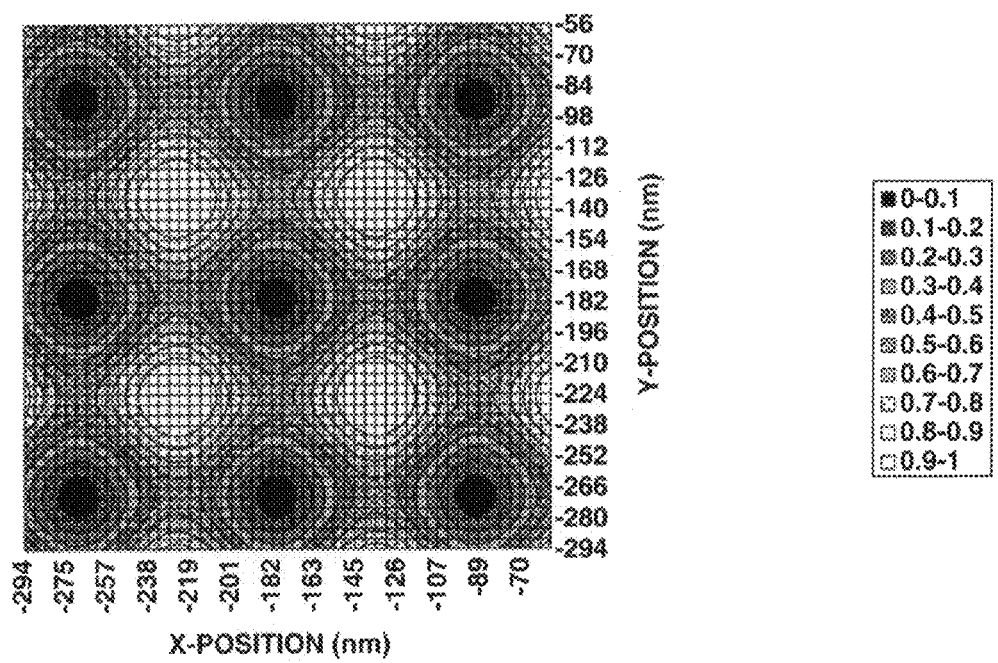
FIG. 4 shows a contrast image obtained by overlaying the optical image of X-direction lines in FIG. 2 with the optical image of Y-direction lines in FIG. 3.

FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Figure 24:
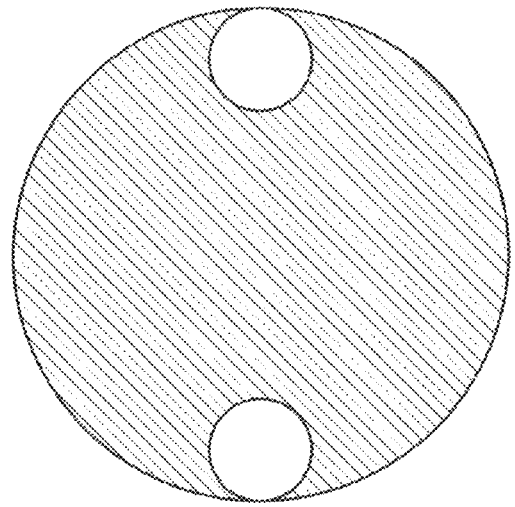
FIG. 24 illustrates an aperture configuration in an exposure tool of dipole illumination for improving the contrast of X-direction lines.
Figure 25:
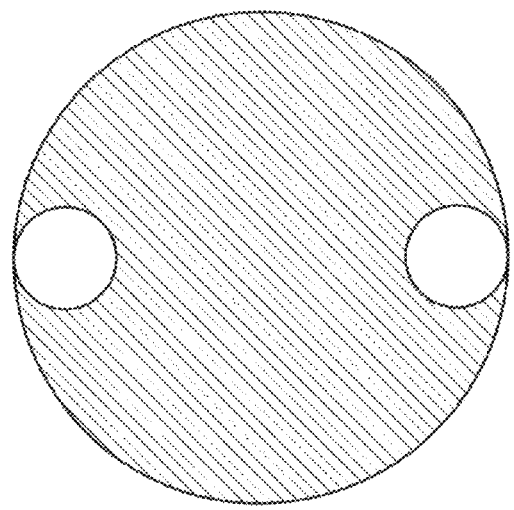
FIG. 25 illustrates an aperture configuration in an exposure tool of dipole illumination for improving the contrast of Y-direction lines.

As described in Non-Patent Document 1, exposure by double dipole illuminations of X- and Y-direction lines combined with polarized illumination presents a method of forming light of the highest contrast. This method, however, is not regarded practical because of the drawback that the throughput is substantially reduced by double exposures and mask exchange therebetween. It is then proposed to carry out two exposures by dipole illuminations in X- and Y-directions using a mask having a lattice-like pattern. Specifically, the method involves forming X-direction lines in a first photoresist film by X-direction dipole illumination using a mask having a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures to give rise to the problem of an increased alignment error. To minimize the alignment error between two exposures, two exposures must be continuously carried out without removing the wafer from the exposure stage. FIG. 24 shows the shape of apertures for dipole illumination for forming X-direction or horizontal lines using a mask having a lattice-like pattern, and FIG. 25 shows the shape of apertures for dipole illumination for forming Y-direction or vertical lines. The addition of s-polarized illumination to dipole illumination provides a further improved contrast and is thus preferably employed. After two exposures for forming X- and Y-direction lines using a lattice-like mask are performed in an overlapping manner, negative tone development is performed whereupon a hole pattern is formed.

Figure 26:
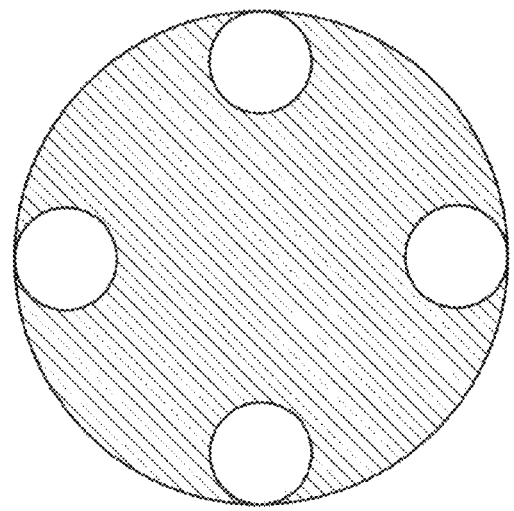
FIG. 26 illustrates an aperture configuration in an exposure tool of cross-pole illumination.

When it is desired to form a hole pattern via a single exposure using a lattice-like mask, a quadra-pole illumination or cross-pole illumination in the aperture configuration shown in FIG. 26 is used. The contrast may be improved by combining it with X-Y polarized illumination or azimuthally polarized illumination of circular polarization.

In the hole pattern forming process of the invention, when two exposures are involved, continuous exposures are carried out by changing the illumination for the second exposure from that for the first exposure, whereby the alignment error is minimized. Of course, a single exposure can make an alignment error smaller than two continuous exposures.

Figure 5:
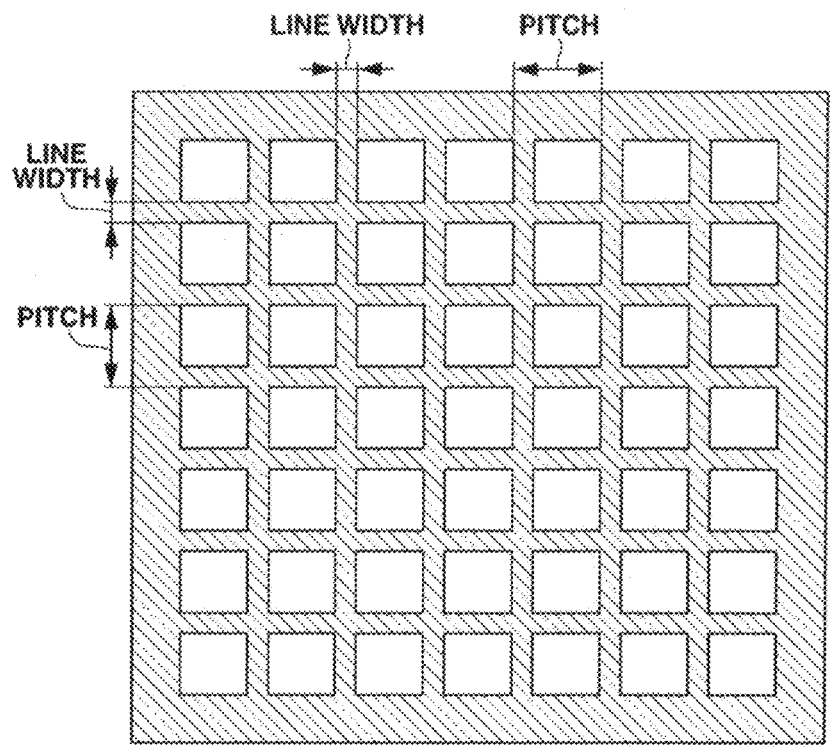
FIG. 5 illustrates a mask bearing a lattice-like pattern.
Figure 7:
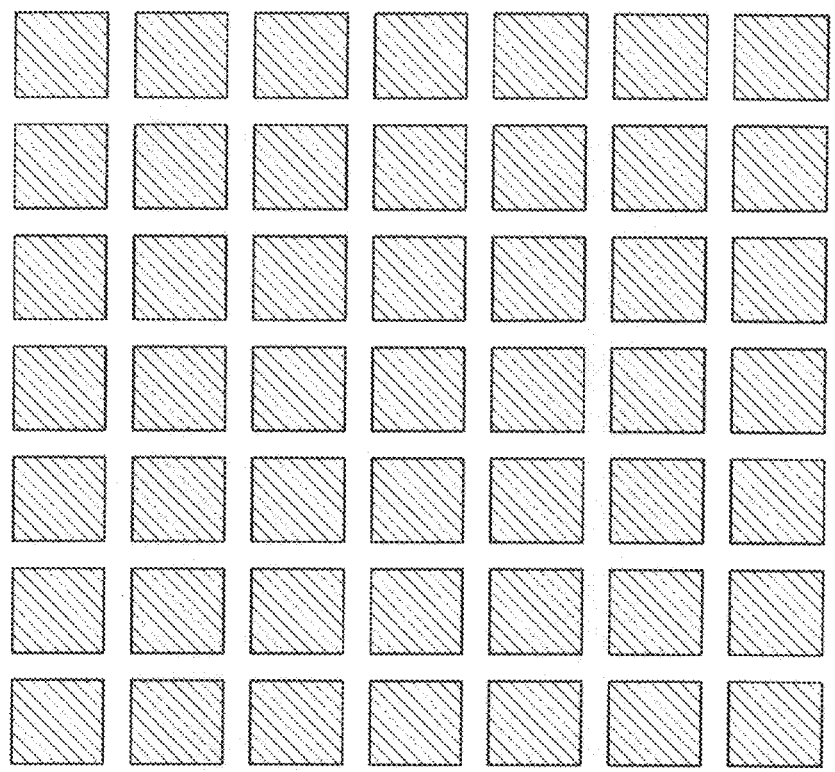
FIG. 7 illustrates a mask bearing a dot pattern of square dots having a pitch of 90 nm and a side width of 60 nm under conditions: NA 1.3 lens, cross-pole illumination, 6% halftone phase shift mask, and azimuthally polarized illumination.
Figure 11:
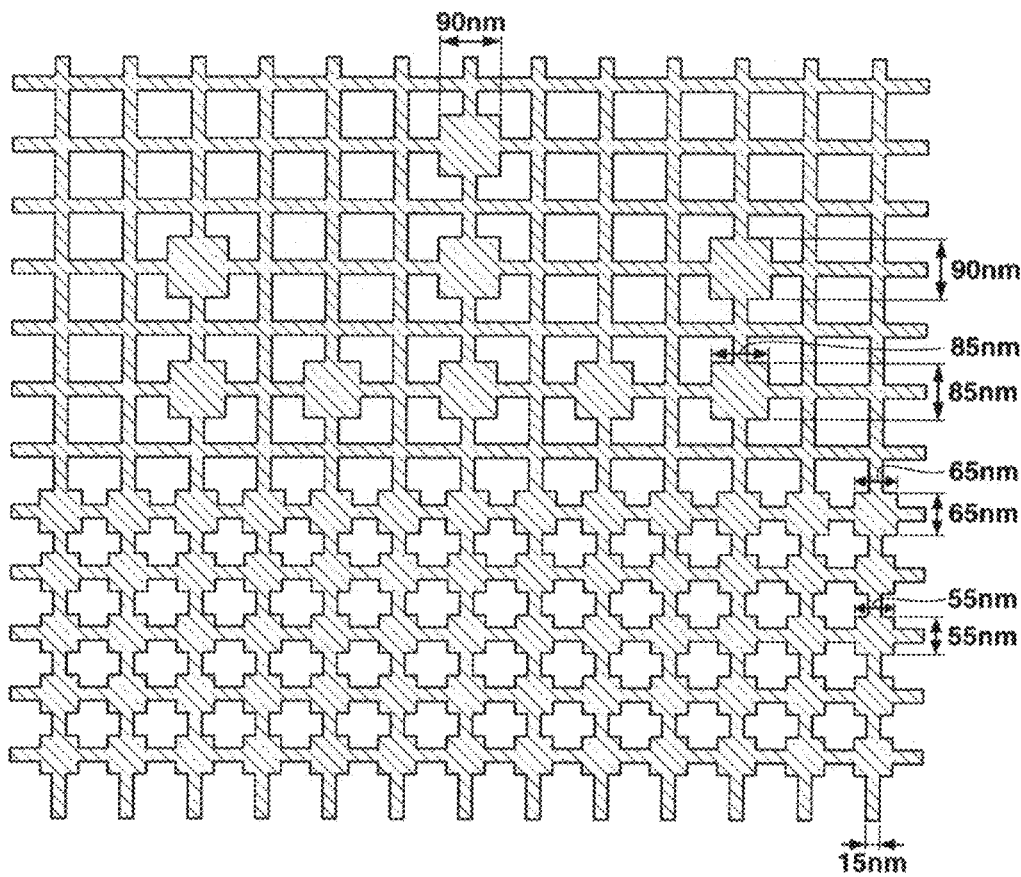
FIG. 11 illustrates a mask bearing a lattice-like pattern having a pitch of 90 nm and a line width of 15 nm on which thick dots are disposed where dots are to be formed.

The mask pattern used herein may be a lattice-like pattern as shown in FIG. 5, a dot pattern as shown in FIG. 7, or a combination of a dot pattern and a lattice-like pattern as shown in FIG. 11. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask having a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures. Using such a mask and illumination, a hole pattern of the order of 40 nm can be formed at a practically acceptable cost.

The masks include binary masks and phase shift masks, and the phase shift masks include halftone type and Levenson type. Any type of mask may be used. Since the binary masks have a low light contrast albeit an economical advantage that they are manufactured at low cost, the phase shift masks are often used. Of the phase shift masks, halftone phase shift masks having a transmittance of 3 to 15% are preferred because of the manufacture merit.

Figure 6:
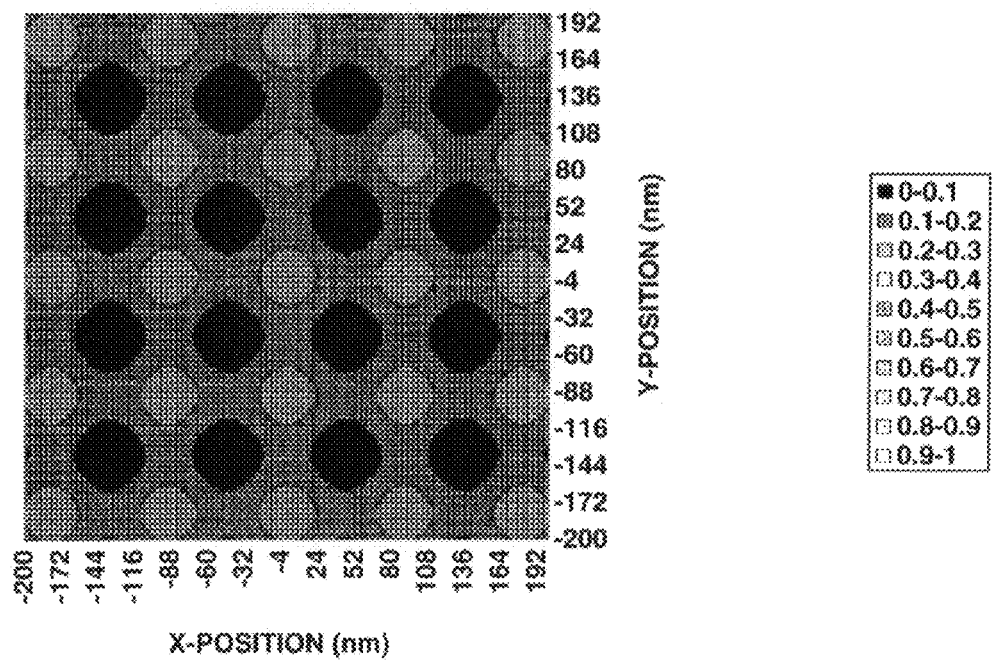
FIG. 6 is an optical image of a lattice-like pattern having a pitch of 90 nm and a line width of 30 nm under conditions: NA 1.3 lens, cross-pole illumination, 6% halftone phase shift mask, and azimuthally polarized illumination.

On use of a mask having a lattice-like pattern as shown in FIG. 5 where light is fully shielded at intersections between gratings, black spots having a very high degree of light shielding appear as shown in FIG. 6. FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination. A fine hole pattern may be formed by performing exposure through a mask having such a pattern and organic solvent development entailing positive/negative reversal.

Figure 8:
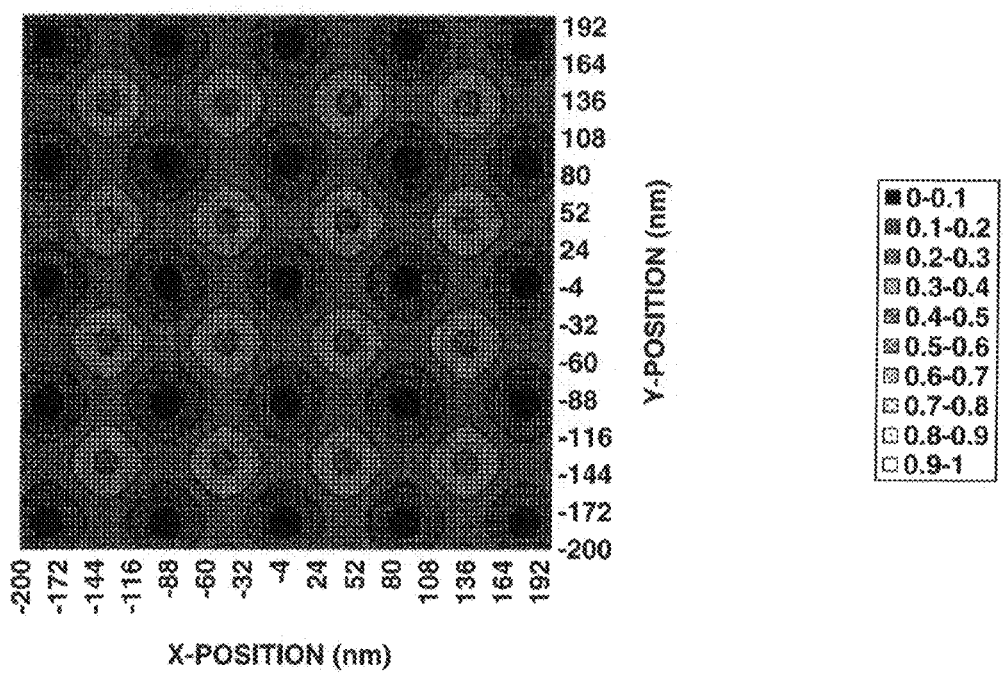
FIG. 8 is an optical image resulting from the mask of FIG. 7, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. Although the circle of fully light shielded spot in FIG. 8 has a smaller area than in FIG. 6, which indicates a low contrast as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 9:
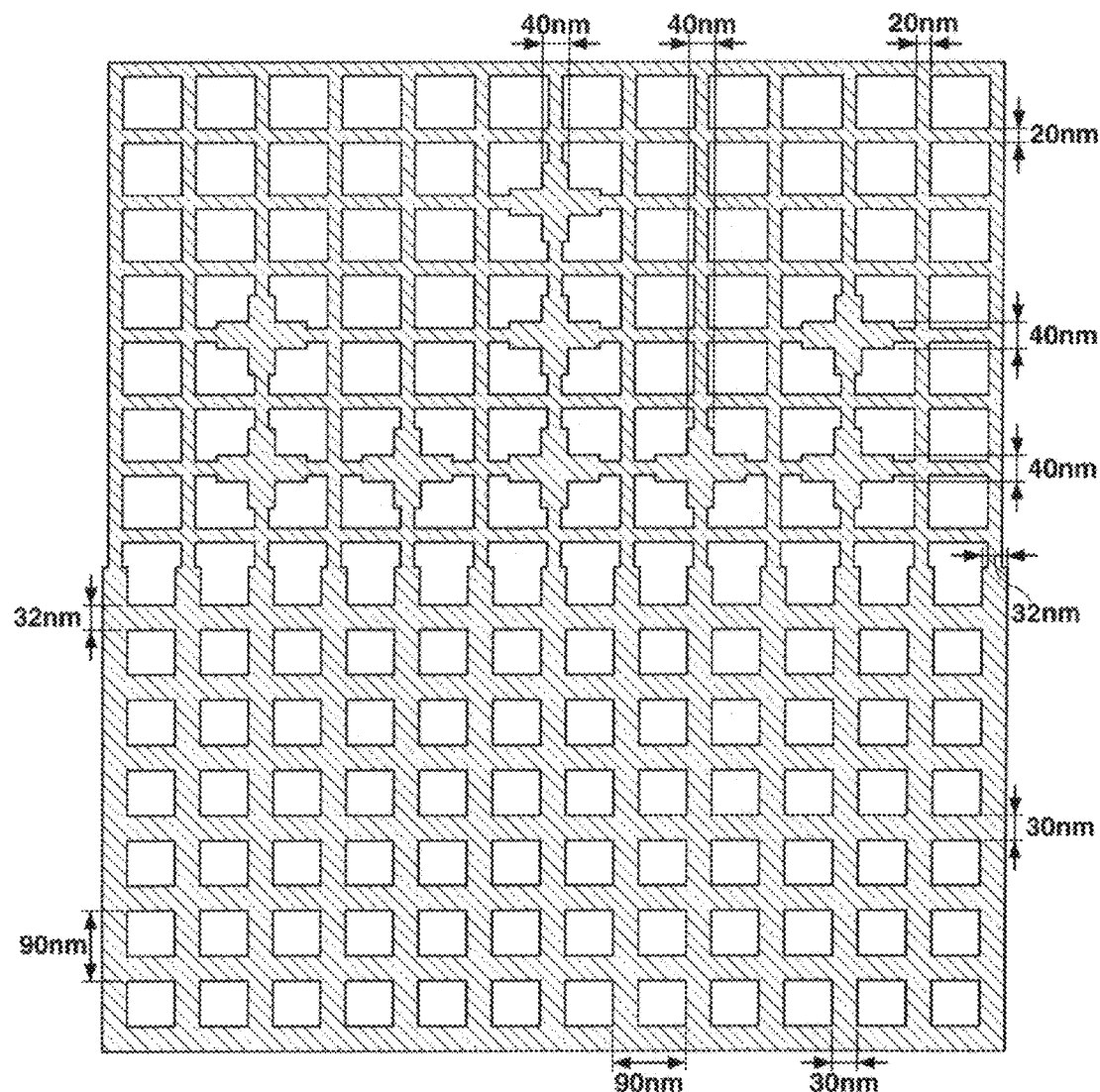
FIG. 9 illustrates a mask bearing a lattice-like pattern having a pitch of 90 nm and a line width of 20 nm on which thick crisscross or intersecting line segments are disposed where dots are to be formed.
Figure 10:
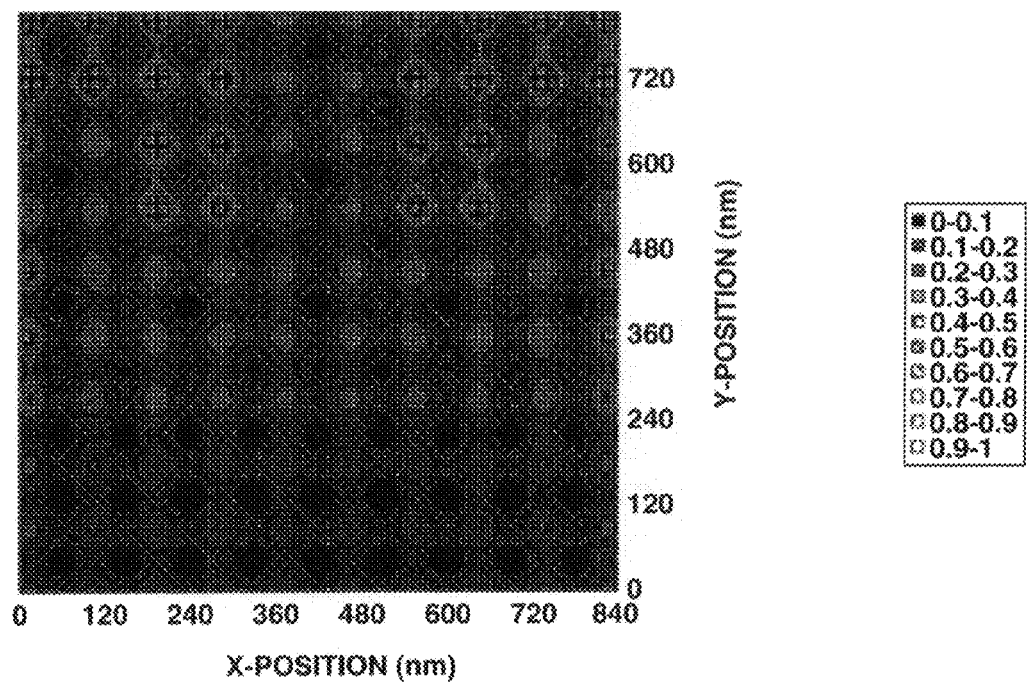
FIG. 10 is an optical image resulting from the mask of FIG. 9, showing its contrast.

To form a random pitch hole pattern by organic solvent development entailing positive/negative reversal, a mask is used in which a lattice-like pattern is arrayed over the entire surface and the width of gratings is thickened only where holes are to be formed. As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 10 shows an optical image from the mask of FIG. 9, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Also useful is a mask in which a lattice-like pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, octagonal, and polygonal shapes and even circular shape.

Figure 12:
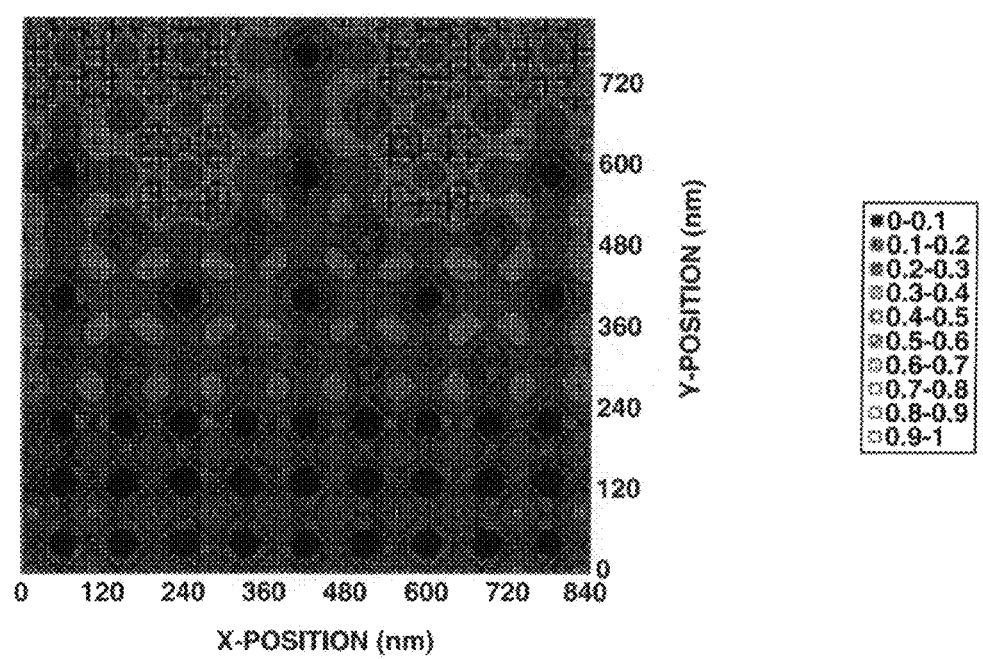
FIG. 12 is an optical image resulting from the mask of FIG. 11, showing its contrast.

FIG. 12 shows an optical image from the mask of FIG. 11, indicating the contrast thereof. The presence of black or light shielded spots substantially equivalent to those of FIG. 10 indicates that holes are formed via positive/negative reversal.

Figure 13:
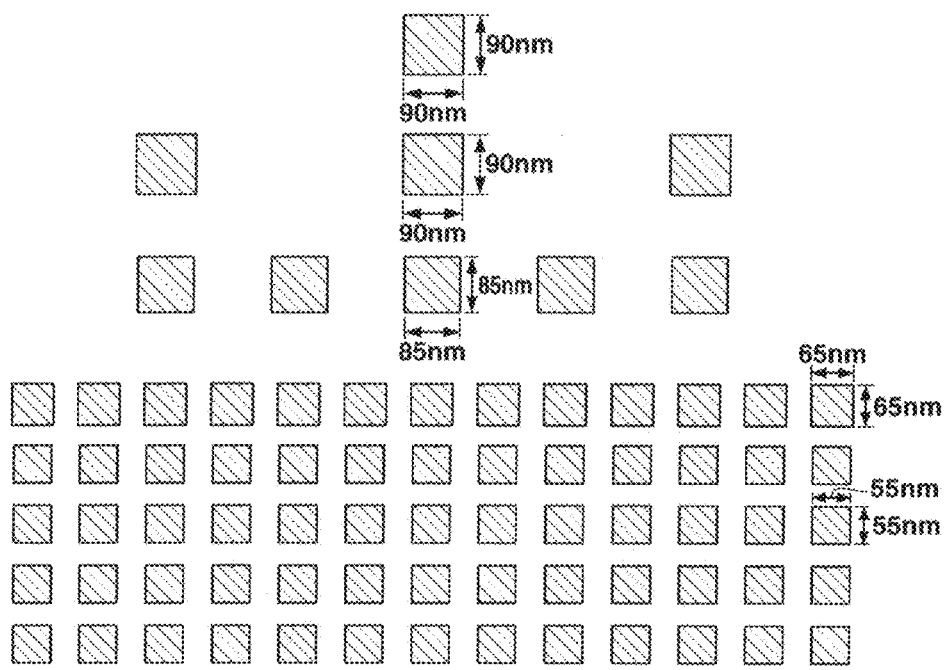
FIG. 13 illustrates a mask without a lattice-like pattern.
Figure 14:
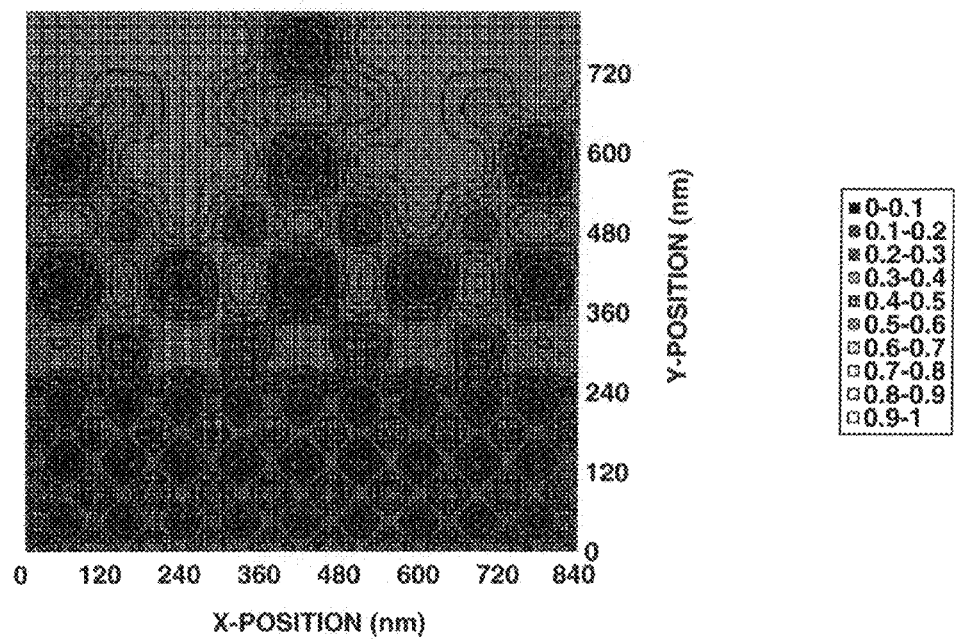
FIG. 14 is an optical image resulting from the mask of FIG. 13, showing its contrast.
Figure 15:
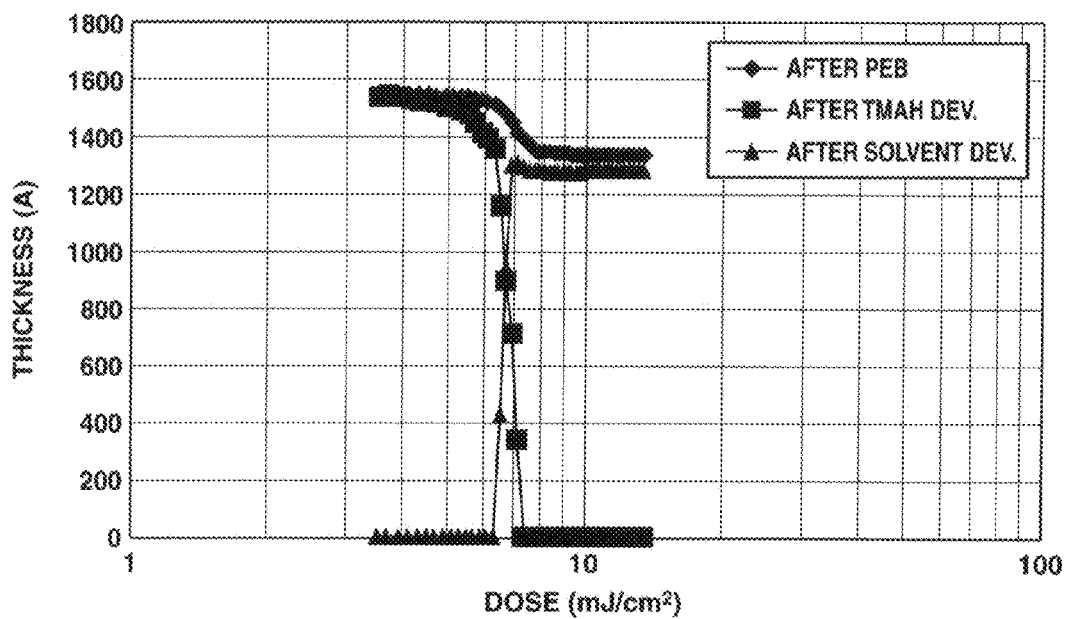
FIG. 15 is a diagram showing film thickness versus exposure dose in Example 1-1.
Figure 16:
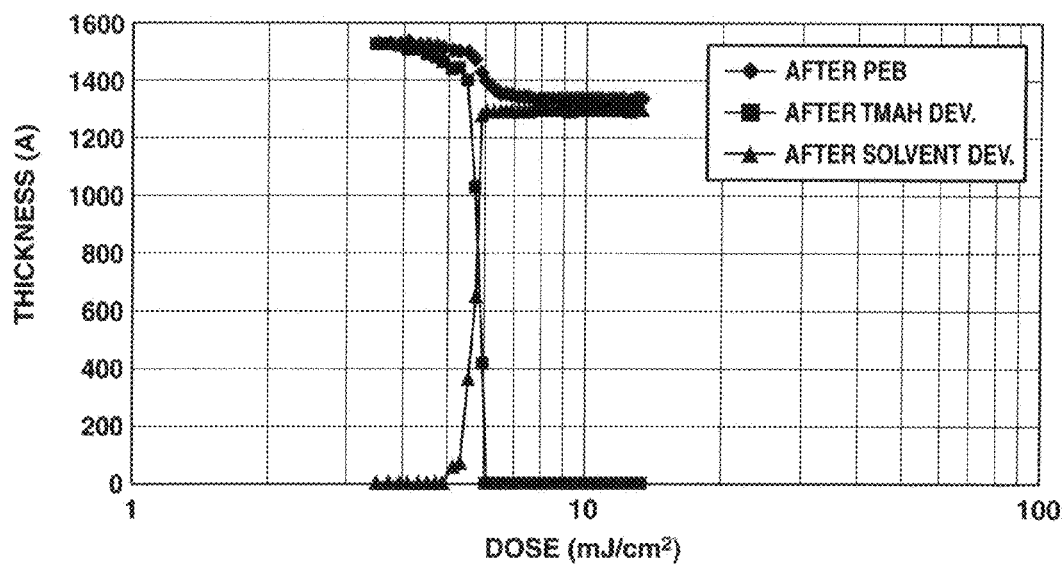
FIG. 16 is a diagram showing film thickness versus exposure dose in Example 1-2.
Figure 17:
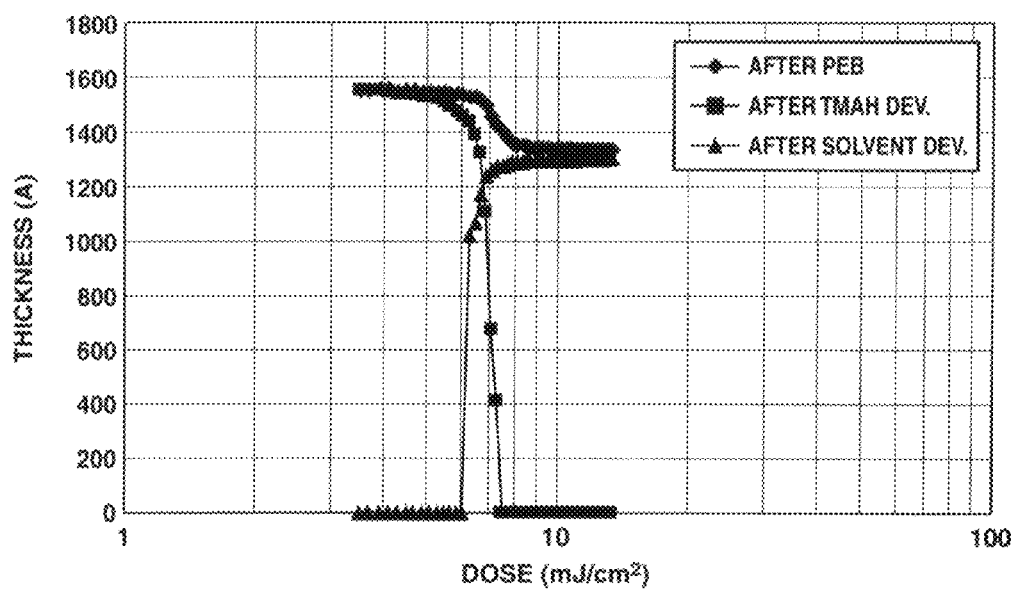
FIG. 17 is a diagram showing film thickness versus exposure dose in Example 1-3.
Figure 18:
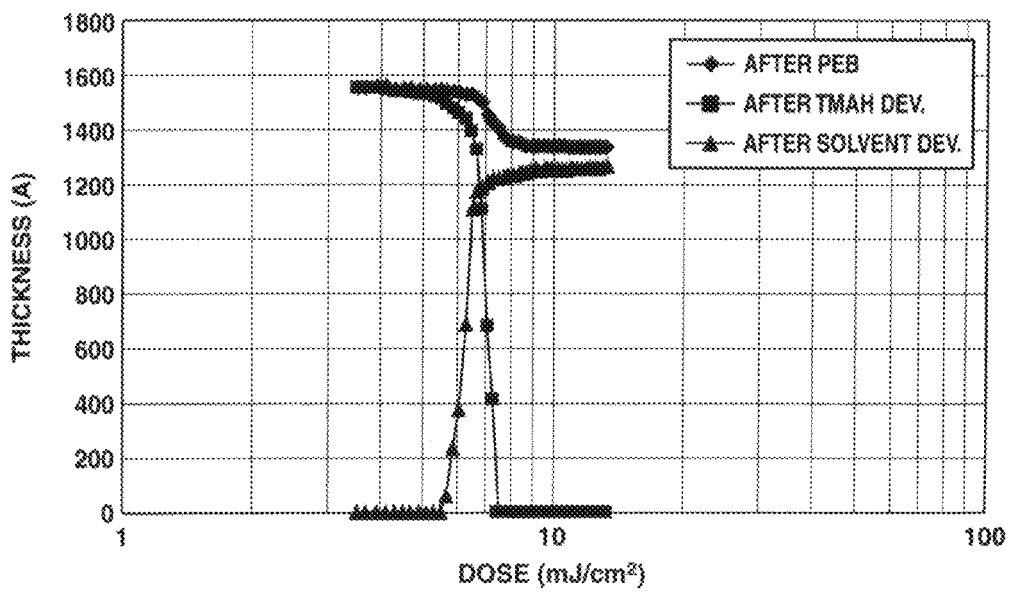
FIG. 18 is a diagram showing film thickness versus exposure dose in Example 1-4.
Figure 19:
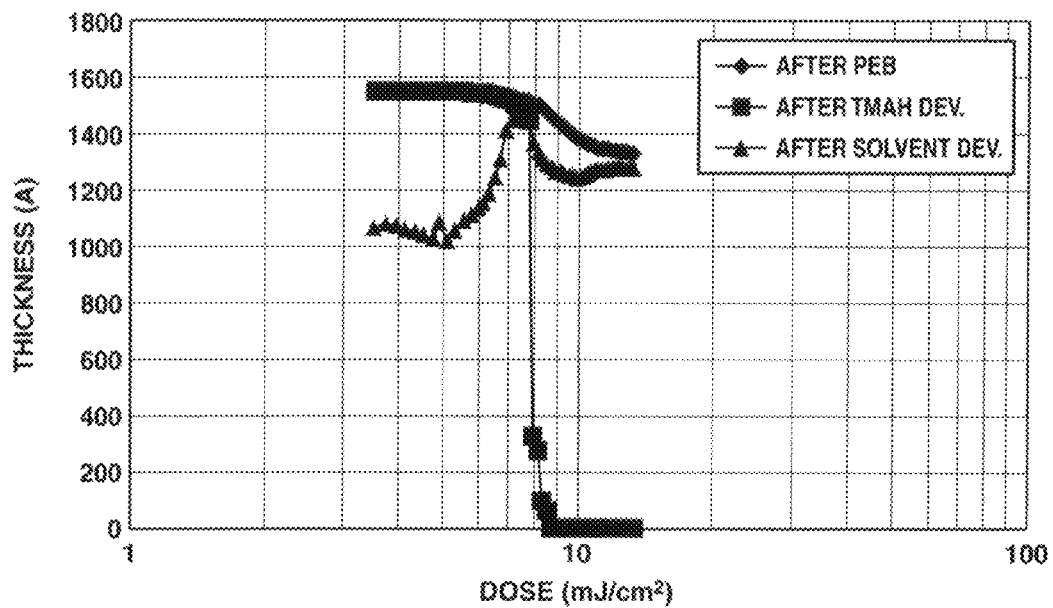
FIG. 19 is a diagram showing film thickness versus exposure dose in Comparative Example 1-1.
Figure 20:
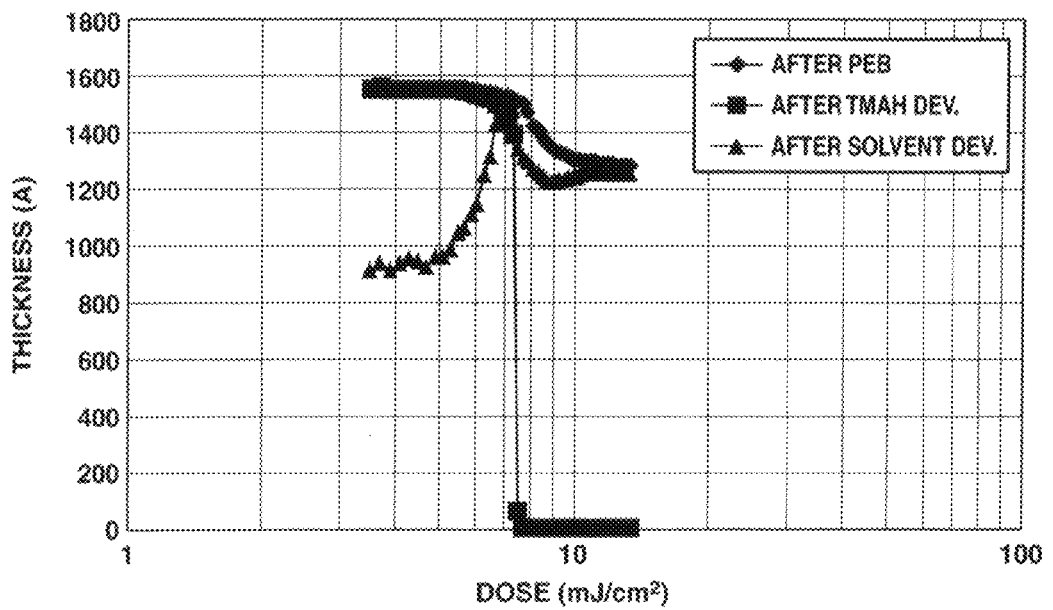
FIG. 20 is a diagram showing film thickness versus exposure dose in Comparative Example 1-2.

On use of a mask having no lattice-like pattern arrayed as shown in FIG. 13, black or light shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards. For pattern profile observation, a top-down scanning electron microscope (TDSEM) S-9380 (Hitachi Hitechnologies, Ltd.) was used.

Synthesis Examples

Polymers for use in resist compositions were prepared by combining monomers, effecting copolymerization reaction in tetrahydrofuran medium, precipitating in methanol, repeatedly washing with hexane, isolation, and drying. The resulting polymers (Resist Polymers 1 to 16 and Comparative Resist Polymers 1 to 3) had the composition shown below. The composition of the polymer was analyzed by $^1$H-NMR, and the Mw and Mw/Mn determined by GPC.

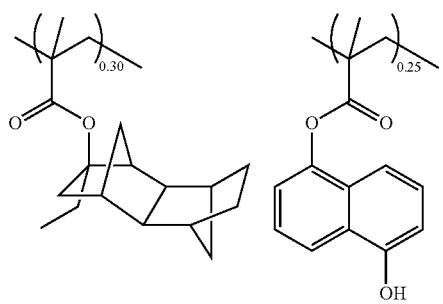
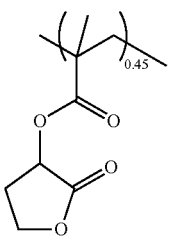

Resist Polymer 1
Mw = 8,310
Mw/Mn = 1.73

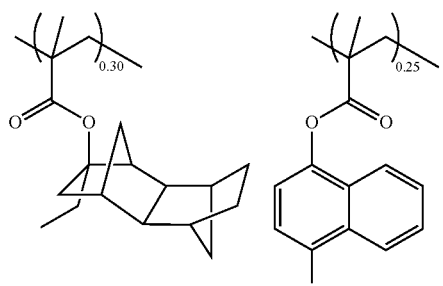
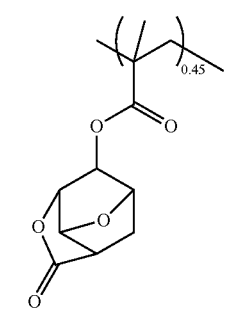

Resist Polymer 2
Mw = 8,500
Mw/Mn = 1.86

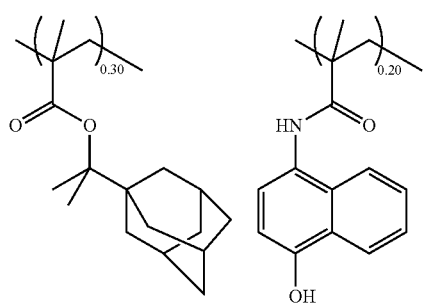

-continued
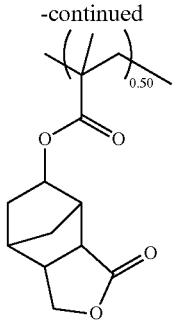
Resist Polymer 3
Mw = 8,500
Mw/Mn = 1.86
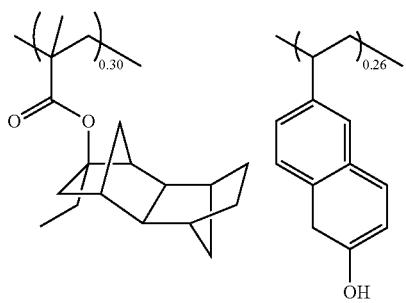
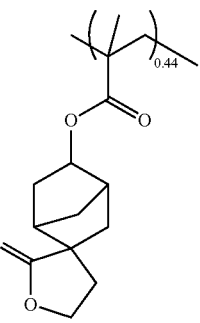
Resist Polymer 4
Mw = 8,300
Mw/Mn = 1.81
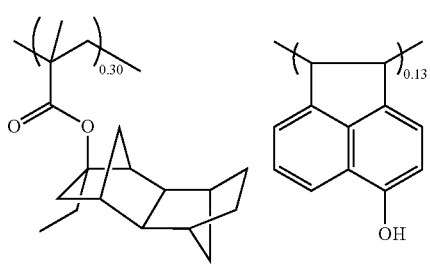
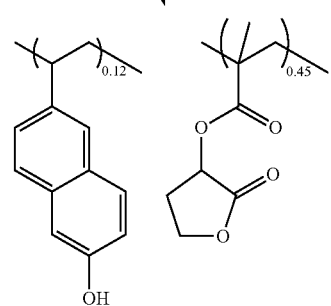
Resist Polymer 5
Mw = 6,500
Mw/Mn = 1.79
-continued
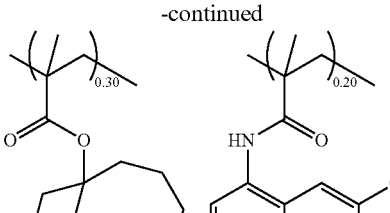
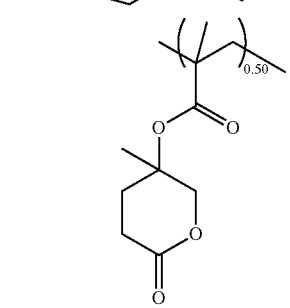
Resist Polymer 6
Mw = 8,700
Mw/Mn = 1.77
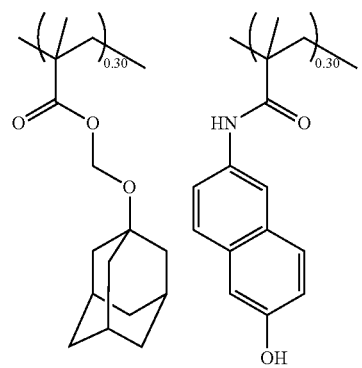
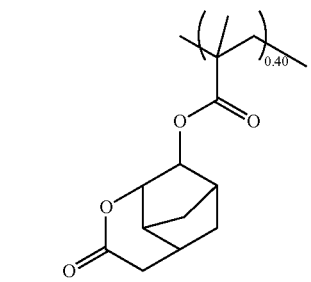
Resist Polymer 7
Mw = 8,400
Mw/Mn = 1.74
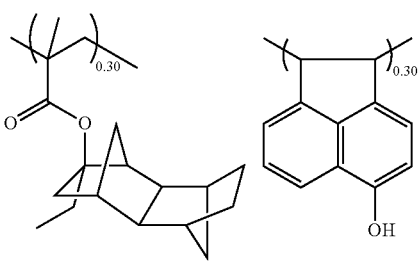

-continued
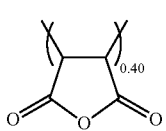
Resist Polymer 8
Mw = 5,300
Mw/Mn = 1.69
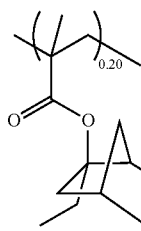 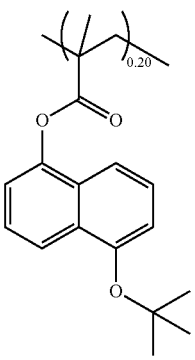
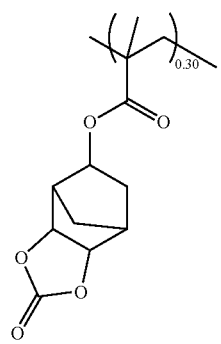 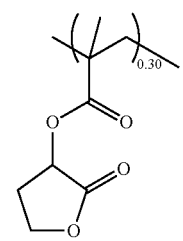
Resist Polymer 9
Mw = 8,900
Mw/Mn = 1.79
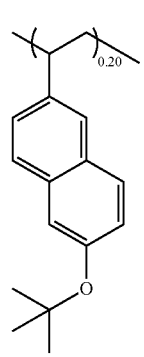 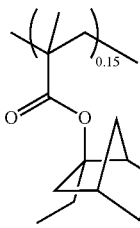 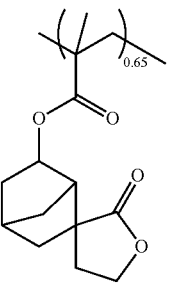
Resist Polymer 10
Mw = 8,100
Mw/Mn = 1.98
-continued
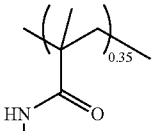 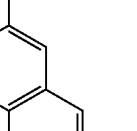 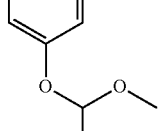
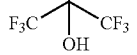
Resist Polymer 11
Mw = 8,400
Mw/Mn = 1.74
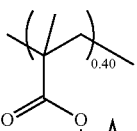 
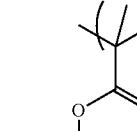 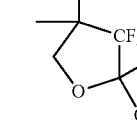
Resist Polymer 12
Mw = 8,400
Mw/Mn = 1.74
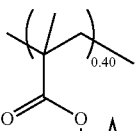  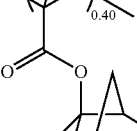 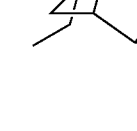 

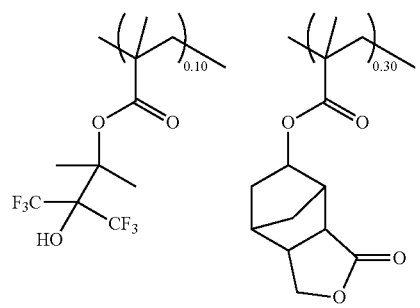
Resist Polymer 13
Mw = 8,300
Mw/Mn = 1.89
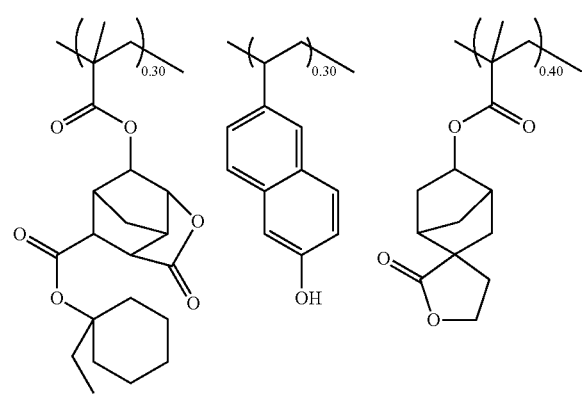
Resist Polymer 14
Mw = 8,900
Mw/Mn = 1.99
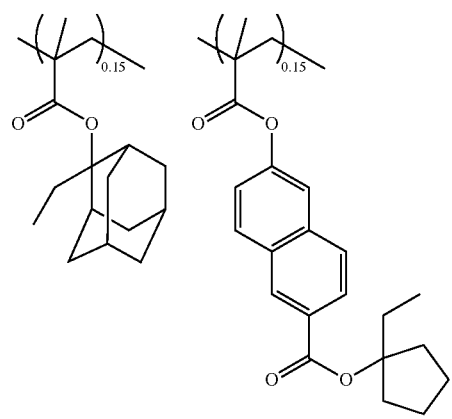
Resist Polymer 15
Mw = 8,900
Mw/Mn = 1.99
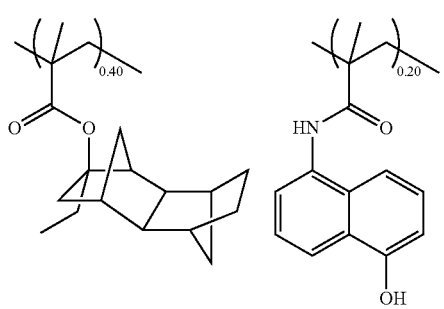
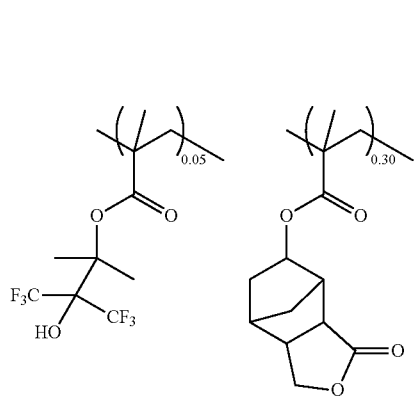
Resist Polymer 16
Mw = 8,900
Mw/Mn = 1.98
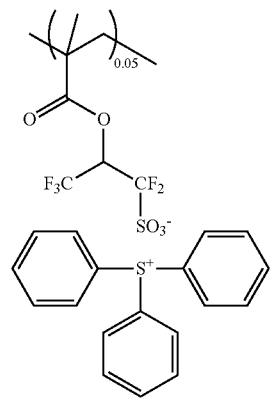
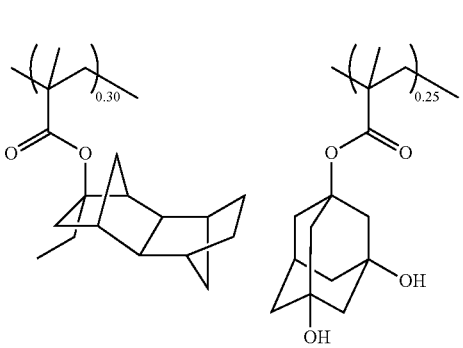

-continued

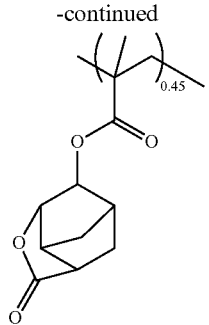

Comparative Resist Polymer 1
Mw = 8,600
Mw/Mn = 1.88

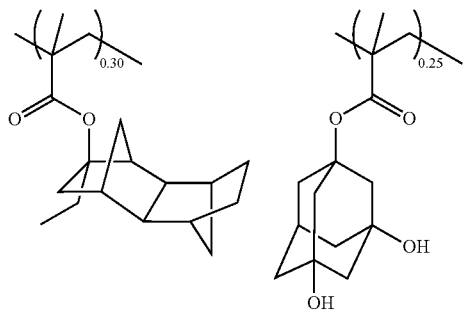

Comparative Resist Polymer 2
Mw = 8,900
Mw/Mn = 1.93

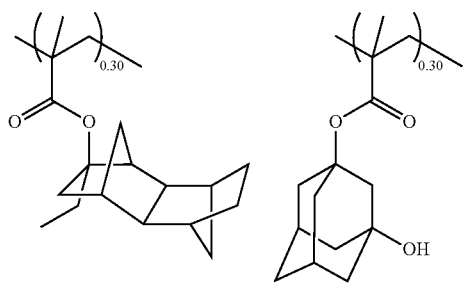

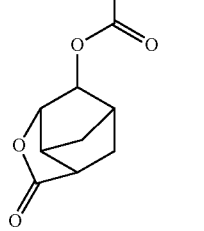

Comparative Resist Polymer 3
Mw = 8,200
Mw/Mn = 1.82

Preparation of Positive Resist Composition and Alkali-Soluble Protective Film-Forming Composition A resist solution was prepared by dissolving polymers (Resist Polymer) and components in solvents in accordance with the formulation of Table 2. A protective film-forming solution was prepared by dissolving polymers (TC Polymer) and components in solvents in accordance with the formulation of Table 3. The solutions were filtered through a Teflon® filter with a pore size of 0.2 μm. The components in Tables 2 and 3 are identified below.

Acid generator: PAG1 of the following structural formula

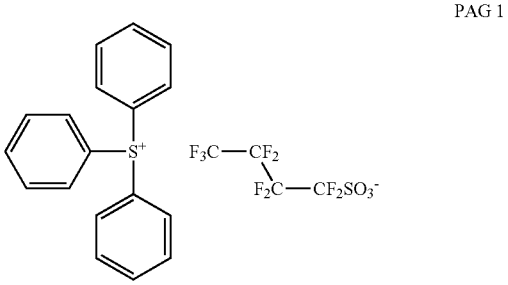

PAG 1

PAG 2

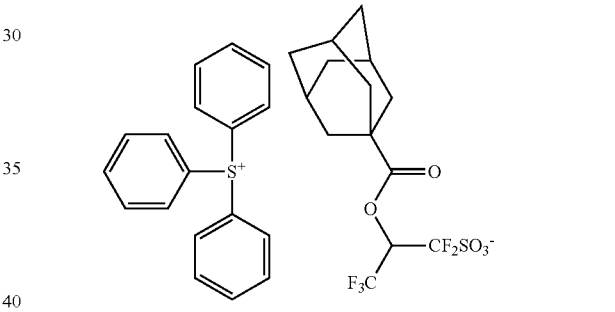

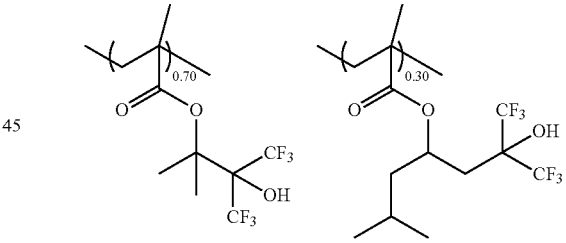

TC Polymer 1
Mw = 8,800
Mw/Mn = 1.69

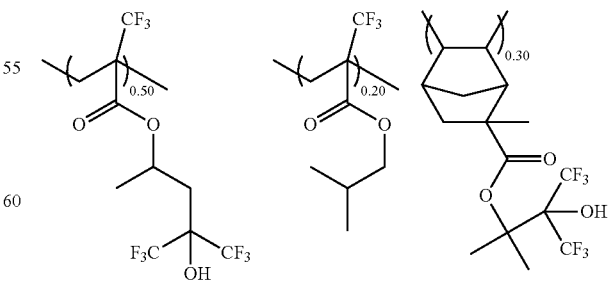

TC Polymer 2
Mw = 6,900
Mw/Mn = 1.58

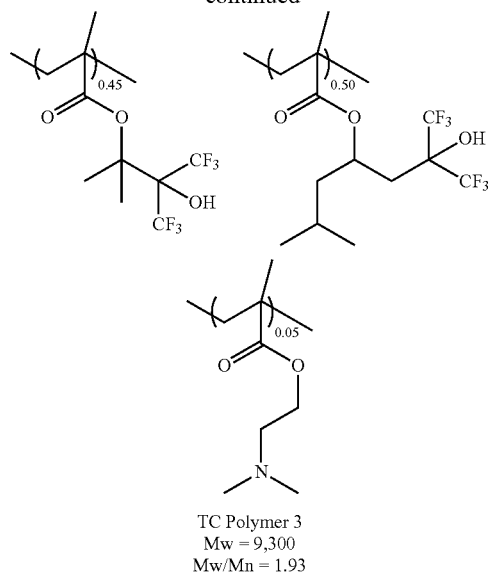
TC Polymer 3
Mw = 9,300
Mw/Mn = 1.93
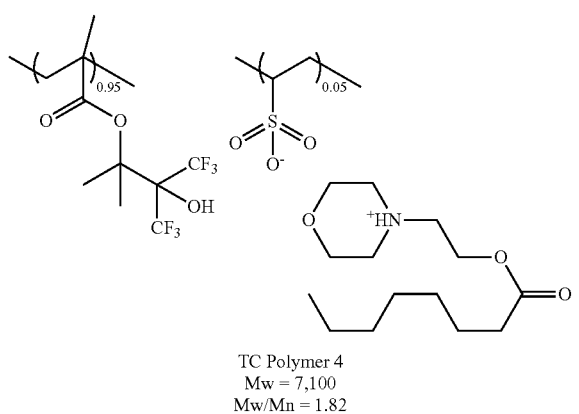
TC Polymer 4
Mw = 7,100
Mw/Mn = 1.82
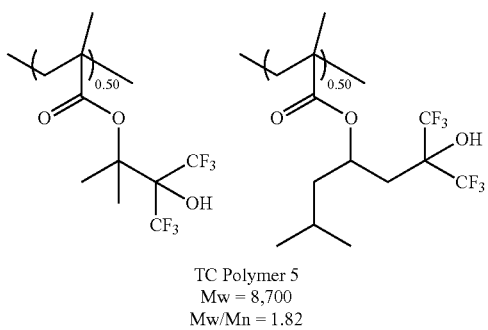
TC Polymer 5
Mw = 8,700
Mw/Mn = 1.82
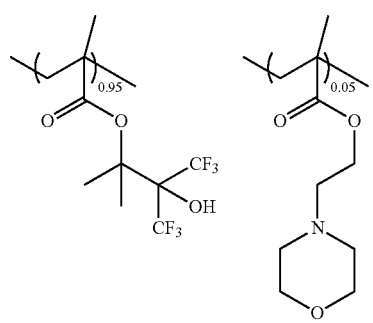
TC Polymer 6
Mw = 8,300
Mw/Mn = 1.92
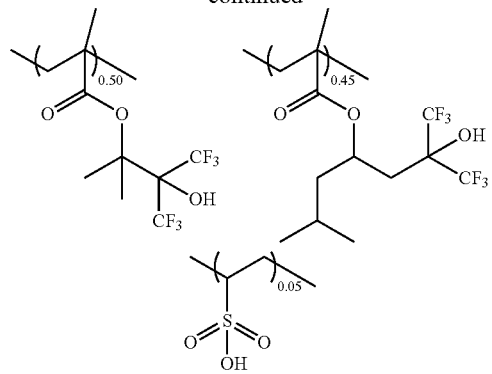
TC Polymer 7
Mw = 7,200
Mw/Mn = 1.82
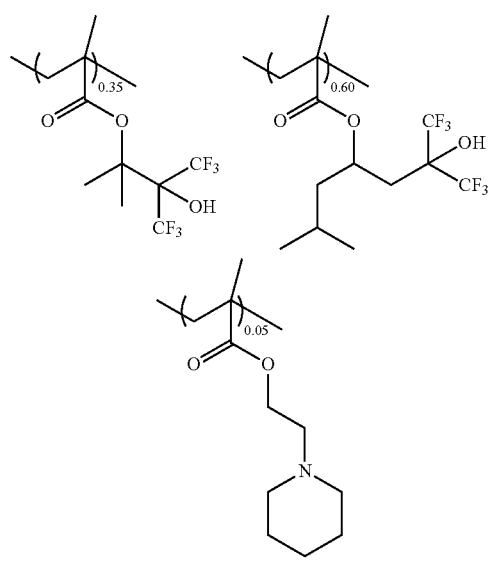
Water-repellent Polymer 1
Mw = 9,300
Mw/Mn = 1.98
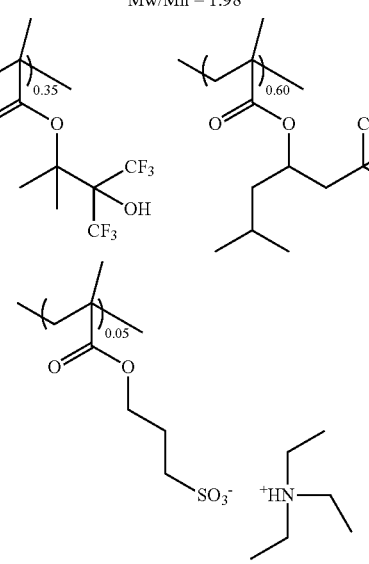
Water-repellent Polymer 2
Mw = 8,200
Mw/Mn = 1.95

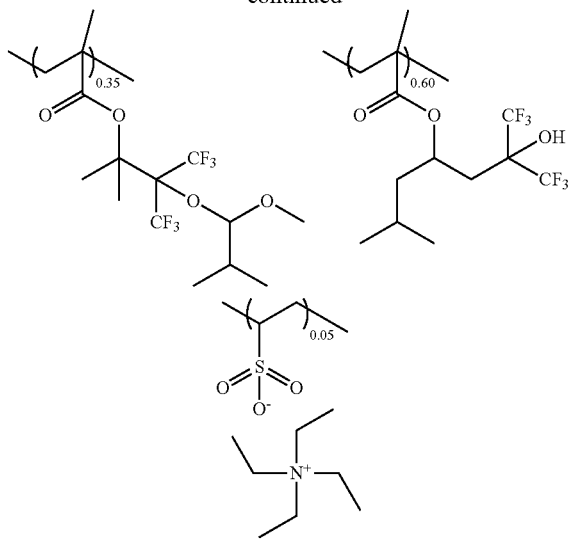

Water-repellent Polymer 3
Mw = 7,900
Mw/Mn = 1.82

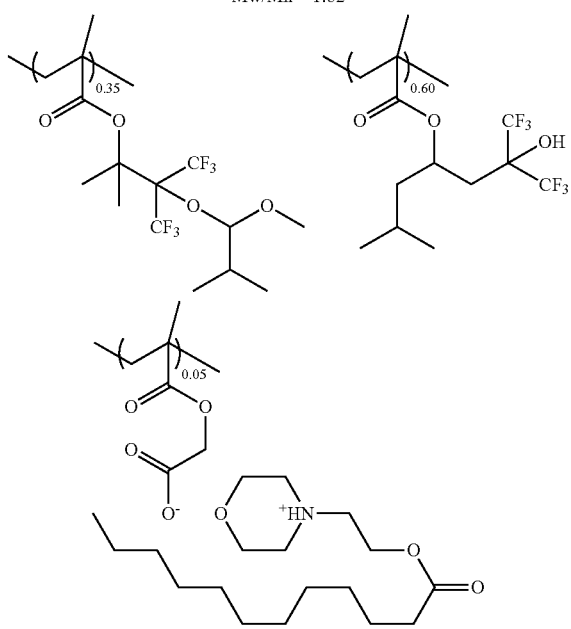

Water-repellent Polymer 4
Mw = 8,800
Mw/Mn = 1.92

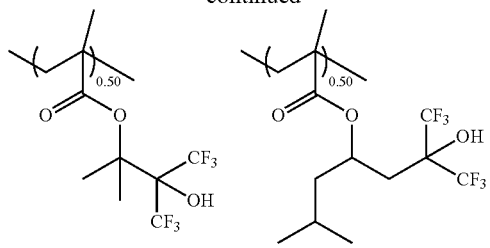

Water-repellent Polymer 5
Mw = 8,700
Mw/Mn = 1.82

Basic Compound: Quencher 1 of the following structural formula

Quencher 1

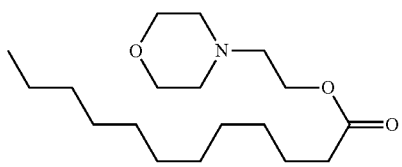

Organic solvent: PGMEA (propylene glycol monomethyl ether acetate)
CyH (cyclohexanone)

ArF Lithography Patterning Test 1

A resist solution was prepared by dissolving polymers (Resist Polymer) and components in solvents in accordance with the formulation of Table 1. On a substrate (silicon wafer) having an antireflective coating (Nissan Chemical Industry Co., Ltd.) of 80 nm thick, the resist composition was spin coated and baked on a hot plate at 100° C. for 60 seconds to form a resist film of 160 nm thick.

Using an ArF excimer laser scanner NSR-305B (Nikon Corp., NA 0.68, σ0.73), the resist film was open-frame exposed in a dose which varied stepwise by 0.2 mJ/cm². The exposed resist film was baked (PEB) at 110° C. for 60 seconds and puddle developed for 60 seconds with a developer (organic solvent) as shown in Table 1. The wafer was rinsed at 500 rpm with a rinse liquid (organic solvent) as shown in Table 1, spin dried at 2,000 rpm, and baked at 100° C. for 60 seconds to evaporate off the rinse liquid. Separately, the same process was repeated until the PEB, and followed by development with a 2.38 wt % TMAH aqueous solution. The film thickness after PEB, the film thickness after organic solvent development, and the film thickness after TMAH aqueous solution development were measured. A contrast curve was determined by plotting the film thickness versus the exposure dose. The results are shown in FIGS. 15 to 20.

TABLE 1

|  |  |  | Polymer (pbw) | Acid generator (pbw) | Basic compound (pbw) | Organic solvent (pbw) | Developer | Rinse liquid |
|---|---|---|---|---|---|---|---|---|
| Example | 1-1 | Resist 1-1 | Resist Polymer 1 (100) | PAG 1 (6.5) | Quencher 1 (1.50) | PGMEA(800) CyH(400) | butyl acetate | 4-methyl-2-pentanol |
|  | 1-2 | Resist 1-4 | Resist Polymer 4 (100) | PAG 1 (6.5) | Quencher 1 (1.50) | PGMEA(800) CyH(400) | butyl acetate | 1-hexanol |
|  | 1-3 | Resist 1-4 | Resist Polymer 4 (100) | PAG 1 (6.5) | Quencher 1 (1.50) | PGMEA(800) CyH(400) | 2-hexanone | xylene |
|  | 1-4 | Resist 1-4 | Resist Polymer 4 (100) | PAG 1 (6.5) | Quencher 1 (1.50) | PGMEA(800) CyH(400) | butyl formate | 2-methyl-1-butanol |

TABLE 1-continued

|  |  | Polymer (pbw) | Acid generator (pbw) | Basic compound (pbw) | Organic solvent (pbw) | Developer | Rinse liquid |
|---|---|---|---|---|---|---|---|
| Comparative Example | 1-1 Comparative Resist 1-1 | Comparative Resist Polymer 1 (100) | PAG 1 (6.5) | Quencher 1 (1.50) | PGMEA(800) CyH(400) | butyl acetate | 4-methyl-2-pentanol |
|  | 1-2 Comparative Resist 1-2 | Comparative Resist Polymer 2 (100) | PAG 1 (6.5) | Quencher 1 (1.50) | PGMEA(800) CyH(400) | butyl acetate | 4-methyl-2-pentanol |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A941 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition shown in Table 3 was spin coated on the resist film and baked at 90° C. for 60 seconds to form a protective film (or topcoat) of 50 nm thick. In Examples 2-23 to 2-26 and Comparative Example 2-6, the protective film was omitted.

Figure 21:
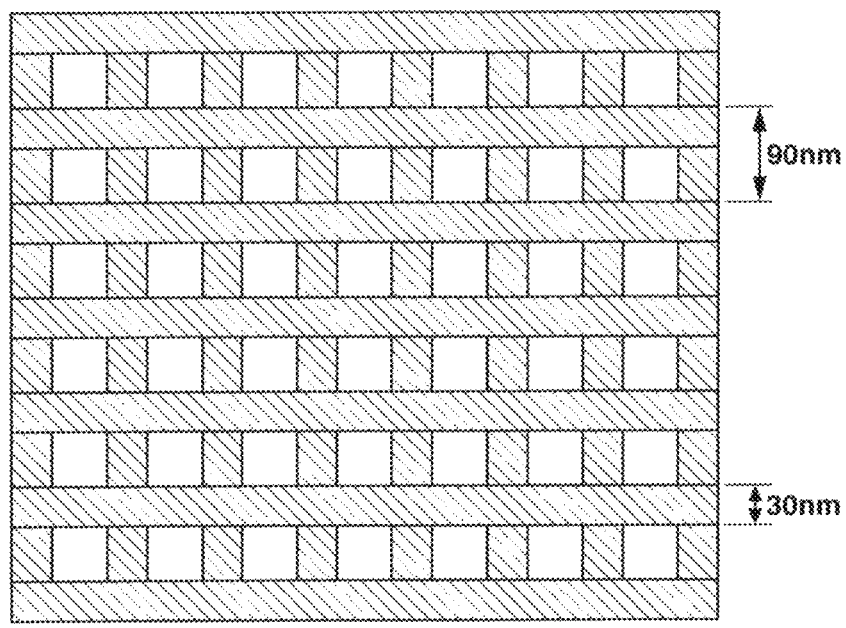
FIG. 21 illustrates a lattice-like mask used in ArF lithography patterning tests 2 and 3.

Using an ArF excimer laser immersion lithography scanner NSR-610C (Nikon Corp., NA 1.30, σ0.98/0.78, cross-pole opening 20 deg., azimuthally polarized illumination), exposure was performed in a varying dose through a 6% halftone phase shift mask having a lattice-like pattern with a pitch of 90 nm and a line width of 30 nm (on-wafer size) whose layout is shown in FIG. 21. After the exposure, the wafer was baked (PEB) at the temperature shown in Table 4 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 4.

TABLE 2

|  | Polymer (pbw) | Acid generator (pbw) | Basic compound (pbw) | Additive (pbw) | Organic solvent (pbw) |
|---|---|---|---|---|---|
| Resist 2-1 | Resist Polymer 1 (100) | PAG 2 (12.5) | Quencher 1 (1.50) | — | PGMEA (2,000) CyH (500) |
| Resist 2-2 | Resist Polymer 2 (100) | PAG 2 (12.5) | Quencher 1 (1.50) | — | PGMEA (2,000) CyH (500) |
| Resist 2-3 | Resist Polymer 3 (100) | PAG 2 (12.5) | Quencher 1 (1.50) | — | PGMEA (2,000) CyH (500) |
| Resist 2-4 | Resist Polymer 4 (100) | PAG 2 (12.5) | Quencher 1 (1.50) | — | PGMEA (2,000) CyH (500) |
| Resist 2-5 | Resist Polymer 5 (100) | PAG 2 (12.5) | Quencher 1 (1.50) | — | PGMEA (2,000) CyH (500) |
| Resist 2-6 | Resist Polymer 6 (100) | PAG 2 (12.5) | Quencher 1 (1.50) | — | PGMEA (2,000) CyH (500) |
| Resist 2-7 | Resist Polymer 7 (100) | PAG 2 (12.5) | Quencher 1 (1.50) | — | PGMEA (2,000) CyH (500) |
| Resist 2-8 | Resist Polymer 8 (100) | PAG 2 (12.5) | Quencher 1 (1.50) | — | PGMEA (2,000) CyH (500) |
| Resist 2-9 | Resist Polymer 9 (100) | PAG 2 (12.5) | Quencher 1 (1.50) | — | PGMEA (2,000) CyH (500) |
| Resist 2-10 | Resist Polymer 10 (100) | PAG 2 (12.5) | Quencher 1 (1.50) | — | PGMEA (2,000) CyH (500) |
| Resist 2-11 | Resist Polymer 11 (100) | PAG 2 (12.5) | Quencher 1 (1.50) | — | PGMEA (2,000) CyH (500) |
| Resist 2-12 | Resist Polymer 12 (100) | PAG 2 (12.5) | Quencher 1 (1.50) | — | PGMEA (2,000) CyH (500) |
| Resist 2-13 | Resist Polymer 13 (100) | PAG 2 (12.5) | Quencher 1 (1.50) | — | PGMEA (2,000) CyH (500) |
| Resist 2-14 | Resist Polymer 14 (100) | PAG 2 (12.5) | Quencher 1 (1.50) | — | PGMEA (2,000) CyH (500) |
| Resist 2-15 | Resist Polymer 15 (100) | PAG 2 (12.5) | Quencher 1 (1.50) | — | PGMEA (2,000) CyH (500) |
| Resist 2-16 | Resist Polymer 16 (100) | — | Quencher 1 (1.50) | — | PGMEA (2,000) CyH (500) |
| Resist 2-17 | Resist Polymer 1 (50) Resist Polymer 3 (50) | PAG 2 (12.5) | Quencher 1 (1.50) | — | PGMEA (2,000) CyH (500) |
| Resist 2-18 | Resist Polymer 16 (100) | — | Quencher 1 (1.50) | Water-repellent Polymer 1 (5.0) | PGMEA (2,000) CyH (500) |

TABLE 2-continued

| | Polymer (pbw) | Acid generator (pbw) | Basic compound (pbw) | Additive (pbw) | Organic solvent (pbw) |
|---|---|---|---|---|---|
| Resist 2-19 | Resist Polymer 16 (100) | — | Quencher 1 (1.50) | Water-repellent Polymer 2 (5.0) | PGMEA (2,000) CyH (500) |
| Resist 2-20 | Resist Polymer 16 (100) | — | Quencher 1 (1.50) | Water-repellent Polymer 3 (5.0) | PGMEA (2,000) CyH (500) |
| Resist 2-21 | Resist Polymer 16 (100) | — | Quencher 1 (1.50) | Water-repellent Polymer 4 (5.0) | PGMEA (2,000) CyH (500) |
| Comparative Resist 1-1 | Comparative Resist Polymer 1 (100) | PAG 2 (12.5) | Quencher 1 (1.50) | — | PGMEA (2,000) CyH (500) |
| Comparative Resist 1-2 | Comparative Resist Polymer 2 (100) | PAG 2 (12.5) | Quencher 1 (1.50) | — | PGMEA (2,000) CyH (500) |
| Comparative Resist 1-3 | Comparative Resist Polymer 3 (100) | PAG 2 (12.5) | Quencher 1 (1.50) | — | PGMEA (2,000) CyH (500) |
| Comparative Resist 1-4 | Comparative Resist Polymer 3 (100) | PAG 2 (12.5) | Quencher 1 (1.50) | Water-repellent Polymer 5 (5.0) | PGMEA (2,000) CyH (500) |

TABLE 3

| Protective film | Polymer (pbw) | Additive (pbw) | Organic solvent (pbw) |
|---|---|---|---|
| TC-1 | TC Polymer 1 (100) | tri-n-octylamine (0.5) | diisoamyl ether (2,700) 2-methyl-1-butanol (270) |
| TC-2 | TC Polymer 2 (100) | tri-n-octylamine (0.5) | diisoamyl ether (2,700) 2-methyl-1-butanol (270) |
| TC-3 | TC Polymer 3 (100) | — | diisoamyl ether (2,700) 2-methyl-1-butanol (270) |
| TC-4 | TC Polymer 2 (80) TC Polymer 4 (20) | — | diisoamyl ether (2,700) 2-methyl-1-butanol (270) |
| TC-5 | TC Polymer 5 (80) TC Polymer 4 (20) | — | diisoamyl ether (2,700) 2-methyl-1-butanol (270) |
| TC-6 | TC Polymer 5 (80) TC Polymer 6 (20) | — | diisoamyl ether (2,700) 2-methyl-1-butanol (270) |
| Comparative TC-1 | TC Polymer 1 (100) | — | diisoamyl ether (2,700) 2-methyl-1-butanol (270) |
| Comparative TC-2 | TC Polymer 7 (100) | — | diisoamyl ether (2,700) 2-methyl-1-butanol (270) |

TABLE 4

| | | Resist | Protective film | PEB temp. (° C.) | Dose (mJ/cm$^2$) | Hole size variation 3σ (nm) |
|---|---|---|---|---|---|---|
| Example | 2-1 | Resist 2-1 | TC-1 | 90 | 45 | 2.5 |
| | 2-2 | Resist 2-2 | TC-1 | 95 | 50 | 2.3 |
| | 2-3 | Resist 2-3 | TC-1 | 100 | 52 | 2.2 |
| | 2-4 | Resist 2-4 | TC-1 | 100 | 50 | 2.1 |
| | 2-5 | Resist 2-5 | TC-1 | 110 | 55 | 2.5 |
| | 2-6 | Resist 2-6 | TC-1 | 90 | 42 | 2.8 |
| | 2-7 | Resist 2-7 | TC-1 | 105 | 58 | 2.6 |
| | 2-8 | Resist 2-8 | TC-1 | 115 | 55 | 3.1 |
| | 2-9 | Resist 2-9 | TC-1 | 105 | 44 | 2.8 |
| | 2-10 | Resist 2-10 | TC-1 | 100 | 40 | 2.8 |
| | 2-11 | Resist 2-11 | TC-1 | 105 | 46 | 2.8 |
| | 2-12 | Resist 2-12 | TC-1 | 105 | 42 | 2.7 |
| | 2-13 | Resist 2-13 | TC-1 | 100 | 40 | 2.6 |
| | 2-14 | Resist 2-14 | TC-1 | 95 | 42 | 2.8 |
| | 2-15 | Resist 2-15 | TC-1 | 95 | 42 | 2.6 |
| | 2-16 | Resist 2-16 | TC-1 | 100 | 55 | 2.0 |
| | 2-17 | Resist 2-17 | TC-1 | 95 | 48 | 2.4 |
| | 2-18 | Resist 2-4 | TC-2 | 100 | 50 | 2.1 |
| | 2-19 | Resist 2-4 | TC-3 | 100 | 50 | 2.1 |
| | 2-20 | Resist 2-4 | TC-4 | 100 | 50 | 2.2 |
| | 2-21 | Resist 2-4 | TC-5 | 100 | 50 | 2.3 |
| | 2-22 | Resist 2-4 | TC-6 | 100 | 50 | 2.0 |
| | 2-23 | Resist 2-18 | — | 100 | 50 | 2.5 |
| | 2-24 | Resist 2-19 | — | 100 | 50 | 2.4 |
| | 2-25 | Resist 2-20 | — | 100 | 50 | 2.5 |
| | 2-26 | Resist 2-21 | — | 100 | 51 | 2.6 |
| Comparative Example | 2-1 | Comparative Resist 1-1 | TC-1 | 110 | 80 | 5.8 |
| | 2-2 | Comparative Resist 1-2 | TC-1 | 105 | 75 | 5.2 |
| | 2-3 | Comparative Resist 1-3 | TC-1 | 110 | 92 | 3.8 |
| | 2-4 | Resist 2-4 | Comparative TC-1 | 100 | 50 | 3.2 |
| | 2-5 | Resist 2-4 | Comparative TC-2 | 100 | no holes opened | — |
| | 2-6 | Comparative Resist 1-4 | — | 110 | 90 | 5.1 |

ArF Lithography Patterning Test 3

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A941 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ0.98/0.78, dipole opening 20 deg., azimuthally polarized illumination), exposure was performed through a 6% halftone phase shift mask having a lattice-like pattern with a pitch of 90 nm and a line width of 30 nm (on-wafer size) whose layout is shown in FIG. 21 while the dose was varied. The same area was subjected to two continuous exposures by X and Y dipole illuminations. After the exposure, the wafer was baked (PEB) at the temperature shown in Table 5 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 5.

TABLE 5

| Resist | | PEB temp. (° C.) | Dose (mJ/cm$^2$) | Hole size variation 3σ (nm) |
|---|---|---|---|---|
| Example 3-1 | Resist 2-1 | 90 | 15 | 1.8 |
| Example 3-2 | Resist 2-2 | 95 | 18 | 1.9 |
| Comparative Example 3-1 | Comparative Resist 1-1 | 110 | 22 | 3.1 |
| Comparative Example 3-2 | Comparative Resist 1-2 | 105 | 20 | 3.2 |
| Comparative Example 3-3 | Comparative Resist 1-3 | 110 | 25 | 2.8 |

ArF Lithography Patterning Test 4

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Figure 22:
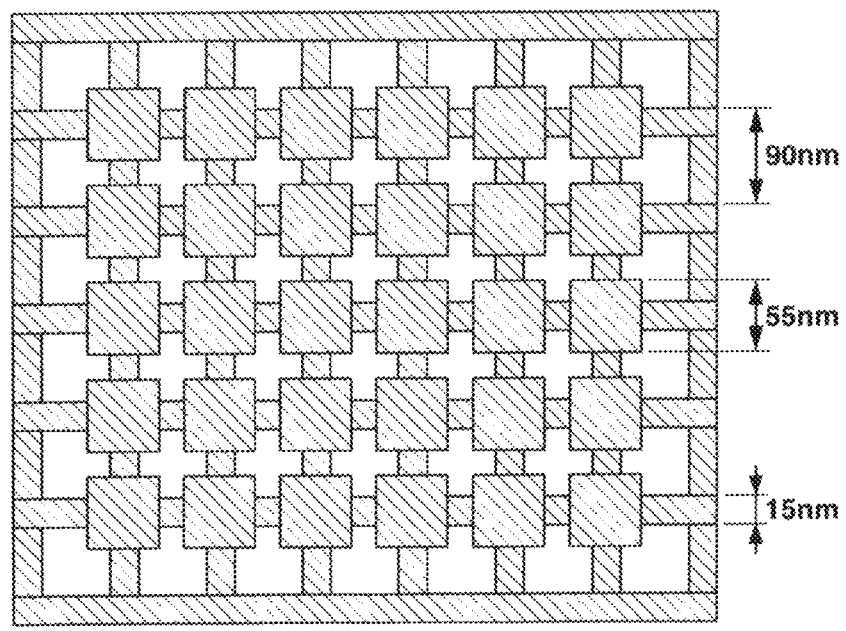
FIG. 22 illustrates a lattice-like mask with dots disposed at intersections, used in ArF lithography patterning tests 4 and 5.

Using an ArF excimer laser immersion lithography scanner NSR-610C (Nikon Corp., NA 1.30, σ0.98/0.78, cross-pole opening 20 deg., azimuthally polarized illumination), exposure was performed through a 6% halftone phase shift mask bearing a lattice-like pattern with a pitch of 90 nm and a line width of 15 nm (on-wafer size) having dots disposed at intersections, whose layout is shown in FIG. 22, while the dose and focus were varied. After the exposure, the wafer was baked (PEB) at the temperature shown in Table 6 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 6.

TABLE 6

| | Resist | PEB temp. (° C.) | Dose (mJ/cm$^2$) | DOF (nm) | Hole size variation 3σ (nm) |
|---|---|---|---|---|---|
| Example 4-1 | Resist 2-1 | 90 | 62 | 120 | 2.0 |
| Example 4-2 | Resist 2-2 | 95 | 68 | 130 | 2.1 |
| Comparative Example 4-1 | Comparative Resist 1-1 | 110 | 115 | 40 | 4.6 |
| Comparative Example 4-2 | Comparative Resist 1-2 | 105 | 105 | 30 | 5.0 |
| Comparative Example 4-3 | Comparative Resist 1-3 | 110 | 120 | 90 | 3.7 |

ArF Lithography Patterning Test 5

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ0.98/0.78, dipole opening 20 deg., azimuthally polarized illumination), exposure was performed through a 6% halftone phase shift mask bearing a lattice-like pattern with a pitch of 90 nm and a line width of 15 nm (on-wafer size) having dots disposed at intersections, whose layout is shown in FIG. 22, while the dose was varied. The same area was subjected to two continuous exposures by X and Y dipole illuminations. After the exposure, the wafer was baked (PEB) at the temperature shown in Table 7 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 7.

TABLE 7

| | Resist | PEB temp. (° C.) | Dose (mJ/cm$^2$) | DOF (nm) | Hole size variation 3σ (nm) |
|---|---|---|---|---|---|
| Example 5-1 | Resist 2-1 | 90 | 22 | 110 | 2.2 |
| Example 5-2 | Resist 2-2 | 95 | 24 | 100 | 2.1 |
| Comparative Example 5-1 | Comparative Resist 1-1 | 110 | 33 | 30 | 3.6 |

TABLE 7-continued

| Resist | | PEB temp. (° C.) | Dose (mJ/cm$^2$) | DOF (nm) | Hole size variation 3σ (nm) |
|---|---|---|---|---|---|
| Comparative Example 5-2 | Comparative Resist 1-2 | 105 | 35 | 20 | 3.0 |
| Comparative Example 5-3 | Comparative Resist 1-3 | 110 | 38 | 80 | 2.9 |

ArF Lithography Patterning Test 6

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ0.98/0.78, cross-pole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. After the exposure, the wafer was baked (PEB) at the temperature shown in Table 8 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 8.

TABLE 8

| | Resist | PEB temp. (° C.) | Dose (mJ/cm$^2$) | DOF (nm) | Hole size variation 3σ (nm) |
|---|---|---|---|---|---|
| Example 6-1 | Resist 2-1 | 90 | 23 | 100 | 3.2 |
| Example 6-2 | Resist 2-2 | 95 | 26 | 95 | 3.1 |
| Comparative Example 6-1 | Comparative Resist 1-1 | 110 | 38 | 15 | 5.6 |
| Comparative Example 6-2 | Comparative Resist 1-2 | 105 | 39 | 10 | 5.0 |
| Comparative Example 6-3 | Comparative Resist 1-3 | 110 | 40 | 60 | 4.9 |

ArF Lithography Patterning Test 7

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 9 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 9.

TABLE 9

| | Resist | PEB temp. (° C.) | Dose (mJ/cm$^2$) | DOF (nm) | Hole size variation 3σ (nm) |
|---|---|---|---|---|---|
| Example 7-1 | Resist 2-1 | 90 | 22 | 105 | 2.0 |
| Example 7-2 | Resist 2-2 | 95 | 24 | 100 | 2.0 |
| Comparative Example 7-1 | Comparative Resist 1-1 | 110 | 33 | 20 | 3.4 |
| Comparative Example 7-2 | Comparative Resist 1-2 | 105 | 35 | 15 | 2.9 |
| Comparative Example 7-3 | Comparative Resist 1-3 | 110 | 38 | 70 | 2.8 |

ArF Lithography Patterning Test 8

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 10 for 60 seconds and developed. Specifically, the solvent shown in Table 10 was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation $3\sigma$ was determined. The results are shown in Table 10.

TABLE 10

| | Resist | PEB temp. (° C.) | Dose (mJ/cm$^2$) | Developer | DOF (nm) | Hole size variation $3\sigma$ (nm) |
|---|---|---|---|---|---|---|
| Example 8-1 | Resist 2-1 | 90 | 22 | 2-heptanone | 105 | 2.0 |
| Example 8-2 | Resist 2-1 | 95 | 23 | methyl benzoate | 110 | 1.9 |
| Example 8-3 | Resist 2-1 | 95 | 21 | ethyl benzoate | 105 | 2.2 |
| Example 8-4 | Resist 2-1 | 95 | 22 | phenyl acetate | 100 | 2.1 |
| Example 8-5 | Resist 2-1 | 95 | 23 | benzyl acetate | 100 | 2.3 |
| Example 8-6 | Resist 2-1 | 95 | 23 | methyl phenylacetate | 100 | 2.2 |
| Example 8-7 | Resist 2-1 | 95 | 23 | methyl benzoate:butyl acetate = 6:4 | 100 | 2.3 |
| Example 8-8 | Resist 2-1 | 95 | 23 | methyl benzoate:2-heptanone = 5:5 | 100 | 2.1 |

ArF Lithography Patterning Test 9

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective film-forming composition TC-1 shown in Table 3 was spin coated on the resist film and baked at 90° C. for 60 seconds to form a protective film (or topcoat) of 50 nm thick.

Figure 23:
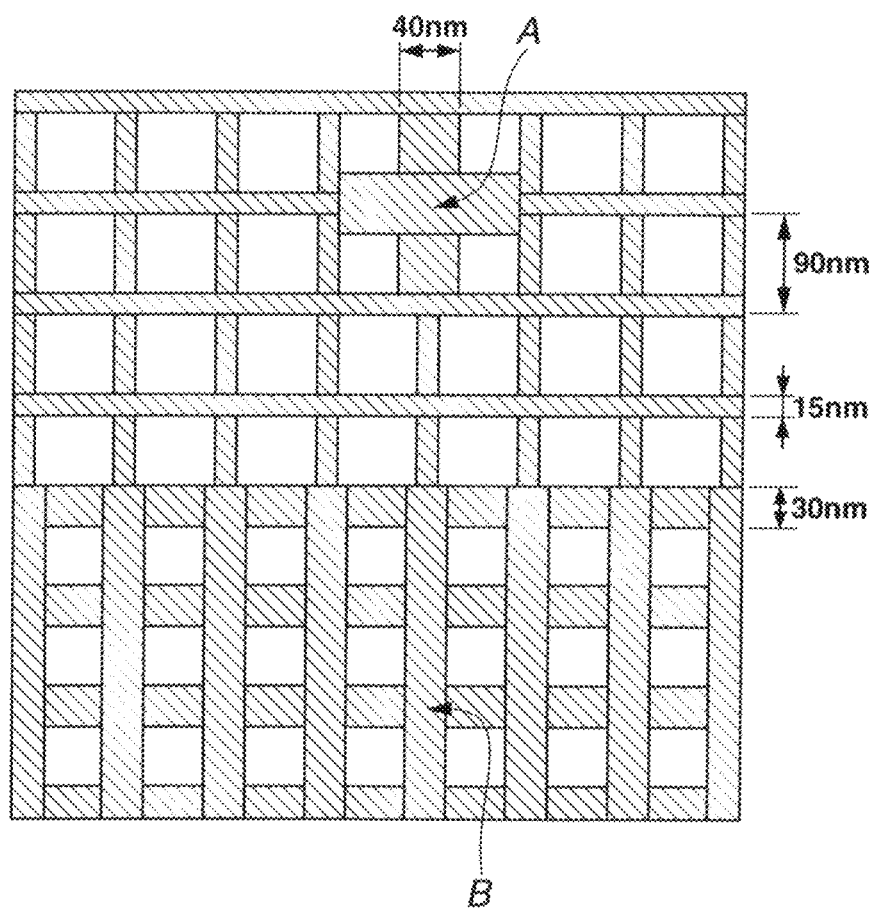
FIG. 23 illustrates a lattice-like mask with a thick dot disposed at an intersection, used in ArF lithography patterning test 9.

Using an ArF excimer laser immersion lithography scanner NSR-610C (Nikon Corp., NA 1.30, $\sigma$0.98/0.78, cross-pole opening 20 deg., azimuthally polarized illumination), exposure was performed through a 6% halftone phase shift mask bearing a lattice-like pattern with a pitch of 90 nm and a line width of 15 nm (on-wafer size) having thick gratings disposed at intersections whose layout is shown in FIG. 23, while the dose was varied. After the exposure, the wafer was baked (PEB) at the temperature shown in Table 11 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes at positions A and B on the mask (FIG. 23) was measured. The results are shown in Table 11.

TABLE 11

| | Resist | PEB temp. (° C.) | Dose (mJ/cm$^2$) | Hole size at A (nm) | Hole size at B (nm) |
|---|---|---|---|---|---|
| Example 9-1 | Resist 2-1 | 90 | 60 | 40 | 42 |
| Example 9-2 | Resist 2-2 | 95 | 66 | 38 | 40 |
| Comparative Example 9-1 | Comparative Resist 1-1 | 110 | 85 | 23 | 51 |
| Comparative Example 9-2 | Comparative Resist 1-2 | 105 | 80 | 21 | 50 |
| Comparative Example 9-3 | Comparative Resist 1-3 | 110 | 90 | 30 | 46 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2010-009869 and 2010-227196 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition comprising a polymer comprising recurring units having an acid labile group-substituted naphthol group or an acid labile group-unsubstituted naphthol group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved.

2. The process of claim 1 wherein said polymer comprises recurring units (a-1) and (a-2) and recurring units (b) represented by the general formula (I):

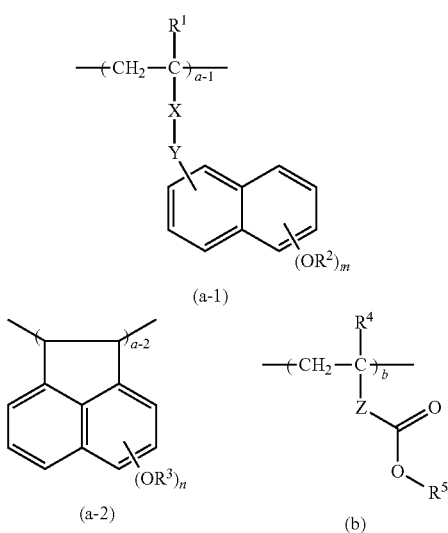

wherein R¹ and R⁴ are each independently hydrogen or methyl, X is a single bond, ether group, —C(=O)—O—, or —C(=O)—NH—, Y is a single bond, or a straight or branched $C_1$-$C_6$ alkylene group or $C_6$-$C_{10}$ arylene group, which may contain an ester or ether radical, m and n each are 1 or 2, R² and R³ are hydrogen or an acid labile group, R⁵ is an acid labile group, Z is a single bond or —C(=O)—O—R⁶—, R⁶ is a straight, branched or cyclic $C_1$-$C_{10}$ alkylene group which may contain an ether, ester, lactone or hydroxyl radical, or a naphthylene group, the subscripts a-1, a-2, and b are numbers in the range: $0 \leq a\text{-}1 < 1.0$, $0 \leq a\text{-}2 < 1.0$, $0 \leq b < 1.0$, $0 < (a\text{-}1)+(a\text{-}2) < 1.0$, and $0 < (a\text{-}1)+(a\text{-}2)+b \leq 1.0$.

3. The process of claim 2 wherein R² is an acid labile group, and the subscript a-1 is a number in the range: $0 < a\text{-}1 < 1.0$.

4. The process of claim 1 wherein the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

5. The process of claim 1 wherein the step of exposing the resist film to high-energy radiation includes ArF immersion lithography of 193 nm wavelength, EUV lithography of 13.5 nm wavelength, or EB lithography.

6. The process of claim 5 wherein the ArF immersion lithography of 193 nm wavelength uses a halftone phase shift mask having a dot shifter pattern, whereby a pattern of holes is formed at the dots after development.

7. The process of claim 6 wherein the halftone phase shift mask having a dot pattern or lattice-like pattern has a transmittance of 3 to 15%.

8. The process of claim 5 wherein the ArF immersion lithography of 193 nm wavelength uses a halftone phase shift mask having a lattice-like shifter pattern, whereby a pattern of holes is formed at the intersections between gratings of the lattice-like shifter pattern after development.

9. The process of claim 8 wherein the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

10. The process of claim 8 wherein the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

11. The pattern forming process of claim 1, comprising the steps of applying a resist composition comprising a polymer comprising recurring units having an acid labile group-substituted naphthol group or an acid labile group-unsubstituted naphthol group, an acid generator, and an organic solvent onto a substrate, heat treating the composition to form a resist film, forming a protective film on the resist film, exposing the resist film to high-energy radiation to define exposed and unexposed regions, heat treating, and applying a developer to the coated substrate to form a negative pattern wherein the unexposed region of resist film and the protective film are dissolved and the exposed region of resist film is not dissolved.

12. The process of claim 11 wherein the protective film is formed of a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

13. The process of claim 1 wherein the polymer comprises recurring units having an acid labile group-substituted naphthol group.

14. A pattern forming process comprising the steps of applying a resist composition comprising a polymer comprising recurring units having an acid labile group-substituted naphthol group or an acid labile group-unsubstituted naphthol group and recurring units having an acid labile group-substituted carboxyl group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved.

15. The process of claim 14 wherein the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

16. A pattern forming process comprising the steps of applying a resist composition comprising a polymer comprising recurring units having an acid labile group-substituted naphthol group or an acid labile group unsubstituted naphthol group, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved;

wherein the polymer further comprises recurring units selected from the group consisting of sulfonium salts (d1) to (d3) represented by the following formulae:

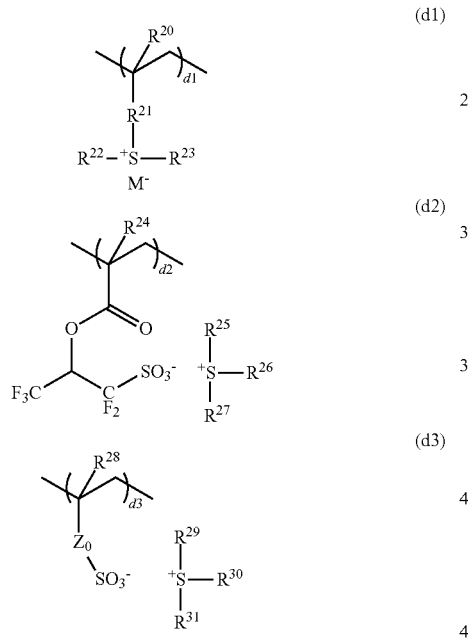

wherein $R^{20}$, $R^{24}$, and $R^{28}$ each are hydrogen or methyl, $R^{21}$ is a single bond, phyenylene, —O—$R^{33}$—, or —C(=O)—Y—$R^{33}$—, Y is oxygen or NH, $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_o$ is a single bond, methylene, ethylene, phenylene, fluorophenylene, —O—$R^{32}$—, or —C(=O)—$Z_1$—$R^{32}$, $Z_1$ is oxygen or NH, $R^{32}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range of $0 \leq d1 \leq 0.3$, $0 \leq d2 \leq 0.3$, $0 \leq d3 \leq 0.3$, and $0 \leq d1+d2+d3 \leq 0.3$, wherein the resist composition does not comprise an acid generator.

17. A pattern forming process comprising the steps of applying a resist composition comprising a polymer comprising recurring units having an acid labile group-substituted naphthol group or an acid labile group unsubstituted naphthol group and recurring units having an acid labile group-substituted carboxyl group, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved;

wherein the polymer further comprises recurring units selected from the group consisting of sulfonium salts (d1) to (d3) represented by the following formulae:

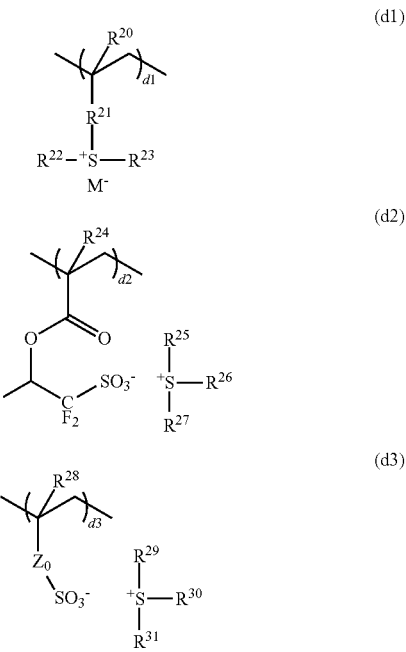

wherein $R^{20}$, $R^{24}$, and $R^{28}$ each are hydrogen or methyl, $R^{21}$ is a single bond, phyenylene, —O—$R^{33}$—, or —C(=O)—Y—$R^{33}$—, Y is oxygen or NH, $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_o$ is a single bond, methylene, ethylene, phenylene, fluorophenylene, —O—$R^{32}$—, or —C(=O)—$Z_1$—$R^{32}$, $Z_1$ is oxygen or NH, $R^{32}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range of $0 \leq d1 \leq 0.3$, $0 \leq d2 \leq 0.3$, $0 \leq d3 \leq 0.3$, and $0 \leq d1+d2+d3 \leq 0.3$, wherein the resist composition does not comprise an acid generator.

18. A pattern forming process comprising the steps of applying a resist composition comprising a polymer comprising recurring units (a-1) and (a-2) and recurring units (b) represented by the general formula (I):

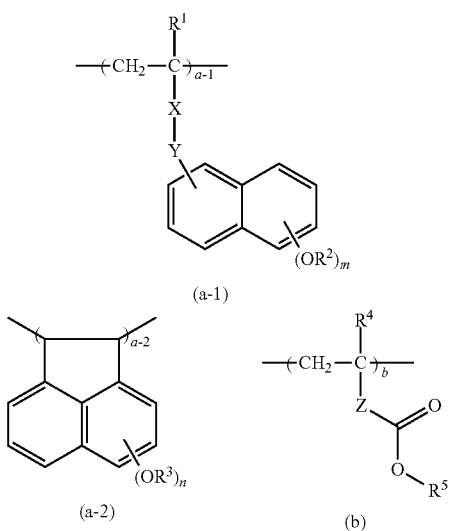

(1)

(a-1)

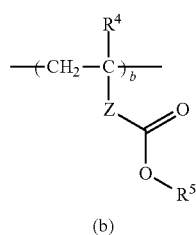

(a-2)

(b)

wherein $R^1$ and $R^4$ are each independently hydrogen or methyl, X is a single bond, ether group, —C(=O)—O—, or —C(=O)—NH—, Y is a single bond, or a straight or branched $C_1$-$C_6$ alkylene group or $C_6$-$C_{10}$ arylene group, which may contain an ester or ether radical, m and n each are 1 or 2, $R^2$ and $R^3$ are hydrogen or an acid labile group, $R^5$ is an acid labile group, Z is a single bond or —C(=O)—O—$R^6$, $R^6$ is a straight, branched or cyclic $C_1$-$C_{10}$ alkylene group which may contain an ether, ester, lactone or hydroxyl radical, or a naphthylene group, the subscripts a-1, a-2, and b are numbers in the range: $0 \leq a\text{-}1 < 1.0$, $0 \leq a\text{-}2 < 1.0$, $0 \leq b < 1.0$, $0 < (a\text{-}1)+(a\text{-}2) < 1.0$, and $0 < (a\text{-}1)+(a\text{-}2)+b \leq 1.0$, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved, wherein said organic solvent developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

19. The process of claim 18 wherein the subscript b is a number in the range: $0 < b < 1.0$.

20. The process of claim 18 wherein $R^2$ is an acid labile group, and the subscript a-1 is a number in the range of: $0 < a\text{-}1 < 1.0$.

\* \* \* \* \*